US010535641B2

(12) United States Patent
Daikoku et al.

(10) Patent No.: US 10,535,641 B2
(45) Date of Patent: Jan. 14, 2020

(54) LIGHT EMITTING DEVICE AND METHOD OF MANUFACTURING SAME

(71) Applicant: NICHIA CORPORATION, Anan-shi, Tokushima (JP)

(72) Inventors: Shinichi Daikoku, Tokushima (JP); Daisuke Sanga, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 16/024,605

(22) Filed: Jun. 29, 2018

(65) Prior Publication Data

US 2019/0006336 A1   Jan. 3, 2019

(30) Foreign Application Priority Data

Jun. 30, 2017  (JP) ................................. 2017-129965
May 31, 2018  (JP) ................................. 2018-105648

(51) Int. Cl.
*H01L 25/16* (2006.01)
*H01L 33/00* (2010.01)
(Continued)

(52) U.S. Cl.
CPC ........ *H01L 25/167* (2013.01); *H01L 33/0075* (2013.01); *H01L 33/0079* (2013.01); *H01L 33/20* (2013.01); *H01L 33/22* (2013.01); *H01L 33/382* (2013.01); *H01L 33/507* (2013.01); *H01L 33/54* (2013.01); *H01L 33/60* (2013.01); *H01L 33/62* (2013.01); *H01L 33/405* (2013.01); *H01L 2933/0016* (2013.01); *H01L 2933/0033* (2013.01); *H01L 2933/0041* (2013.01); *H01L 2933/0066* (2013.01)

(58) Field of Classification Search
CPC ...... H01L 33/0079; H01L 33/20; H01L 33/22
See application file for complete search history.

(56) References Cited

U.S. PATENT DOCUMENTS

2006/0231852 A1  10/2006 Kususe et al.
2010/0078656 A1   4/2010 Seo et al.
(Continued)

FOREIGN PATENT DOCUMENTS

DE  10 2015 111 721 A1  1/2017
EP   3 185 293 A1  6/2017
(Continued)

*Primary Examiner* — Amar Movva
(74) *Attorney, Agent, or Firm* — Foley & Lardner LLP

(57) ABSTRACT

A method of manufacturing a light emitting device includes: providing a semiconductor stack including a first semiconductor layer and a second semiconductor layer; forming light emitting cells by forming grooves in column and row directions; exposing a portion of the first semiconductor layer from the second semiconductor layer in each light emitting cell; forming a first insulation layer having a first hole on the light emitting cells and the grooves; forming a wiring electrode to be in electrical connection with the first semiconductor layer at the first hole in each light emitting cell; forming a second hole in the first insulation layer; forming a second electrode to be in electrical connection with the second semiconductor layer at the second hole; thinning the first semiconductor layer; and exposing the first insulation layer from the first semiconductor layer at the grooves while roughening the surface of the first semiconductor layer.

18 Claims, 32 Drawing Sheets

(51) Int. Cl.
*H01L 33/60* (2010.01)
*H01L 33/50* (2010.01)
*H01L 33/54* (2010.01)
*H01L 33/62* (2010.01)
*H01L 33/38* (2010.01)
*H01L 33/20* (2010.01)
*H01L 33/22* (2010.01)
*H01L 33/40* (2010.01)

(56) References Cited

U.S. PATENT DOCUMENTS

| | | |
|---|---|---|
| 2015/0034963 A1 | 2/2015 | Kinouchi et al. |
| 2015/0364643 A1 | 12/2015 | Sumitomo et al. |
| 2016/0190396 A1 | 6/2016 | Lee et al. |
| 2016/0343907 A1 | 11/2016 | Kawai et al. |
| 2017/0186915 A1 | 6/2017 | Emura et al. |
| 2018/0219127 A1 | 8/2018 | Hoeppel et al. |

FOREIGN PATENT DOCUMENTS

| | | |
|---|---|---|
| JP | 2007-227980 A | 9/2007 |
| JP | 2013-016875 A | 1/2013 |
| JP | 2015-028984 A | 2/2015 |
| JP | 2015-156431 A | 8/2015 |
| JP | 2016-015467 A | 1/2016 |
| JP | 2016-127289 A | 7/2016 |
| JP | 2016-219652 A | 12/2016 |
| WO | WO-2004/013916 A1 | 2/2004 |
| WO | WO-2009/119847 A1 | 10/2009 |

LIGHT EMITTING DEVICE AND METHOD OF MANUFACTURING SAME

CROSS-REFERENCE TO RELATED APPLICATION

This application claims priority to Japanese Patent Application No. 2018-105648, filed on May 31, 2018, which claims priority to Japanese Patent Application No. 2017-129965, filed on Jun. 30, 2017, the disclosures of which are hereby incorporated by reference in their entireties.

BACKGROUND

The present disclosure relates to a light emitting device and a method of manufacturing the light emitting device.

As a high emission efficiency semiconductor light emitting device, one constructed with a plurality of light emitting cells arranged vertically and horizontally in a grid on a plane has been known as disclosed in Japanese Unexamined Patent Application Publication No. 2015-156431. This semiconductor light emitting device has at least one first electrode partitioning the semiconductor structure layer into a plurality of light emitting segments, and at least one light reflecting groove formed on the surface of the first semiconductor layer between adjacent light emitting segments in the plurality of light emitting segments. The light reflecting groove includes a light reflecting film formed on the lateral faces thereof.

Furthermore, Japanese Unexamined Patent Application Publication No. 2013-016875 discloses a light emitting device having a construction in which a first electrode is disposed on the same side of the substrate as that having the first face at which a rough surface of the second conductivity type nitride semiconductor layer is formed.

SUMMARY

However, in these conventional semiconductor light emitting devices, the n-side electrode, which is the first electrode in electrical connection with the semiconductor structure layer, is disposed between the light emitting cells. Thus, in the conventional semiconductor light emitting devices, at least two light emitting cells are turned on, it is thus difficult to individually turn on the light emitting cells. Moreover, in the semiconductor light emitting devices, the semiconductor structure layer portion is laterally continuous, and the semiconductor structure layer is also located higher than the bottom faces of the light reflecting grooves defining the light emitting segments. Thus, the light propagates in the semiconductor structure layer, reducing distinguishability.

Accordingly, one object of certain embodiments of the present disclosure is to provide a light emitting device having good distinguishability when the light emitting cells are individually turned, and a method of manufacturing the same.

A method of manufacturing a light emitting device according to one embodiment of the present disclosure includes: providing a semiconductor stack including a first semiconductor layer, and a second semiconductor layer disposed on an upper face of the first semiconductor layer; forming a plurality of light emitting cells arranged in column and row directions by forming a plurality of grooves in the semiconductor stack from an upper face side of the semiconductor stack, the grooves reaching the first semiconductor layer; exposing a portion of the first semiconductor layer from the second semiconductor layer by partially removing the second semiconductor layer from an upper face side of the second semiconductor layer in each of the light emitting cells; forming a first insulation layer continuously on the light emitting cells and the grooves, the first insulation layer having a first hole on the first semiconductor layer exposed from the second semiconductor layer in each of the light emitting cells; forming a wiring electrode to be in electrical connection with the first semiconductor layer at the first hole in each of the light emitting cells so as to cover the first insulation layer on or above the upper face of the second semiconductor layer excluding a prescribed region; forming a second hole in the first insulation layer on or above the prescribed region of the upper face of the second semiconductor layer in each of the light emitting cells; forming a second electrode in each of the light emitting cells to be in electrical connection with the second semiconductor layer at the second hole; thinning the first semiconductor layer from a lower face side of the first semiconductor layer by dry etching or polishing so as not to reach the first insulation layer formed on the grooves; and subsequent to the step of thinning the first semiconductor layer by dry etching, removing a portion of the first semiconductor layer in a thickness direction from the lower face side of the first semiconductor layer by wet etching, thereby exposing the first insulation layer from the first semiconductor layer at locations of the grooves while roughening a surface of the first semiconductor layer that has been partially removed by the step of thinning the first semiconductor layer.

Furthermore, a method of manufacturing a light emitting device according to another embodiment of the present disclosure includes: providing a semiconductor stack including a first semiconductor layer and a second semiconductor layer disposed on an upper face of the first semiconductor layer; forming a plurality of light emitting cells arranged in column and row directions by forming a plurality grooves in the semiconductor stack from an upper face side of the semiconductor stack, the grooves reaching the first semiconductor layer; exposing a portion of the first semiconductor layer from the second semiconductor layer by partially removing the second semiconductor layer from an upper face side of the second semiconductor layer in each of the light emitting cells; forming a first insulation layer continuously on the light emitting cells and the grooves, the first insulation layer having a second hole above a prescribed region of the upper face of the second semiconductor layer in each of the light emitting cells; forming a wiring electrode to be in electrical connection with the second semiconductor layer at the second hole in each of the light emitting cells so as to cover the first insulation layer on or above the upper face of the second semiconductor layer excluding the prescribed region, the first hole being formed in the first semiconductor layer and the first insulation layer; forming a first hole in the first insulation layer on or above the first semiconductor layer exposed from the second semiconductor layer in each of the light emitting cells; forming a first electrode in each of the light emitting cells to be in electrical connection with the first semiconductor layer at the first hole; thinning the first semiconductor layer from a lower face side of the first semiconductor layer by dry etching or polishing so as not to reach the first insulation layer formed on the grooves; and subsequent to the step of thinning the first semiconductor layer, removing a portion of the first semiconductor layer in a thickness direction from the lower face side of the first semiconductor layer by wet etching, thereby exposing the first insulation layer from the first semiconductor layer at locations of the grooves while roughening a surface of the first semiconductor layer partially removed by step of thinning the first semiconductor layer.

A light emitting device according to one embodiment of the present disclosure includes: a plurality of light emitting cells arranged in column and row directions, each light emitting cell including a semiconductor stack that includes a first semiconductor layer and a second semiconductor layer, the second semiconductor layer being disposed on the upper face of the first semiconductor layer such that a portion of an upper face of the first semiconductor layer is exposed from the second semiconductor layer; a first insulation layer continuously disposed on the light emitting cells and having a first hole located on the first semiconductor layer exposed from the second semiconductor layer in each of the light emitting cells, and a second hole located on the second semiconductor layer in each of the light emitting cells; a wiring electrode having light reflectivity and disposed to cover the first insulation layer to be in electrical connection with the first semiconductor layer at the first hole in each of the light emitting cells; and a second electrode disposed in each of the light emitting cells to be in electrical connection with the second semiconductor layer at the second hole. The first insulation layer is exposed from the first semiconductor layer between the plurality of light emitting cells. The lower face of the first semiconductor layer has a roughened surface.

A light emitting device according to another embodiment of the present disclosure includes: a plurality of light emitting cells arranged in column and row directions, each light emitting cell including a semiconductor stack that includes a first semiconductor layer and a second semiconductor layer, the second semiconductor layer being disposed on the upper face of the first semiconductor layer such that a portion of an upper face of the first semiconductor layer is exposed from the second semiconductor layer; a first insulation layer continuously disposed on the light emitting cells and having a first hole located on the first semiconductor layer exposed from the second semiconductor layer in each of the light emitting cells, and a second hole located on the second semiconductor layer in each of the light emitting cells; a first electrode disposed in each of the light emitting cells to be in electrical connection with the first semiconductor layer at the first hole; and a wiring electrode having light reflectivity and disposed to cover the first insulation layer to be in electrical connection with the second semiconductor layer at the second hole in each of the light emitting cells. The first insulation layer is exposed from the first semiconductor layer between the light emitting cells. A lower face of the first semiconductor layer has a roughened surface.

According to the light emitting devices of certain embodiments of the present disclosure, distinguishability when the light emitting cells are individually turned on can be improved. Furthermore, according to the methods of manufacturing a light emitting device according to the embodiments of the present disclosure, light emitting devices having good distinguishability can be manufactured.

DETAILED DESCRIPTION

Figure 1:
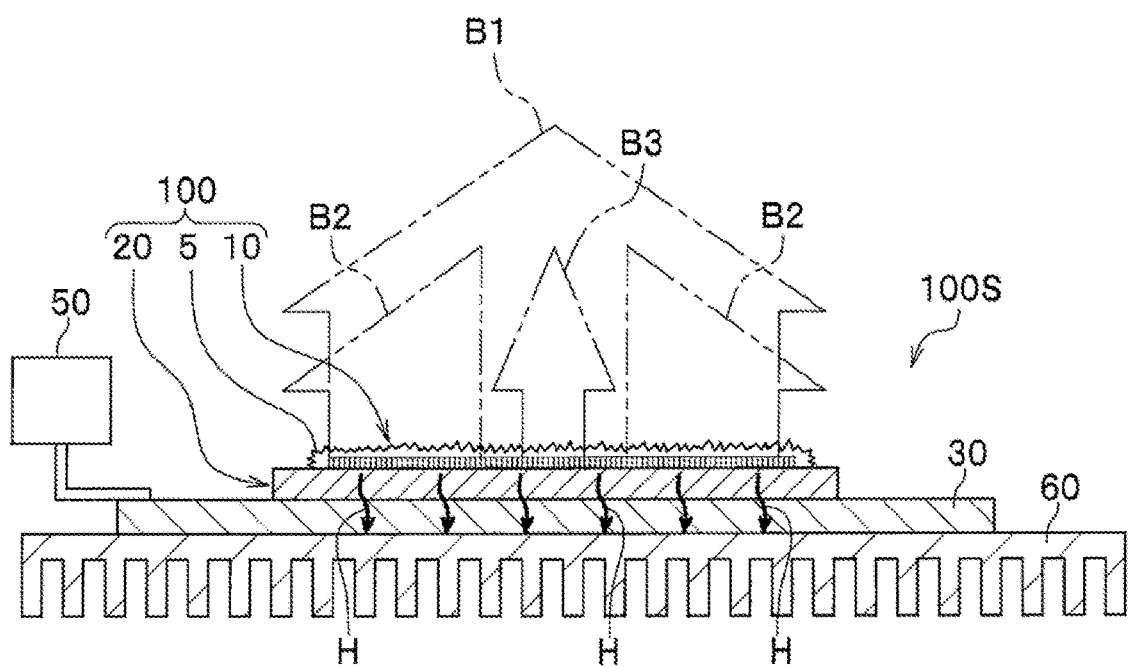
FIG. 1 is a schematic side view of one example of the light emitting device according to one embodiment.

The light emitting devices and the methods of manufacturing the light emitting device according to certain embodiments will be explained with reference to the accompanying drawings. The drawings referenced in the explanations below are schematic illustrations of the embodiments, and as such, the relative sizes and spacing and the positional relationships between members might be exaggerated, or members might be partially omitted. In the explanations below, the same designations and reference numerals denote the same members or those of similar type as a general rule, and repeated detailed explanations may be omitted when appropriate.

Light Emitting Device 100

The light emitting device 100 according to a first embodiment will be explained with reference to FIG. 1 to FIG. 3F.

The light emitting device 100 includes a light emitting cell group 10 which is a collective body of light emitting cells, and an IC substrate 20 on which the light emitting cell group 10 is disposed. Furthermore, the light emitting device system 100S includes a light emitting device 100, a secondary mounting substrate 30, a controller 50, and heat dissipater 60. The light emitting device 100 includes the light emitting cell group 10 and the IC substrate 20. The IC substrate 20 of the light emitting device 100 is mounted on a secondary mounting substrate 30. The secondary mounting substrate 30 is connected to a controller 50. A heat dissipater 60 is attached to the secondary mounting substrate.

First Embodiment

Method of Manufacturing Light Emitting Device 100

A method of manufacturing the light emitting device 100 according to the first embodiment will be explained with reference to FIG. 3A to FIG. 17.

The method of manufacturing the light emitting device 100 includes: step SA1 of providing a semiconductor stack; step SA2 of forming a light emitting cell group configured with a plurality of light emitting cells; step SA3 of exposing a portion of the first semiconductor layer from the second semiconductor layer; step SA4 of forming a first insulation layer; step SA5 of forming a wiring electrode; step SA6 of forming a second hole; step SA7 of forming a second electrode; step SA8 of thinning the semiconductor layer; and step SA9 of roughening the surface of the semiconductor layer. The first semiconductor layer 12n, the second semiconductor layer 12p, and the emission layer 12a are only shown in FIG. 5B and FIG. 5C, and are collectively shown as the semiconductor stack 12 in other drawings FIG. 6A to FIG. 17.

Figure 5A:
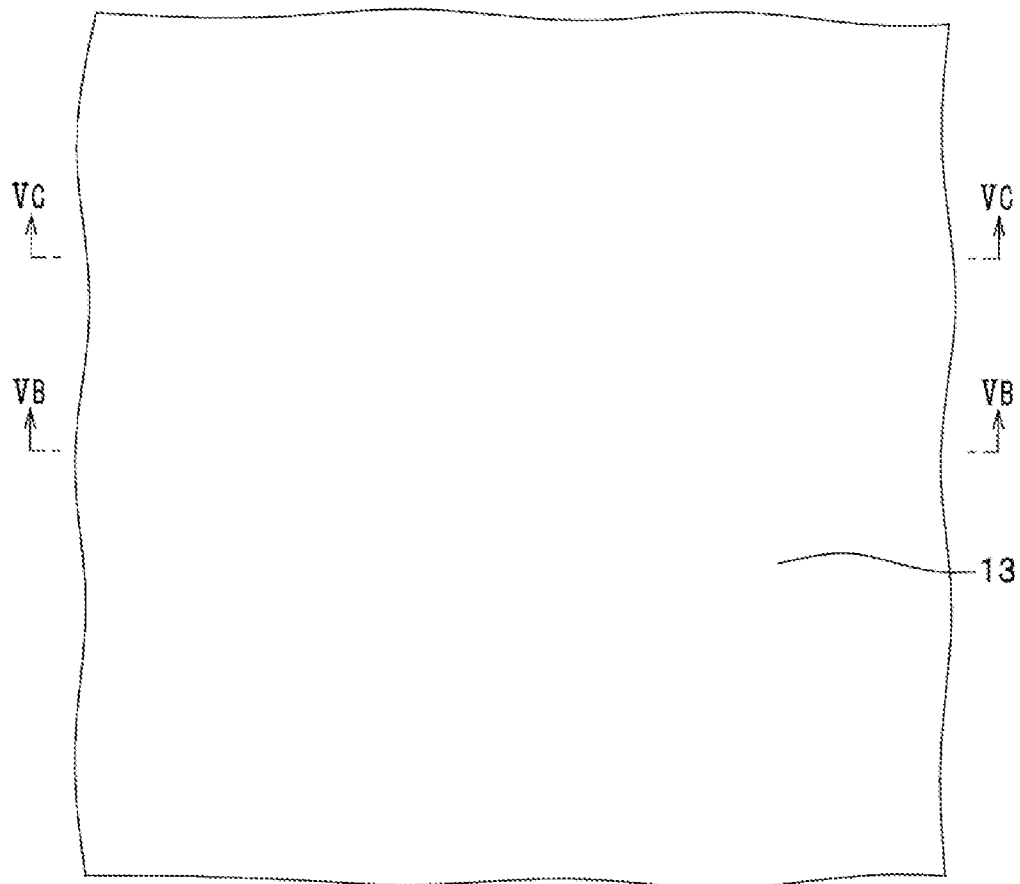
FIG. 5A is a schematic plan view, enlarged one of the light emitting cells after forming a full-surface electrode layer on the semiconductor stack in the method of manufacturing the light emitting device according to the first embodiment.
Figure 5B:
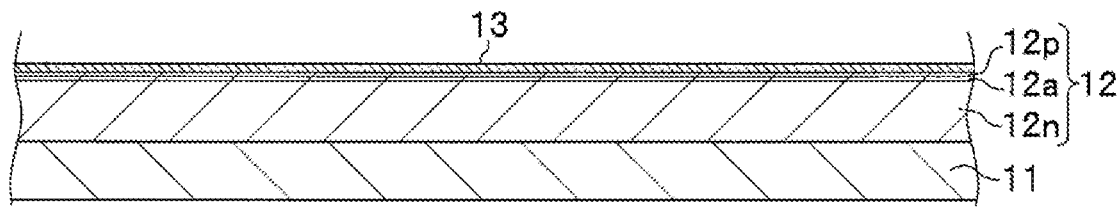
FIG. 5B is a sectional view taken along line VB-VB in FIG. 5A in the method of manufacturing the light emitting device according to the first embodiment.
Figure 5C:
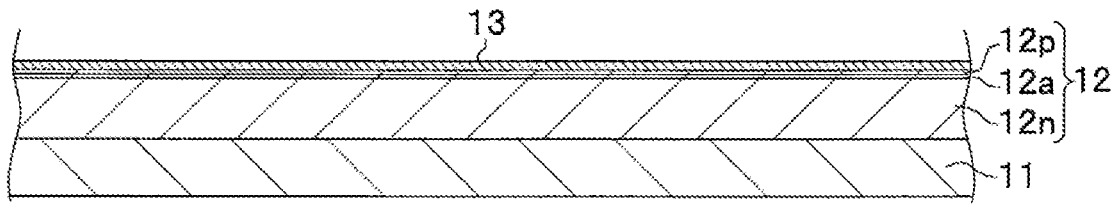
FIG. 5C is a sectional view taken along line VC-VC in FIG. 5A in the method of manufacturing the light emitting device according to the first embodiment.

The semiconductor stack providing step SA1 is a step of preparing a semiconductor stack 12 formed on a substrate 11, as shown in FIG. 5A to FIG. 5C. In this step, a semiconductor stack 12 is prepared, in which a first semiconductor layer 12n, an emission layer 12a, and a second semiconductor layer 12p, are successively formed from the substrate 11 side. The first semiconductor stack 12n is an n-type semiconductor layer, and the second semiconductor stack 12p is a p-type semiconductor layer. The semiconductor stack 12 is set to a size so that an external region 10Eb can be formed adjacent to the region 10Ea where light emitting cells 1 is to be formed.

Subsequently, a full-surface electrode forming step is performed to form a full-surface electrode layer 13, which is a p-side full-surface electrode, on the semiconductor stack 12. In the full-surface electrode forming step, the full-surface electrode layer 13 can be formed, for example, by sputtering or the like.

Figure 6A:
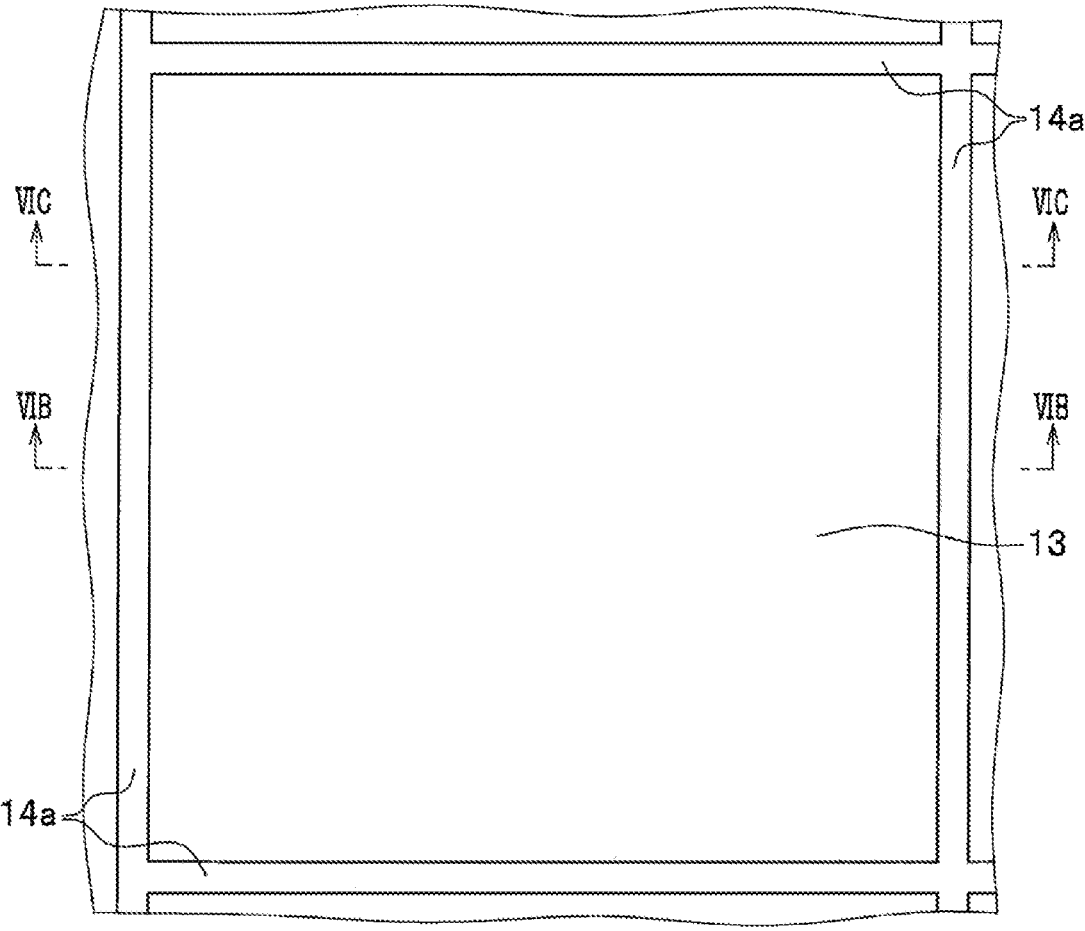
FIG. 6A is a schematic plan view, enlarging a portion of the semiconductor stack after forming grooves by partially etching the semiconductor stack in the method of manufacturing the light emitting device according to the first embodiment.
Figure 6B:
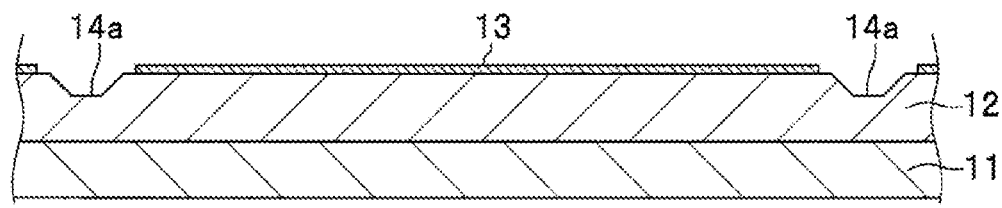
FIG. 6B is a sectional view taken along line VIB-VIB in FIG. 6A in the method of manufacturing the light emitting device according to the first embodiment.
Figure 6C:
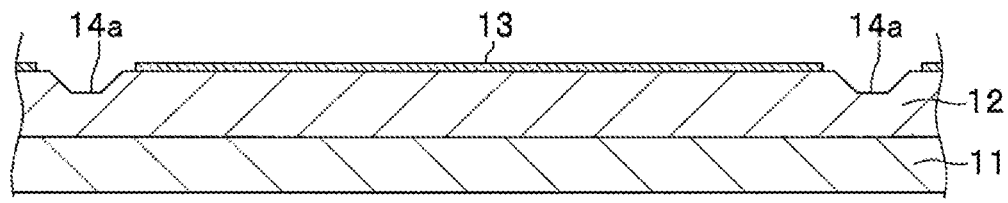
FIG. 6C is a sectional view taken along line VIC-VIC in FIG. 6A in the method of manufacturing the light emitting device according to the first embodiment.

Subsequently, a light emitting cell forming step SA2 is performed to form light emitting cells 1. The light emitting cell forming step, as shown in FIG. 6A to FIG. 6C, is a step of forming a plurality of grooves 14a in the semiconductor stack 12, the grooves 14a dividing the semiconductor stack 12 into a plurality of light emitting cells to thereby form a light emitting cell group 10. In the light emitting cell forming step, a plurality of light emitting cells 1 are provided in columns and rows by forming a plurality of grooves 14a reaching the first semiconductor layer 12n in a grid-shape from the side of the full-surface electrode layer 13 formed on the upper face of the semiconductor stack 12. The grooves 14a are formed by partially removing the semiconductor stack 12 by etching or the like. Here, the grooves 14a are formed in a grid-shape to the depth to reach the first semiconductor layer 12n via a mask so as to form the light emitting cells 1 having a rectangular shape when viewed from the top. For example, 15 to 40 columns times 15 to 40 rows of light emitting cells 1 are defined and formed by the grooves 14a. The depth of the grooves 14a can be set to be in a range of, for example, from 2.0 to 5.0 µm.

In the light emitting cell forming step, furthermore, the grooves 14a can be formed in such a manner as to define an external region 10Eb adjacent to the plurality of light emitting cells 1 arranged in columns and rows, the external region 10Eb extending at least in the row direction or column direction of the light emitting cells. Here, the groove 14a located at one end in the column direction defines the external region 10Eb adjacent to the region 10Ea of the semiconductor stack 12 in which the light emitting cell group 10 is formed. Moreover, the external region 10Eb is continuously formed with a prescribed width to the size required for forming a first electrode 2 for connection with the external electrode.

Here, one external region 10Eb is formed to extend in the column direction of the light emitting cell group 10, but two external regions 10Eb may be formed in the column direction, or the external regions 10Eb may be formed to surround the light emitting cell group by forming them in not only the column direction, but also in the row direction. Furthermore, an external region 10Eb having an annular shape may be formed so as to surround the light emitting cell group 10. Forming a plurality of external regions 10Eb and connecting an external power source to individual external regions 10Eb can reduce variance in the electric current being supplied to the plurality of light emitting cells 1. This can reduce variance in current density distribution across the light emitting cell group 10 as a whole, thereby reducing light emission variance. A first electrode 2 is formed in the external region 10Eb to be in electrical connection with the wiring electrode 17 that is disposed to extend thereto.

Figure 7A:
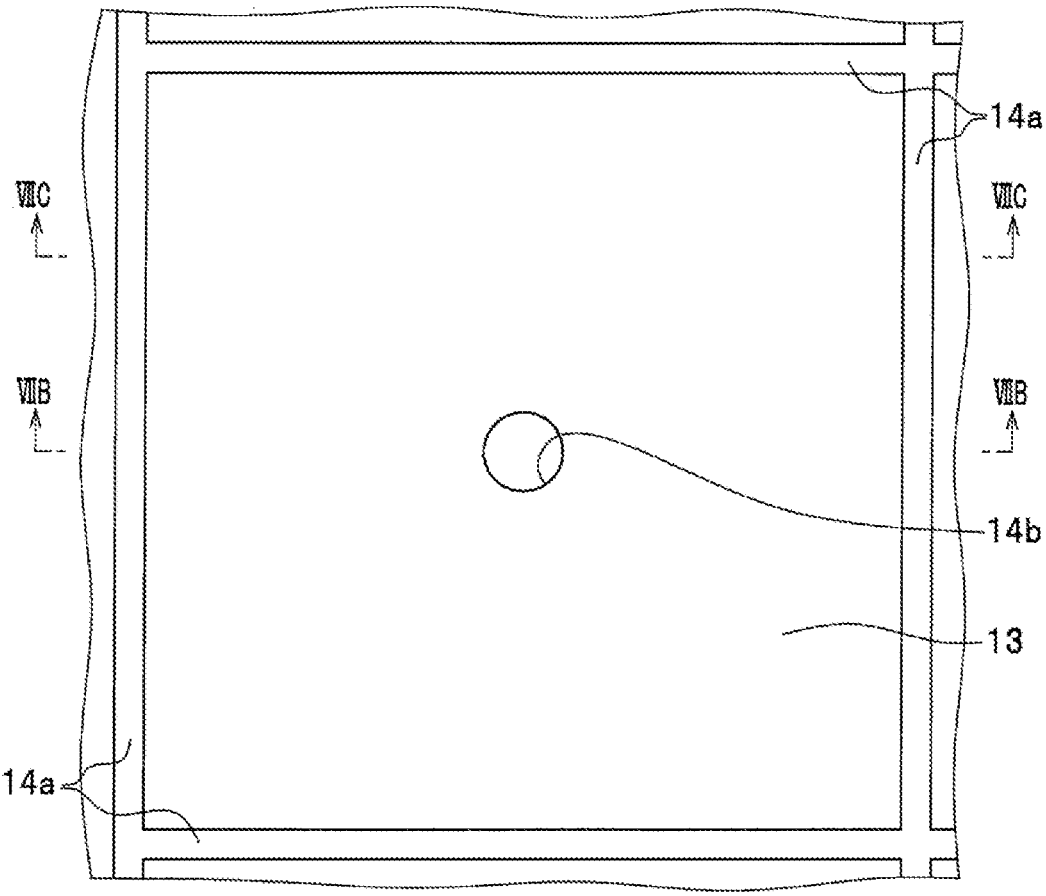
FIG. 7A is a schematic plan view, enlarged one of the light emitting cells after forming an opening which exposes the first semiconductor layer from the second semiconductor layer by partially removing the full-surface electrode and the first semiconductor layer in the method of manufacturing the light emitting device according to the first embodiment.
Figure 7B:
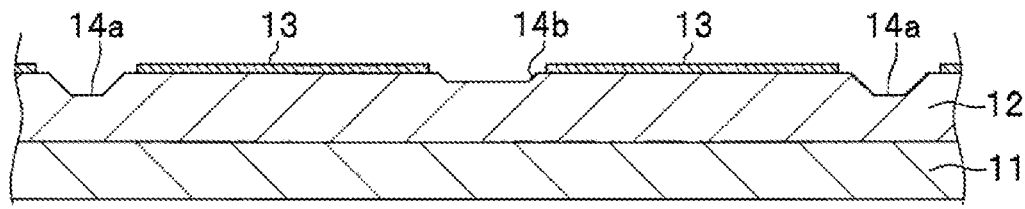
FIG. 7B is a sectional view taken along line VIIB-VIIB in FIG. 7A in the method of manufacturing the light emitting device according to the first embodiment.
Figure 7C:
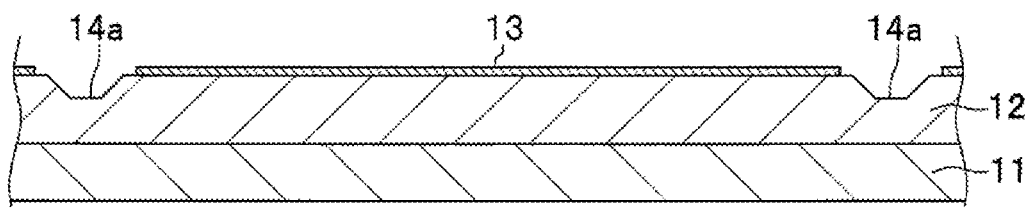
FIG. 7C is a sectional view taken along line VIIC-VIIC in FIG. 7A in the method of manufacturing the light emitting device according to the first embodiment.
Figure 8A:
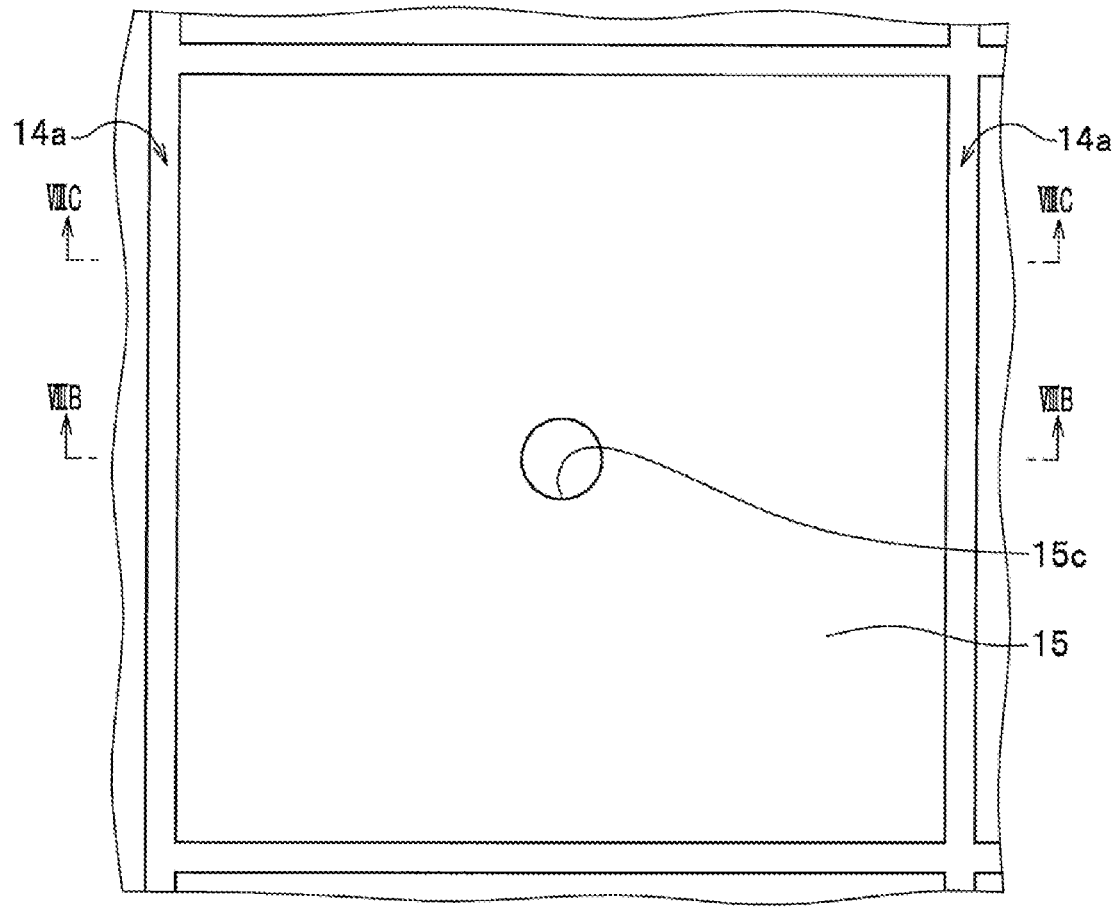
FIG. 8A is a schematic plan view, enlarged one of the light emitting cells after forming a first insulation layer continuously on the light emitting cell group and the grooves in the method of manufacturing the light emitting device according to the first embodiment.
Figure 8B:
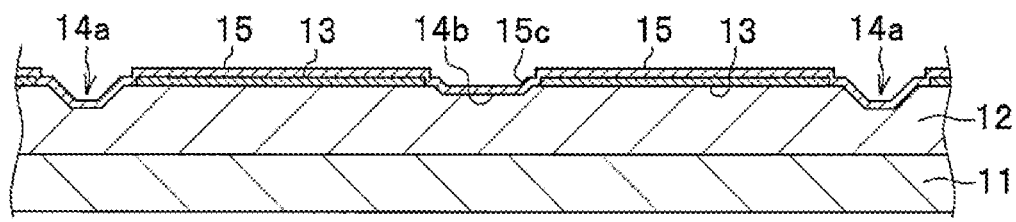
FIG. 8B is a sectional view taken along line VIIIB-VIIIB in FIG. 8A in the method of manufacturing the light emitting device according to the first embodiment.
Figure 8C:
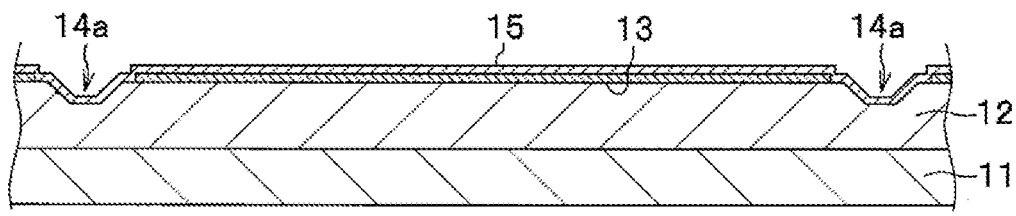
FIG. 8C is a sectional view taken along line VIIIC-VIIIC in FIG. 8A in the method of manufacturing the light emitting device according to the first embodiment.

Step SA3 of exposing the first semiconductor layer 12n is a step of exposing a portion of the first semiconductor layer 12n from the second semiconductor layer 12p, as shown in FIG. 7A to FIG. 7C, by removing the second semiconductor layer 12p and the full-surface electrode layer 13. In this exposing step, etching or the like is performed by placing a mask over the area excluding the portion to be exposed, thereby exposing the portion of the first semiconductor layer 12n from the full-surface electrode layer 13 and the second semiconductor layer 12p, and creating a substantially circular exposed region 14b when viewed from the top.

Figure 9A:
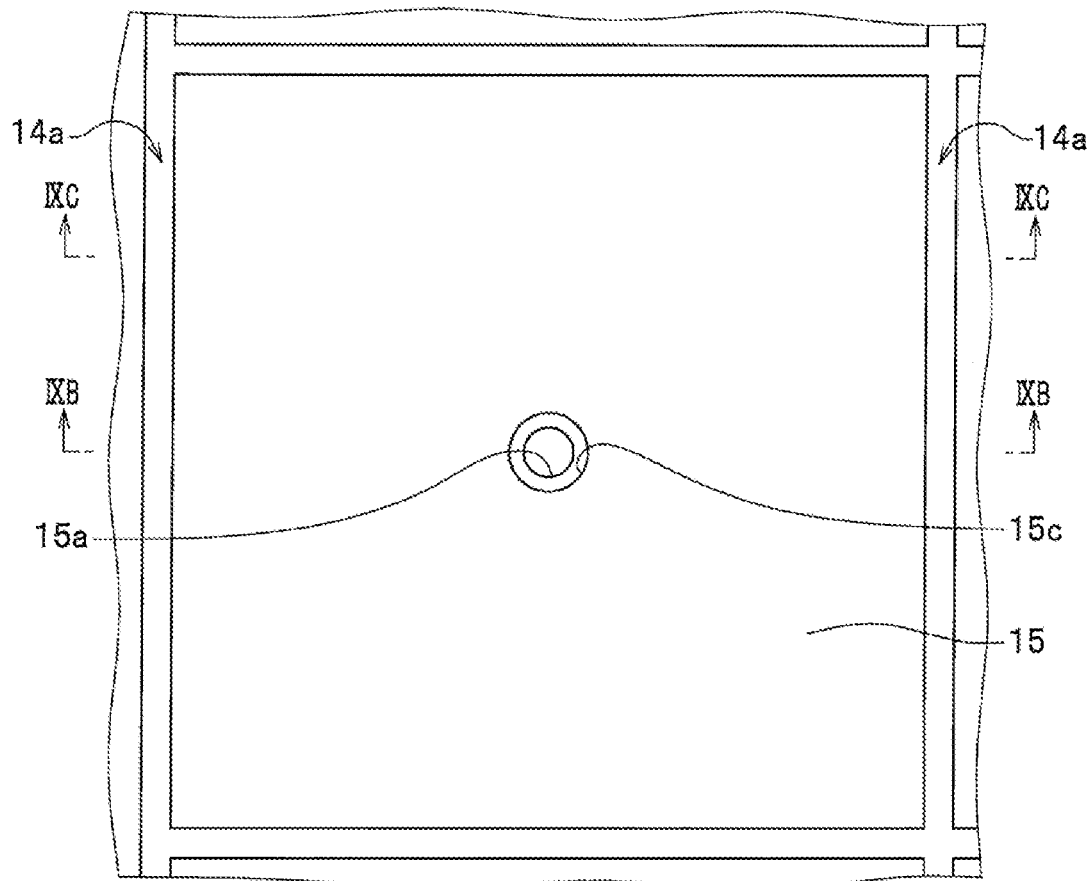
FIG. 9A is a schematic plan view, enlarged one of the light emitting cells after forming a first hole in the first semiconductor layer in the method of manufacturing the light emitting device according to the first embodiment.
Figure 9B:
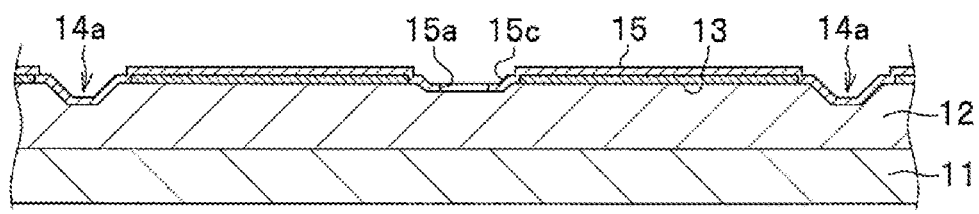
FIG. 9B is a sectional view taken along line IXB-IXB in FIG. 9A in the method of manufacturing the light emitting device according to the first embodiment.
Figure 9C:
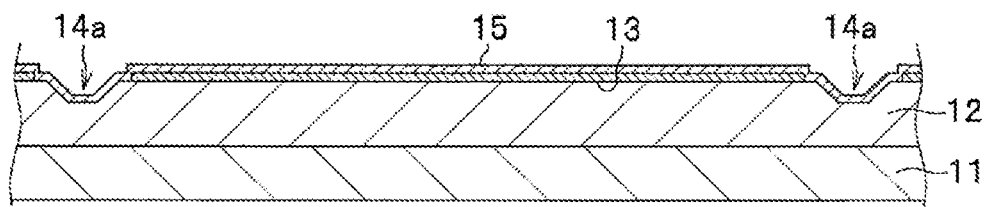
FIG. 9C is a sectional view taken along line IXC-IXC in FIG. 9A in the method of manufacturing the light emitting device according to the first embodiment.

As shown in FIG. 9A to FIG. 9C, step SA4 is a step of forming a first insulation layer 15 in which a first hole 15a will be formed. In this first insulation layer forming step, the first insulation layer 15 is formed to cover the full-surface electrode layer 13, the grooves 14a, and the exposed region 14b. The first insulation layer 15 is a dielectric multilayer film in which, for example, layers comprising silicon oxide and layers comprising niobium oxide are alternately stacked serving as a reflective layer that reflects the light from the semiconductor stack 12. By way of example, the first insulation layer 15 is formed to have a thickness in a range of from 600 nm to 1.5 µm by sputtering.

After forming the first insulation layer 15, a first hole forming step is performed to form a first hole 15a. In the first hole forming step, a first hole 15a is formed in the region of the first insulation layer 15 that covers the exposed region 14b. The first hole 15a is formed to electrically connect the wiring electrode 17, described below, to the first semiconductor layer 12n. The first hole 15a is formed by removing the first insulation layer 15 in the region corresponding to the exposed region 14b in whole or part by etching or the like. The first semiconductor layer 12n is exposed from the first insulation layer 15 in the region where the first hole 15a is created.

Figure 10A:
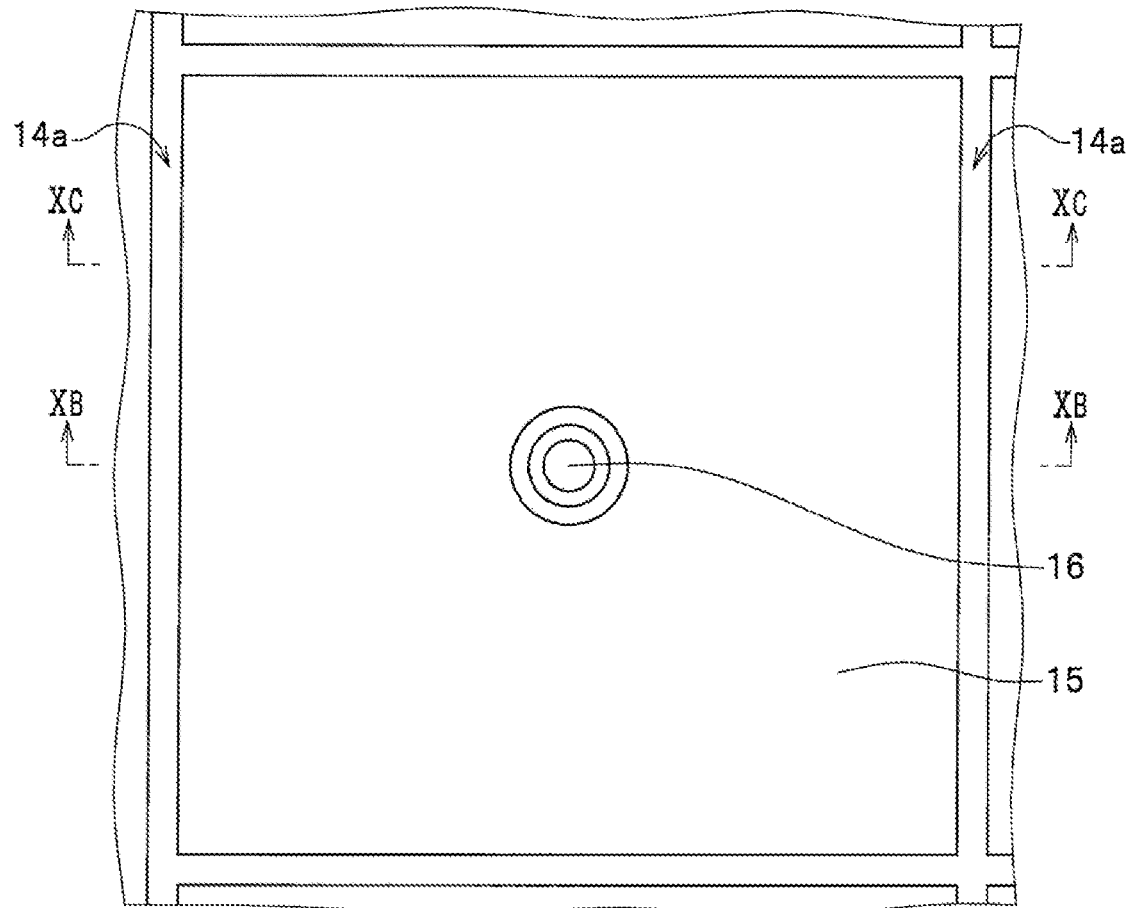
FIG. 10A is a schematic plan view, enlarged one of the light emitting cells where a connection electrode is formed in the first hole to be in electrical connection with the first semiconductor layer in the method of manufacturing the light emitting device according to the first embodiment.
Figure 10B:
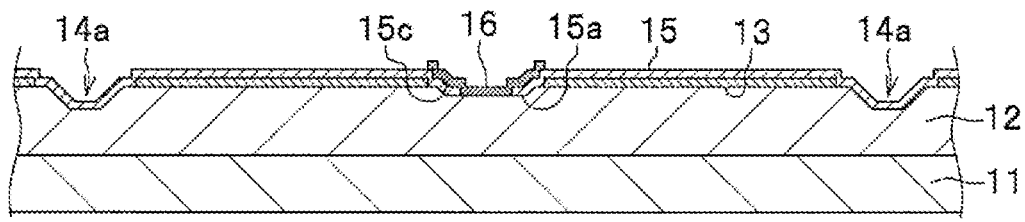
FIG. 10B is a sectional view taken along line XB-XB in FIG. 10A in the method of manufacturing the light emitting device according to the first embodiment.
Figure 10C:
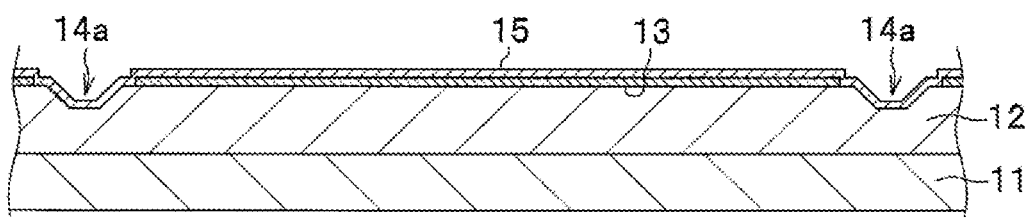
FIG. 10C is a sectional view taken along line XC-XC in FIG. 10A in the method of manufacturing the light emitting device according to the first embodiment.

Before performing the subsequent step, as shown in FIG. 10A to FIG. 10C, a connection electrode forming step SA4a is performed to dispose a connection electrode 16 in the first hole 15a to be in contact and electrical connection with the first semiconductor layer 12n. The connection electrode forming step is a step of forming a connection electrode 16 in the first hole 15a and on the upper face of the first insulation layer 15 immediately surrounding the hole by masking the area surrounding the first hole 15a followed by sputtering or the like. For the connection electrode 16, for example, titanium, aluminum, or an alloy containing either of these metals as a primary component can be used. The connection electrode 16 may be a stack of layers of these metals and metal alloys mentioned above. Forming the connection electrode 16 reduces electrical resistance between the connection electrode 16 and the first semiconductor layer 12n, thereby attenuating an increase of forward voltage Vf of the light emitting cell 1 as compared to the case where the first semiconductor layer 12n and the wiring electrode 17 are directly connected.

Figure 11A:
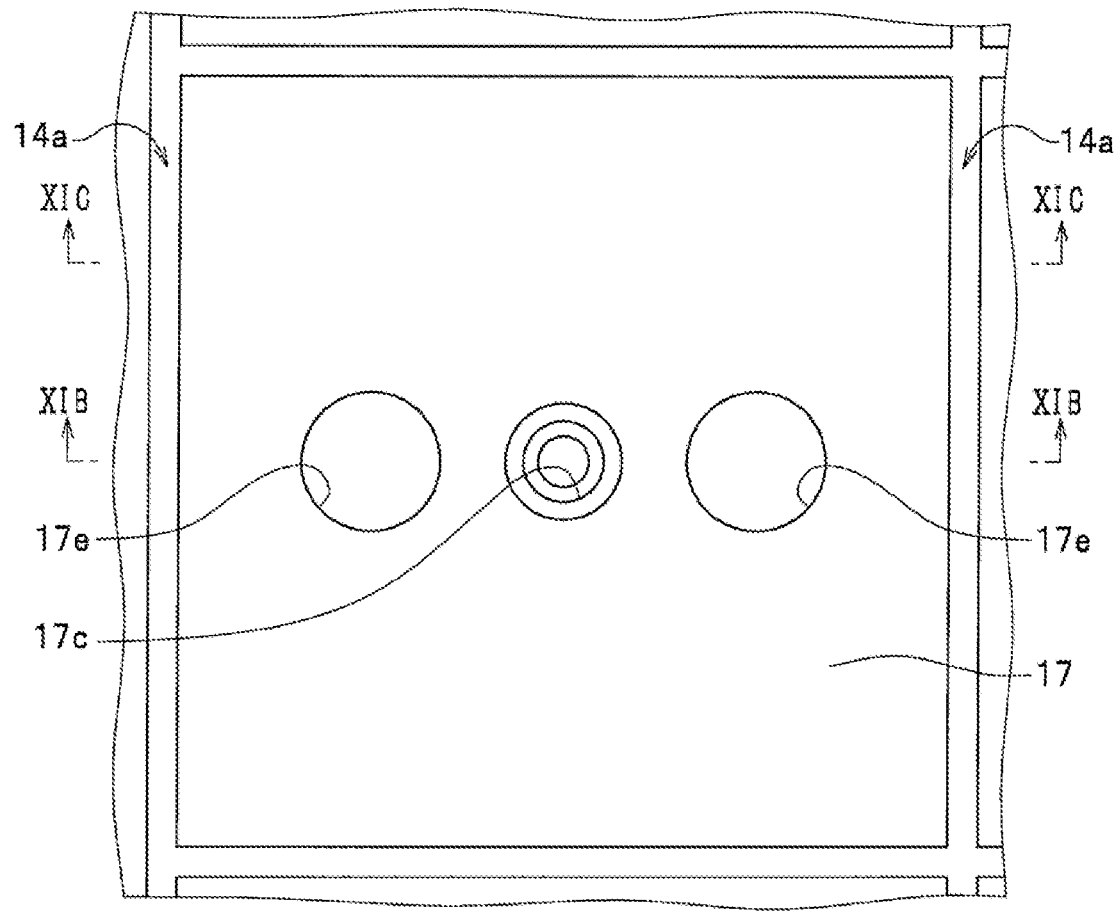
FIG. 11A is a schematic plan view, enlarged one of the light emitting cells after forming a wiring electrode on the first insulation layer in the method of manufacturing the light emitting device according to the first embodiment.
Figure 11B:
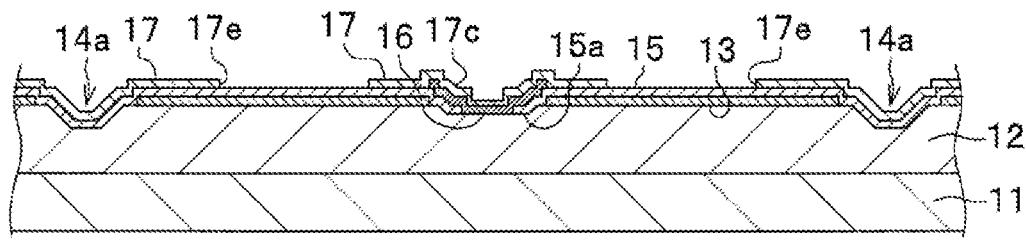
FIG. 11B is a sectional view taken along line XIB-XIB in FIG. 11A in the method of manufacturing the light emitting device according to the first embodiment.
Figure 11C:
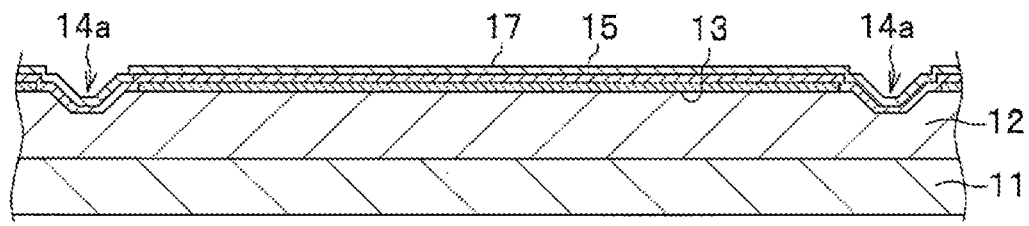
FIG. 11C is a sectional view taken along line XIC-XIC in FIG. 11A in the method of manufacturing the light emitting device according to the first embodiment.

Step SA5, as shown in FIG. 11A to FIG. 11C, is a wiring electrode forming step that forms a wiring electrode 17 to be in electrical connection with the first semiconductor layer 12n via the first hole 15a. In the wiring electrode forming step, the wiring electrode 17 is formed to cover the connection electrode 16, which is in electrical connection with the first semiconductor layer 12n at the first hole 15a, and a prescribed region on the first insulation layer 15. The wiring electrode 17 is formed over the area that excludes prescribed regions 17e where second holes 15b (and third holes 18a described below) for electrical connection with the second electrode 19 will be formed. That is, the wiring electrode 17 is formed by forming a mask that covers the prescribed regions 17e followed by sputtering or the like. The prescribed regions 17e, as shown in FIG. 11A, are formed into substantially circular holes using a mask. The wiring electrode 17 is formed using, for example, an alloy mainly containing aluminum. The wiring electrode 17 may be a stack of aluminum alloy layers and other metal layers, or may be formed by stacking layers each comprising a single metal such as titanium, and metal alloy layers. Furthermore, two prescribed regions 17e are provided per light emitting cell 1 here, but the number is not limited to that.

Subsequently, a second insulation layer forming step SA5a is performed to form a second insulation layer 18 in which a third hole 18a will be formed.

Figure 12A:
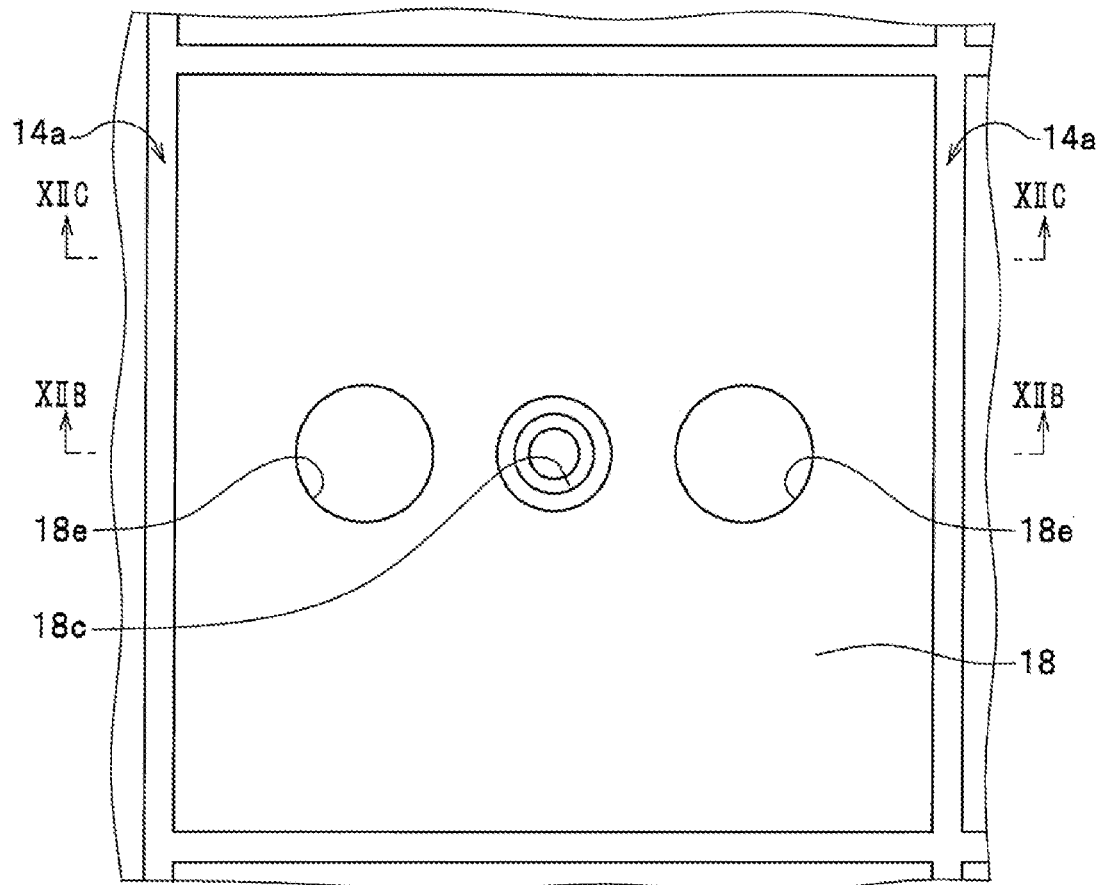
FIG. 12A is a schematic plan view, enlarged one of the light emitting cells after forming a second insulation layer on the wiring electrode in the method of manufacturing the light emitting device according to the first embodiment.
Figure 12B:
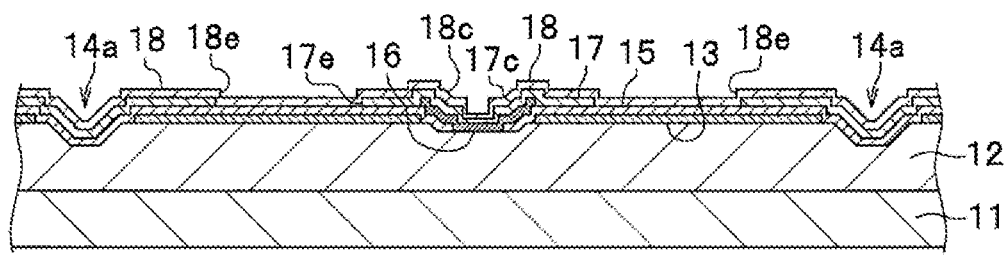
FIG. 12B is a sectional view taken along line XIIB-XIIB in FIG. 12A in the method of manufacturing the light emitting device according to the first embodiment.
Figure 12C:
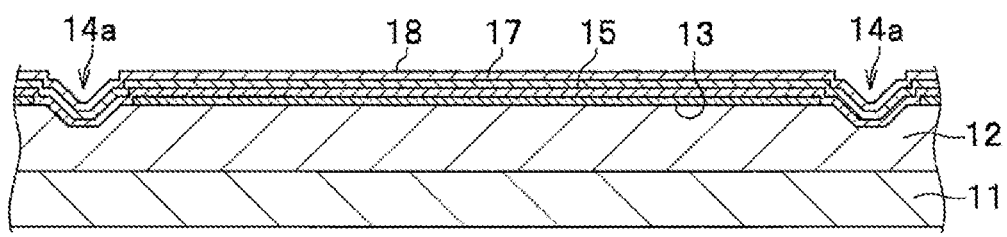
FIG. 12C is a sectional view taken along line XIIC-XIIC in FIG. 12A in the method of manufacturing the light emitting device according to the first embodiment.

As shown in FIG. 12A to FIG. 12C, the second insulation layer forming step is a step of forming a second insulation layer 18 on the wiring electrode 17 and on the first insulation layer 15 exposed from the wiring electrode 17 in the prescribed regions 17e. The second insulation layer 18 is formed, for example, by sputtering or the like. Moreover, for the second insulation layer 18, an insulation layer comprising SiO$_2$, for example, is disposed to a film thickness in a range of from 300 nm to 700 nm.

Figure 13A:
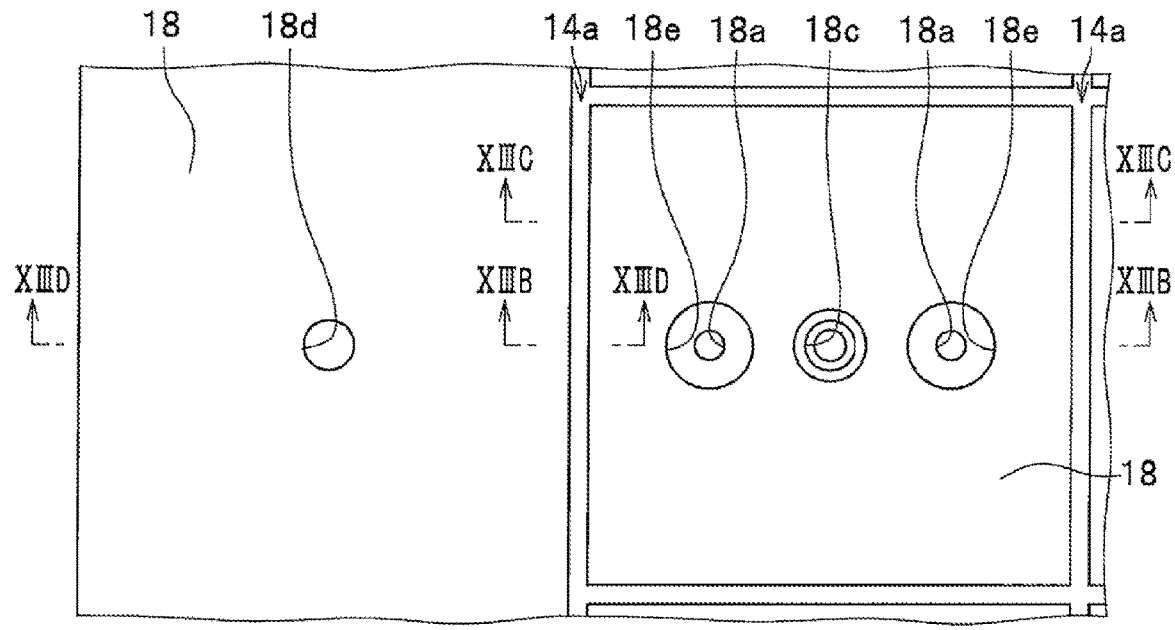
FIG. 13A is a schematic plan view, enlarged one of the light emitting cells after forming a third hole in the second insulation layer and second holes in the first insulation layer in the method of manufacturing the light emitting device according to the first embodiment.
Figure 13B:
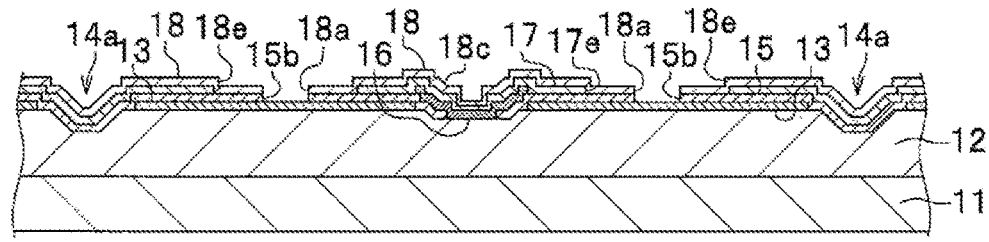
FIG. 13B is a sectional view taken along line XIIIB-XIIIB in FIG. 13A in the method of manufacturing the light emitting device according to the first embodiment.
Figure 13C:
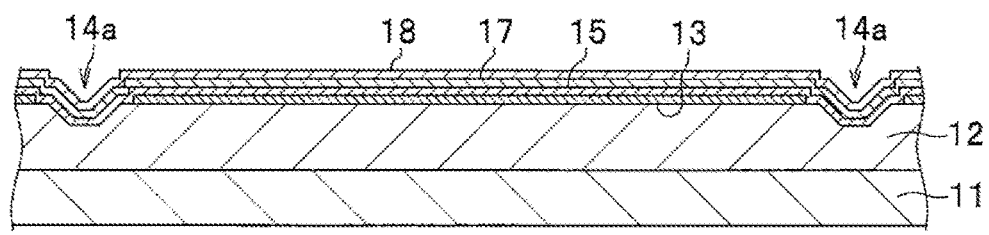
FIG. 13C is a sectional view taken along line XIIIC-XIIIC in FIG. 13A in the method of manufacturing the light emitting device according to the first embodiment.
Figure 13D:
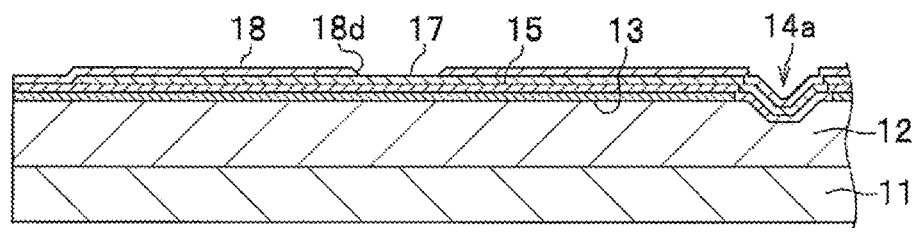
FIG. 13D is a sectional view taken along line XIIID-XIIID in FIG. 13A in the method of manufacturing the light emitting device according to the first embodiment.

Subsequently, a hole forming step SA6 is performed to form a third hole 18a in the second insulation layer 18 and second holes 15b in the first insulation layer 15. As shown in FIG. 13A to FIG. 13C, the hole forming step SA6 is a step of forming second holes 15b and third holes 18a in the second insulation layer 18 at the positions of the prescribed regions 17e of the second insulation layer 18. The hole forming step SA6 includes a step that constitutes step 6A. That is, in the hole forming step SA6, a second hole forming step is performed to form second holes in the first insulation layer 15 over the prescribed regions of the upper face of the second semiconductor layer 12p (i.e., the prescribed regions 17e) in each light emitting cell 1.

As shown in FIG. 13A and FIG. 13B, the hole forming step SA6 is a step of forming second holes 15b and third holes 18a in the first insulation layer 15 and the second insulation layer 18 in the regions 18e overlapping the prescribed regions 17e when viewed from the top for connecting the wiring electrode 17 to the full-surface electrode layer 13 for electrical connection with the second semiconductor layer 12p. The second holes 15b and the third holes 18a are created by forming a mask having openings in portions of the regions 18e over the second insulation layer 18, and etching the first insulation layer 15 and the second insulation layer 18 via the mask. The sizes and the shapes of the second holes 15b formed in the first insulation layer 15 and the third holes 18a formed in the second insulation layer 18 are not particularly limited, as long as they are formed in the regions 18e of the second insulation layer 18. The second holes 15b and the third holes 18a are formed in communication, whereby the full-surface electrode layer 13 is partially exposed from the second insulation layer 18 and the first insulation layer 15.

Figure 14A:
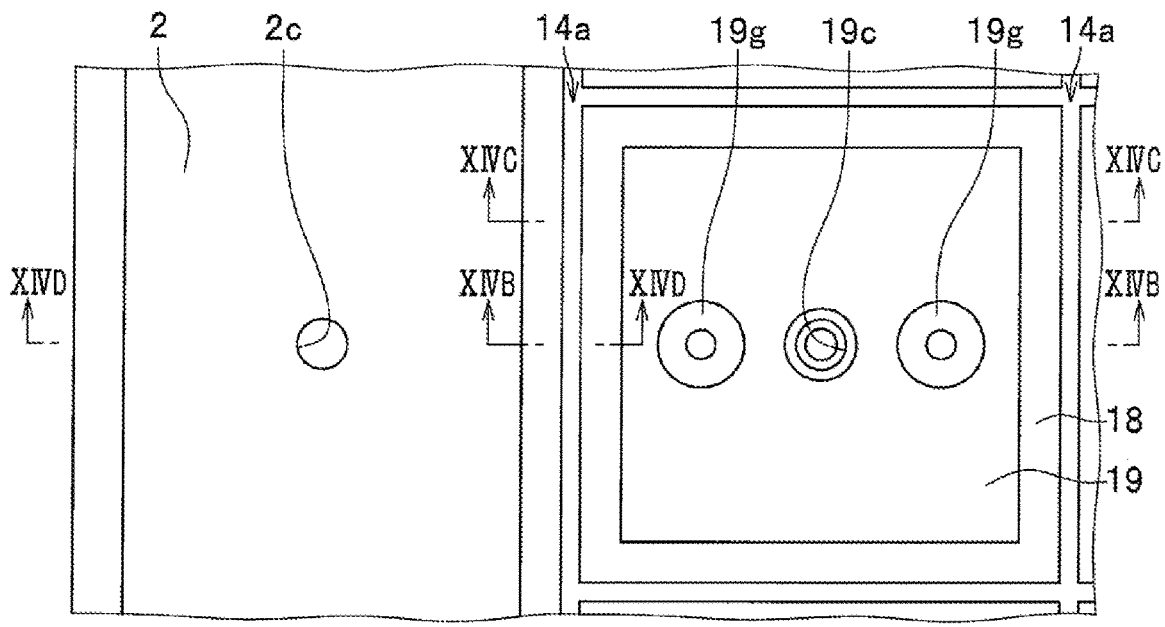
FIG. 14A is a schematic plan view, enlarged one of the light emitting cells after forming a second electrode on the second insulation layer in the method of manufacturing the light emitting device according to the first embodiment.
Figure 14B:
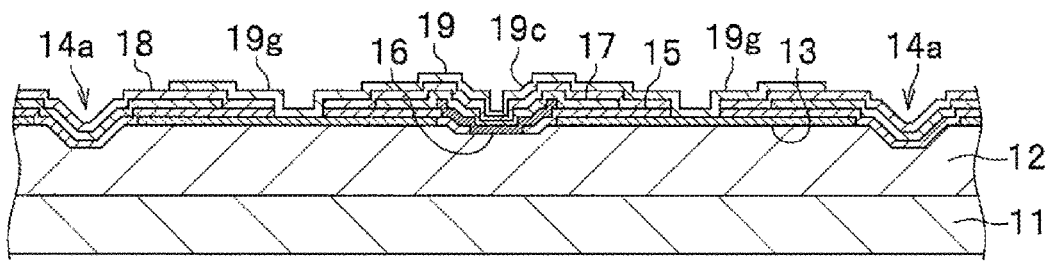
FIG. 14B is a sectional view taken along line XIVB-XIVB in FIG. 14A in the method of manufacturing the light emitting device according to the first embodiment.
Figure 14C:
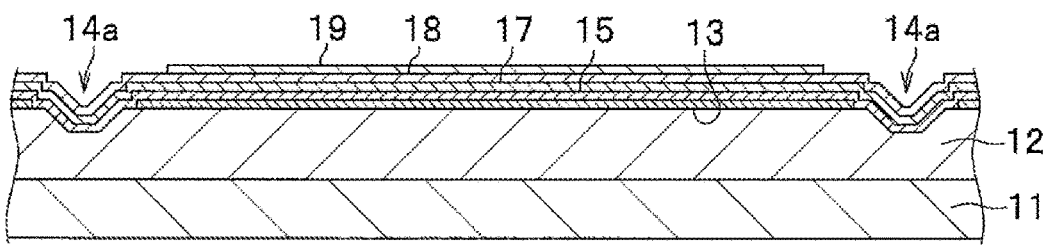
FIG. 14C is a sectional view taken along line XIVC-XIVC in FIG. 14A in the method of manufacturing the light emitting device according to the first embodiment.
Figure 14D:
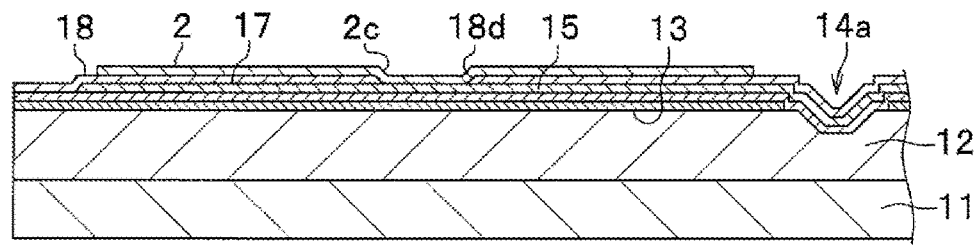
FIG. 14D is a sectional view taken along line XIVD-XIVD in FIG. 14A in the method of manufacturing the light emitting device according to the first embodiment.
Figure 15A:
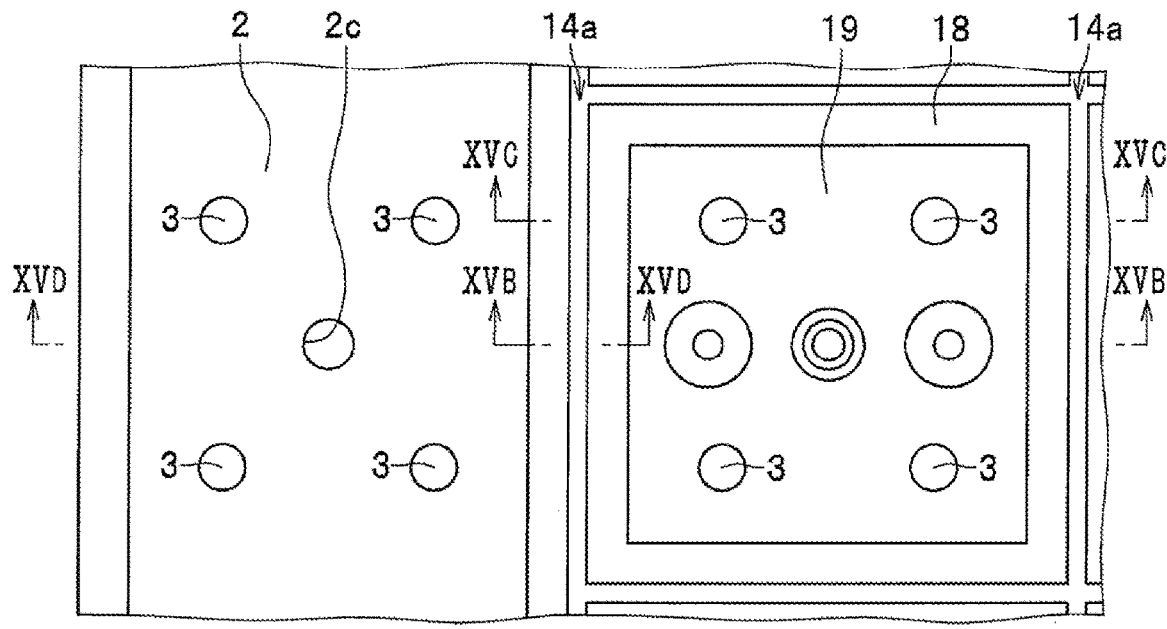
FIG. 15A is a schematic plan view, enlarged one of the light emitting cells after forming bumps on the first electrode and the second electrode in the method of manufacturing the light emitting device according to the first embodiment.
Figure 15B:
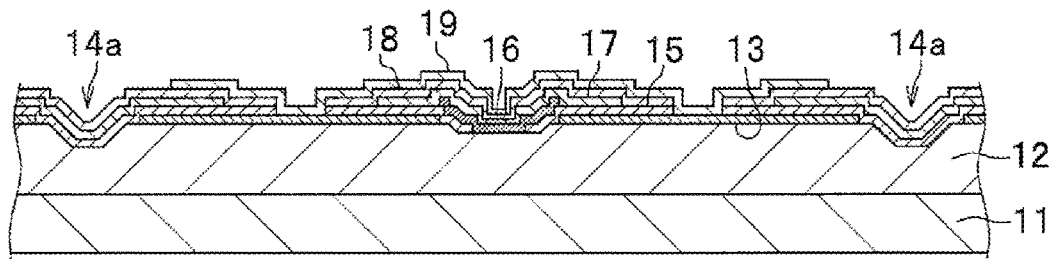
FIG. 15B is a sectional view taken along line XVB-XVB in FIG. 15A in the method of manufacturing the light emitting device according to the first embodiment.
Figure 15C:
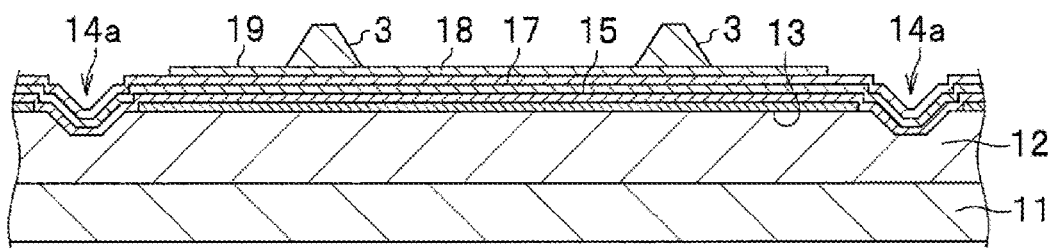
FIG. 15C is a sectional view taken along line XVC-XVC in FIG. 15A in the method of manufacturing the light emitting device according to the first embodiment.
Figure 15D:
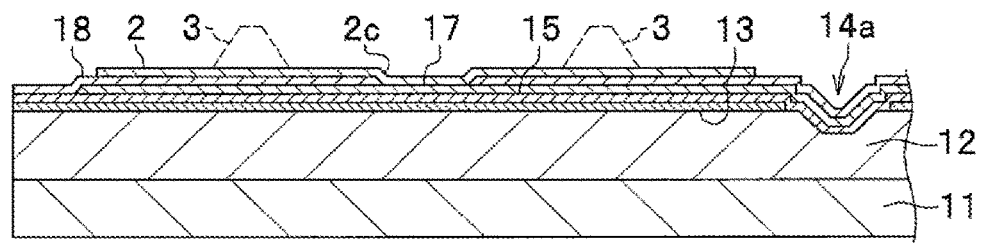
FIG. 15D is a sectional view taken along line XVD-XVD in FIG. 15A in the method of manufacturing the light emitting device according to the first embodiment.

Step SA7, as shown in FIG. 14A to FIG. 14C, is a second electrode forming step in which a second electrode 19 is formed to be in electrical connection with the second semiconductor layer 12p via the full-surface electrode 13 in the regions where the second holes 15b and the third holes 18a have been created. The second electrode forming step forms the second electrode 19, and includes a bump forming step that forms bumps 3. In the second electrode forming step, the second electrode 19 is formed in the regions where the second holes 15b and the third holes 18a which are in communication with the second holes 15b are disposed to allow the second semiconductor layer 12p to be in electrical connection with the second electrode 19 via the full-surface electrode layer 13. The second electrode 19 is a single metal or alloy layer, or multilayer thereof, and is formed by sputtering or the like using a mask. The second electrode 19 has a central portion 19c formed in a recessed shape where the connection electrode 16 is disposed, and the connection portions 19g connected to the full-surface electrode 13 each formed in a recessed shape in a section. The second electrode 19 in each light emitting cell 1 is formed in a rectangular shape in the region surrounded by the grooves 14a, spacing apart from the grooves 14a. The second electrode 19 can be formed to have an areal ratio in a range of, for example, from 50 to 95% with respect to the area surrounded by the grooves 14a when viewed from the top. The thickness of the second electrode 19 is preferably in a range of from 300 nm to 700 nm. When forming the second electrode 19, as shown in FIG. 14D, a first electrode 2 can be formed in the external region 10Eb spaced apart from the second electrode 19, and be in electrical connection with the wiring electrode 17.

After forming the second electrode 19 and the first electrode 2, a bump forming step is performed to form bumps 3 at prescribed positions of the second electrode 19 and the first electrode 2 in order to connect with the IC substrate 20 described below. In the bump forming step, as shown in FIG. 15A to FIG. 15D, four bumps 3 are formed in a region defined by the grooves 14a of the light emitting cell 1. Moreover, four bumps 3 are formed in the location where the first electrode 2 is formed to surround the central portion 2C. The number, diameter, and the height of the bumps are not particularly limited. The diameter of the bumps can be set, for example, to about 3.0 to 10 µm.

Figure 3A:
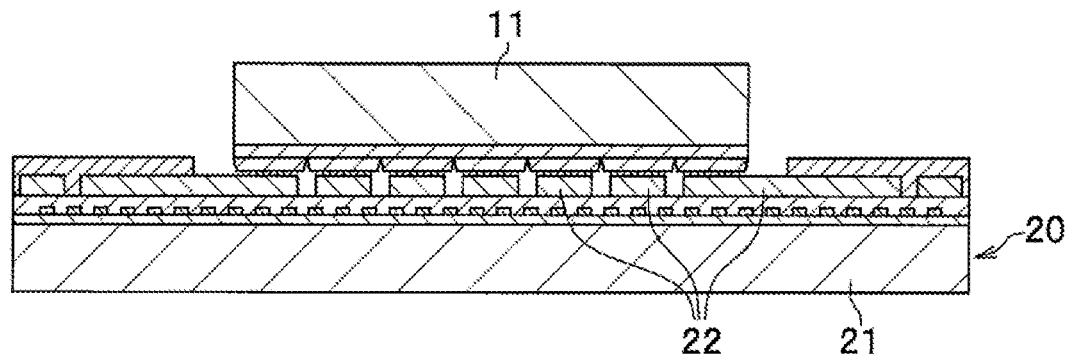
FIG. 3A is a sectional view of the method of manufacturing the light emitting device according to the embodiment, schematically showing the light emitting cell group which is provided with bumps and mounted on an IC substrate electrode with a resist formed thereon.
Figure 3B:
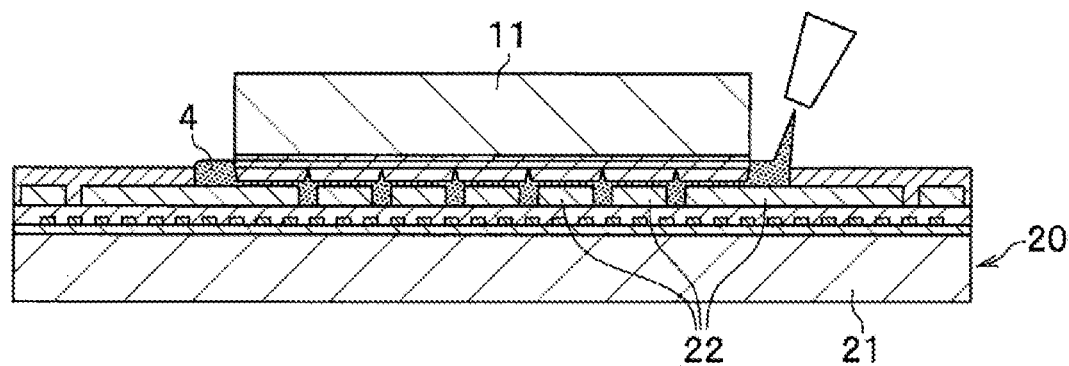
FIG. 3B is a view of the method of manufacturing the light emitting device according to the embodiment, which is a schematic sectional view of the formation of a filler on the mounted light emitting cell group.
Figure 3C:
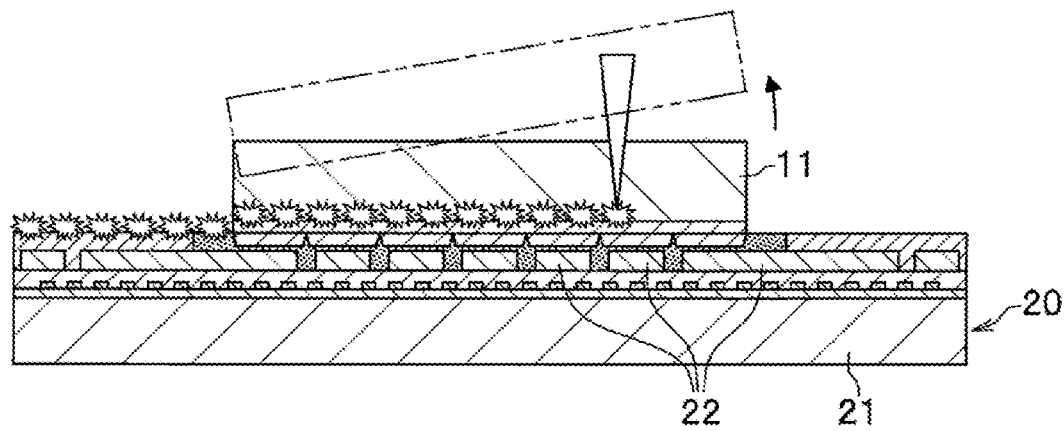
FIG. 3C is a view of the method of manufacturing the light emitting device according to the embodiment, which is a schematic section after the substrate being removed from the light emitting cell group.

Following the bump forming step, as shown in FIG. 3A, a light emitting cell group mounting step SA7a is performed so that the substrate 11 including the light emitting cell group 10 are flip-chip mounted on the IC substrate electrode 22 of the IC substrate 20 via the bumps 3. Subsequently, as shown in FIG. 3B, after mounting the light emitting cell group 10 via the bumps 3, a filler 4 is disposed between the upper face of the IC substrate 20 and the lower face or the lateral faces of the light emitting cell group 10. Subsequently, as shown in FIG. 3C, the substrate 11 is separated from the light emitting cell group 10 mounted on the IC substrate 20 by a separating methods such as laser lift-off (i.e., substrate separating step SA8). The light emitting cell group 10 mounted on the IC substrate 20 is now in the state where the second electrode 19 in each light emitting cell 1 is connected to the IC substrate electrode 22 formed on the IC substrate 20 to correspond to the individual light emitting cells 1. In this way, the light emitting cells in the light emitting cell group 10 can be individually controlled by using, for example, a controller 50.

Figure 3D:
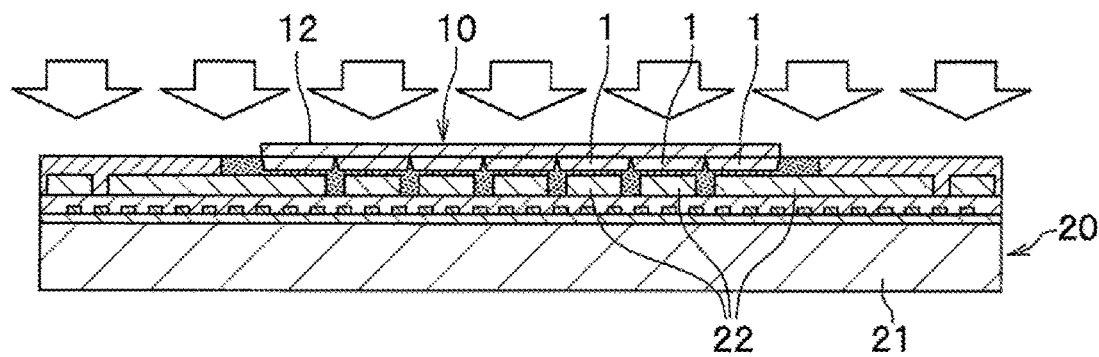
FIG. 3D is a view of the method of manufacturing the light emitting device according to the embodiment, which is a schematic sectional view of the semiconductor layers of the light emitting cell group after being subjected to dry etching.
Figure 16:
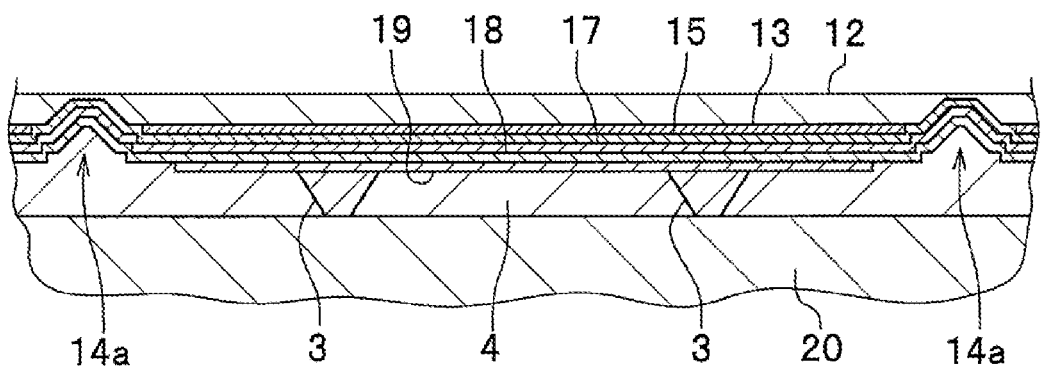
FIG. 16 is a schematic sectional view, enlarged one of the light emitting cells after reducing the thickness of the semiconductor layer by dry etching in the method of manufacturing the light emitting device according to the first embodiment.

Step SA8, as shown in FIG. 3D and FIG. 16, is a semiconductor layer thinning step to reduce the thickness of the first semiconductor layer 12n of the semiconductor stack 12 subsequent to separating the substrate 11. In the semiconductor layer thinning step, the first semiconductor layer 12n is thinned so as not to reach the first insulation layer 15 formed on the grooves 14a by dry etching or polishing from the side of the first semiconductor layer 12n from which the substrate 11 has been removed. In the semiconductor layer thinning step, for example, reactive ion etching using a chlorine-based gas, can be employed for dry etching, and chemical mechanical polishing (CMP) using, for example, a slurry or the like for mechanical polishing can be employed for polishing.

Figure 3E:
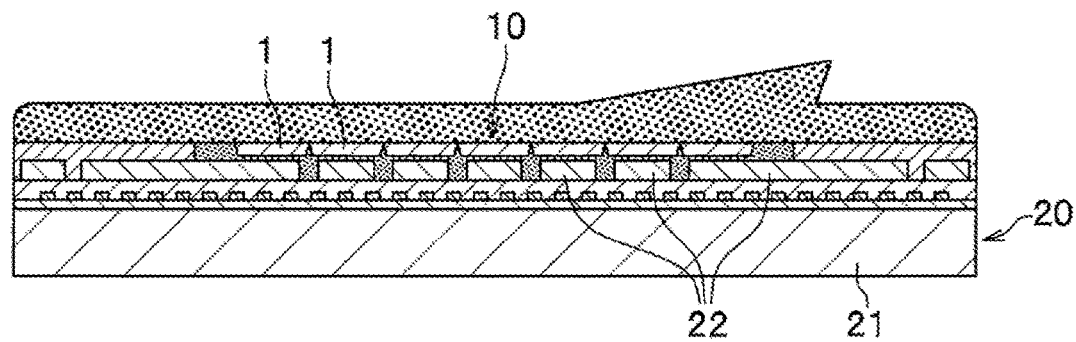
FIG. 3E is a sectional view showing the method of manufacturing the light emitting device according to the embodiment, schematically showing the semiconductor layer after being subjected to wet etching.
Figure 17:
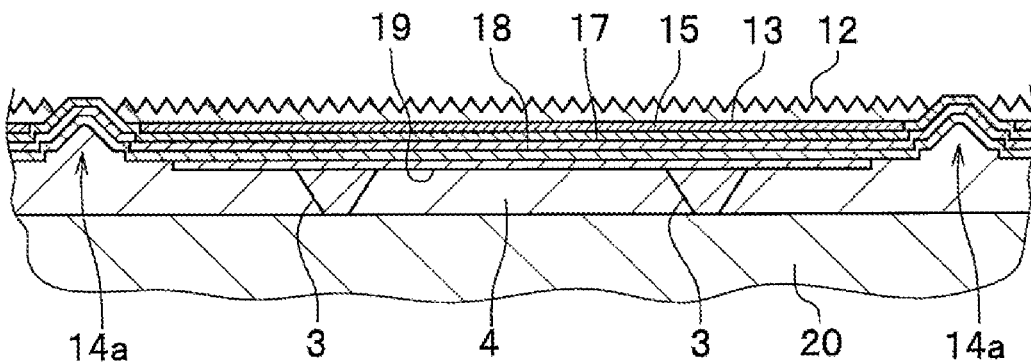
FIG. 17 is a schematic sectional view, enlarged one of the light emitting cells after performing a roughening process on the surface of the semiconductor layer by wet etching in the method of manufacturing the light emitting device according to the embodiments.
Figure 18:
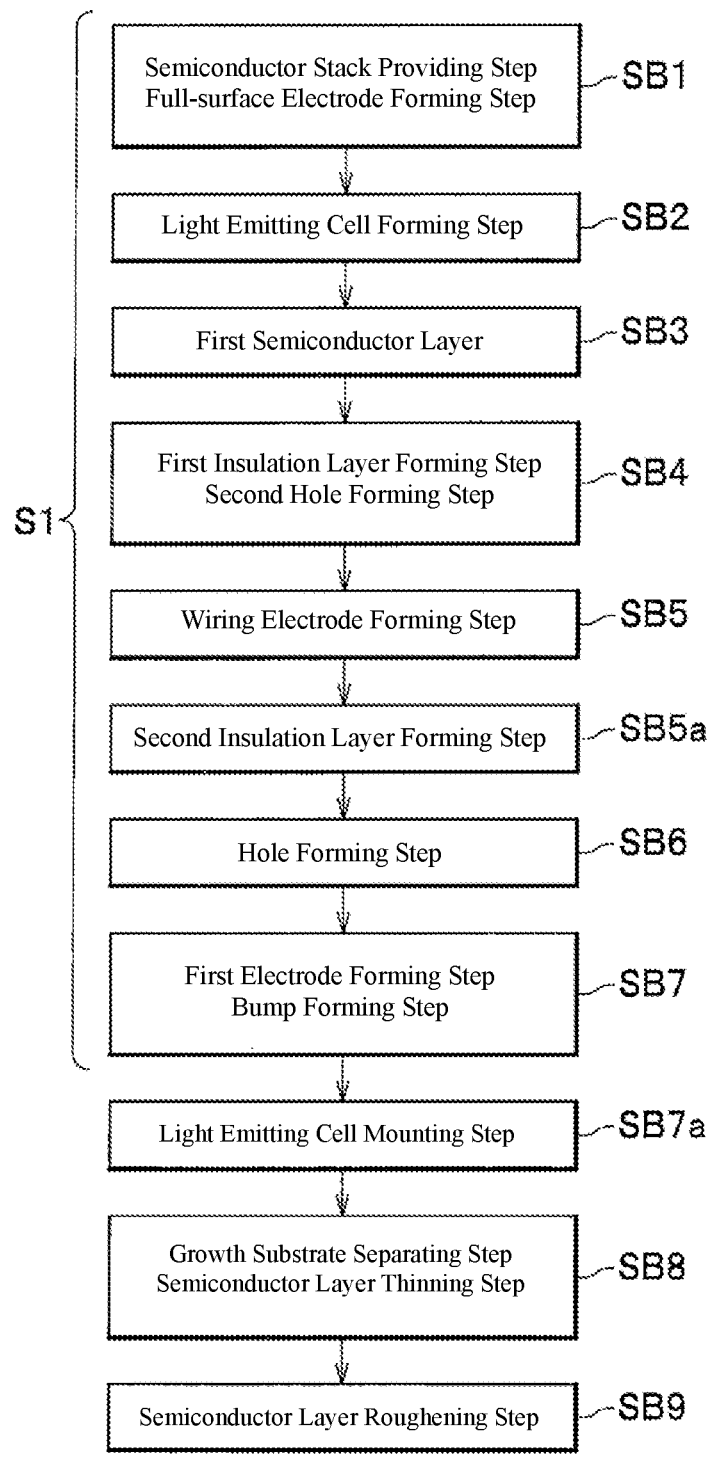
FIG. 18 is a flowchart for the method of manufacturing the light emitting device according to a second embodiment.
Figure 19A:
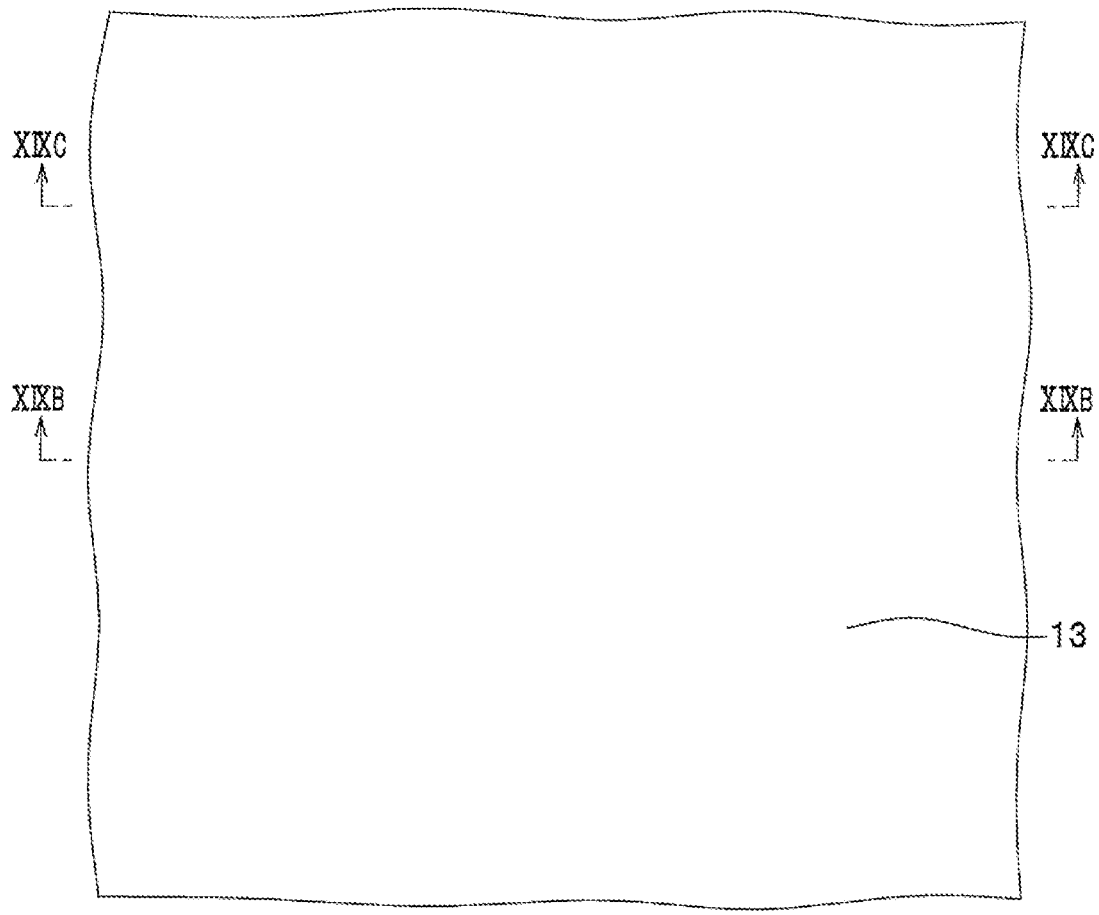
FIG. 19A is a schematic plan view, enlarged one of light emitting cells after forming a full-surface electrode layer on the semiconductor stack in the method of manufacturing the light emitting device according to the second embodiment.
Figure 19B:
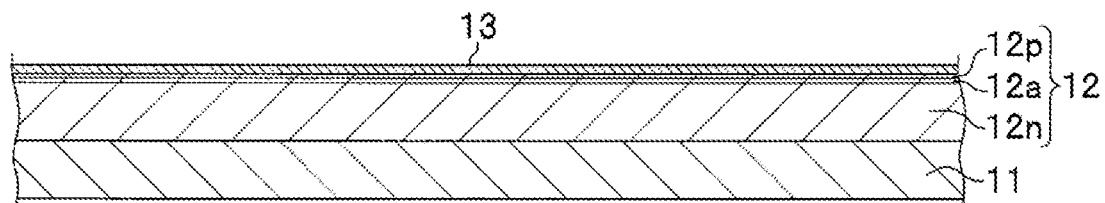
FIG. 19B is a sectional view taken along line XIXB-XIXB in FIG. 19A in the method of manufacturing the light emitting device according to the second embodiment.
Figure 19C:
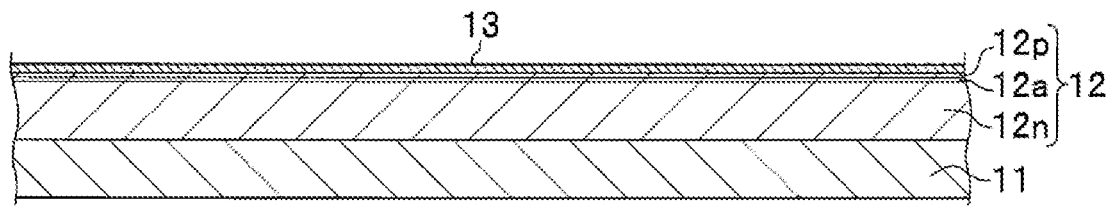
FIG. 19C is a sectional view taken along line XIXC-XIXC in FIG. 19A in the method of manufacturing the light emitting device according to the second embodiment.

Step SA9, as shown in FIG. 3E and FIG. 17, is a semiconductor layer roughening step to roughen the face of the first semiconductor layer 12n which has been thinned down. In the semiconductor layer roughening step, the first insulation layer 15 is exposed from the first semiconductor layer 12n at the locations of the grooves 14a by partially removing the first semiconductor layer 12n in the thickness direction by wet etching while performing a surface roughening step on the face of the first semiconductor layer 12n which has been subjected to the removal step SA8. Here, the first insulation layer 15 can be exposed from the first semiconductor layer 12n at the locations of the grooves 14a in one step instead of the two steps, SA8 and SA9, performed as in the case of the present embodiment. For example, the first insulation layer 15 can be exposed from the first semiconductor layer 12n by performing dry etching or the like from the side of the first semiconductor layer 12n from which the substrate 11 has been removed.

In this case, however, the wiring electrode 17, the first insulation layer 15, the second insulation layer 18, or the like disposed on the grooves 14a might be modified or degraded by dry etching. As a result, a light emitting cell 1 can fail to be turned on because of a line disconnection in the wiring electrode 17 at a position of a groove 14a or the like. For this reason, in this embodiment, the first semiconductor layer 12n is thinned to the extent not reaching the first insulation layer 15 in the semiconductor layer thinning step by dry etching or polishing, and then the first semiconductor layer 12n positioned under the first insulation layer 15 is removed by wet etching in the semiconductor layer roughening step. This can reduce the modification or degradation of the wiring electrode 17, the first insulation layer 15, and the second insulation layer 18 as compared to the case of exposing the first insulation layer 15 by dry etching alone. Furthermore, the step of exposing the first insulation layer 15 and the step of roughening the first semiconductor layer 12n are concurrently performed without increasing the number of steps.

The wet etching in the semiconductor surface roughening step can be performed by using, for example, an aqueous solution containing TMAH. The first insulation layer 15 constructed with $SiO_2$ or the like is less likely to be etched by such wet etching, resulting in selectively etched in the semiconductor stack 12. The surface of the first semiconductor layer 12n is roughened so as to have recesses of about 2.5 µm in depth, for example. Roughening of the first semiconductor layer 12n forms recesses and protrusions on the surface of the first semiconductor layer 12n thereby increasing the emission efficiency of the emission layer 12a.

In the semiconductor layer roughening step, wet etching is preferably performed to position the lower face of the first semiconductor layer 12n closer to the second semiconductor layer 12p than the wiring electrode 17 disposed in the grooves 14a. This makes it difficult for the light from a light emitting cell 1 to propagate to the adjacent light emitting cells 1 while allowing the wiring electrode 17 disposed in the grooves 14a to more readily reflect the light from the light emitting cell 1. This, as a result, can improve the distinguishability of light released from the light emitting device 100.

FIG. 3D and FIG. 16 are different fields of view of the same step where FIG. 3D is a schematic sectional view of the whole device, and FIG. 16 is a schematic enlarged sectional view of one of the light emitting cells 1. Likewise, FIG. 3E and FIG. 17 are different views of another step. FIG. 3E is a section schematically showing the whole device, and FIG. 17 is an enlarged sectional view of one of the light emitting cell 1.

Following the semiconductor layer roughening step, a phosphor layer forming step is performed whereby a phosphor layer 5 comprising a base resin material containing a phosphor which is a wavelength conversion material is formed to cover the roughened first semiconductor layer 12n. In the phosphor layer forming step, the phosphor layer 5 is disposed, for example, by spraying, coating, or dripping such as potting.

The light emitting device 100 manufactured by the steps described above becomes a light emitting device system 100S, as shown in FIG. 1, by being mounted on a secondary mounting substrate 30, connecting a controller 50 as a control mechanism to the secondary mounting substrate 30, and disposing a heat dissipater 60 for cooling the secondary mounting substrate 30. For the secondary mounting substrate 30, for example, a ceramic material, such as aluminum nitride, or a glass epoxy resin can be used. For the heat dissipater 60, for example, metals such as Al or Al alloys can be used.

Subsequently, the construction of the light emitting device 100 will be explained with reference to the applicable drawings. The light emitting device 100 includes a light emitting cell group 10 having a plurality of light emitting cells 1, an IC substrate 20 to which the light emitting cell group 10 is connected, and a phosphor layer 5 covering the surface of the light emitting cell group 10. Between the light emitting cell group 10 and the IC substrate 20 of the light emitting device 100, a filler 4 comprising a base resin material containing a light diffusion material is disposed. The base material for the filler 4 preferably is one that is less likely to absorb the light from the light emitting cells 1 and, for example, epoxy resins, silicone resins, modified silicone resins, or the like can be used. For the light diffusion material contained in the filler 4, titanium oxide, aluminum oxide, or the like can be used. Disposing the filler 4 can facilitate the reflection of the emitted light from the light emitting cell group 10 towards the light extraction face which is on the opposite side of the IC substrate 20, thereby increasing the light extraction efficiency.

The light emitting device 100 includes: the first insulation layer 15 having a first hole 15a and second holes 15b in each light emitting cell 1; a wiring electrode 17 disposed to cover the first insulation layer 15 and is in electrical connection with the first semiconductor layer 12n at the first hole 15a in each light emitting cell 1; a second electrode 19 disposed in each light emitting cell 1 and is in electrical connection with the second semiconductor layer 12p at the second holes 15b; and a second insulation layer 18 having a third hole 18a positioned between the wiring electrode 17 and the second electrode 19. Furthermore, in the light emitting device 100, the first insulation layer 15 is exposed from the first semiconductor layer 12n between the light emitting cells 1, and the light extraction face which is the lower face of the first semiconductor layer 12n has a roughened surface. The light emitting device 100 may include a connection electrode 16 disposed in contact with the first semiconductor layer 12n in the first hole to allow the wiring electrode 17 to be in electrical connection with the first semiconductor layer 12n via the connection electrode 16.

Each constituent element of the light emitting device 100 will be explained below.

Figure 2A:
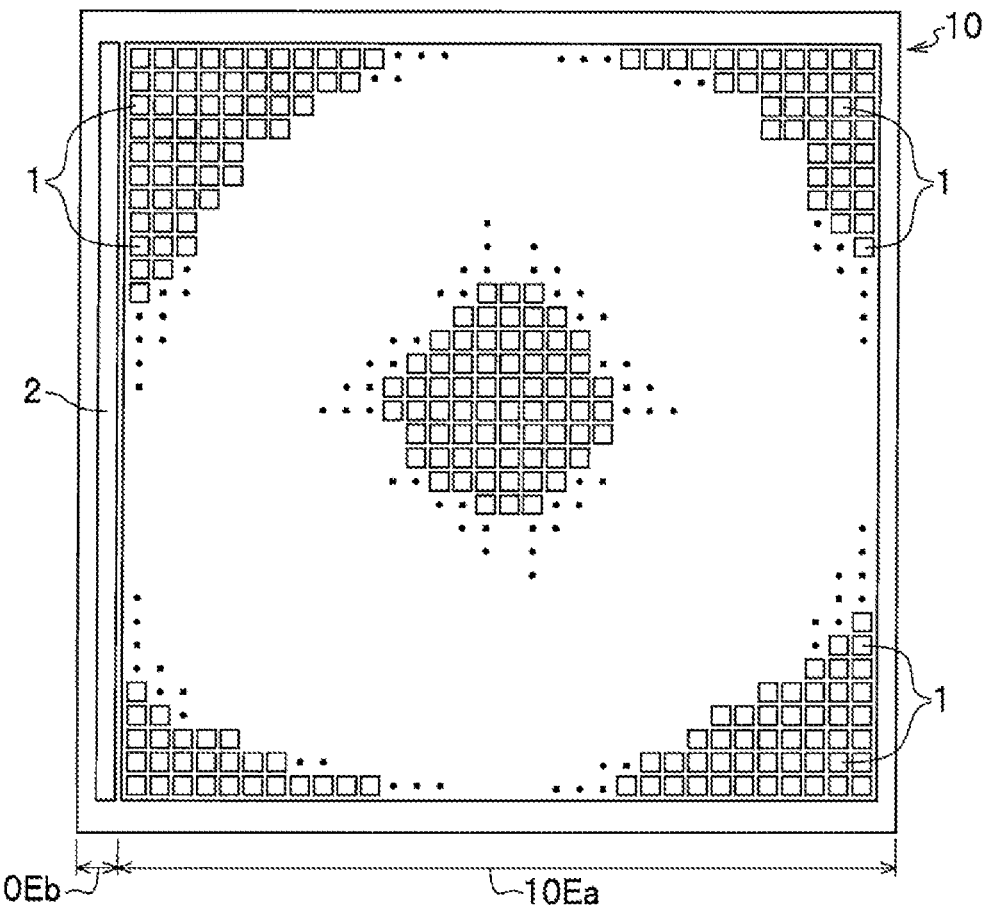
FIG. 2A is a schematic plan view of the light emitting cells of the light emitting device according to the embodiment.
Figure 2B:
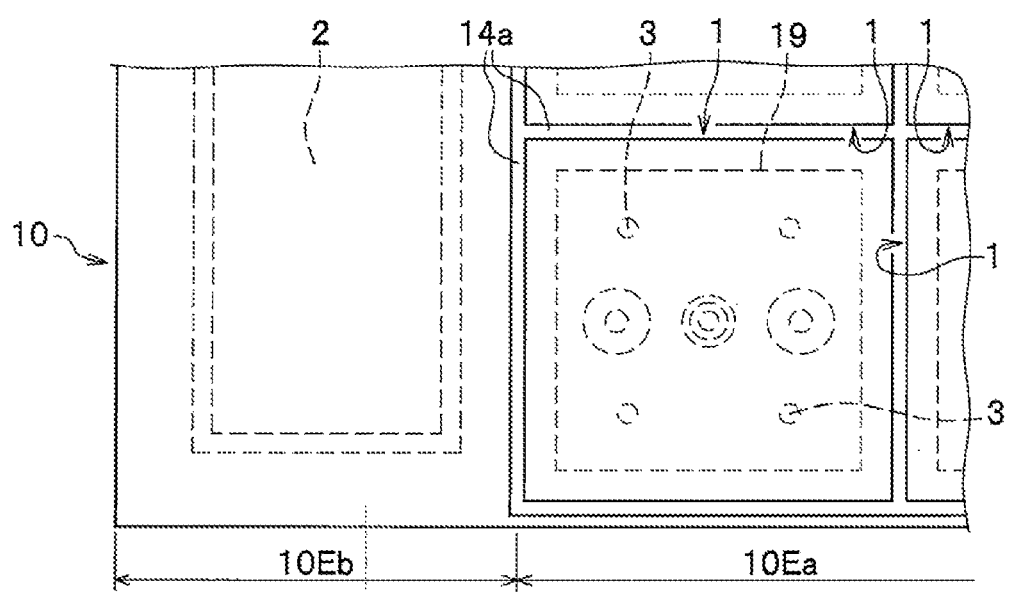
FIG. 2B is a schematic view enlarging a portion of FIG. 2A.

The light emitting cell group 10 has a plurality of light emitting cells 1 each having a semiconductor stack 12 which includes a first semiconductor layer 12n and a second semiconductor layer 12p disposed on the upper face of the first semiconductor layer 12n while exposing a portion of the upper face of the first semiconductor layer 12n. As shown in FIG. 2A, the light emitting cells 1 are formed in the region 10Ea so as to be arranged in orderly columns and rows. Furthermore, an external region 10Eb is disposed adjacent to the region 10Ea along the row direction or the column direction, and a first electrode 2 is formed in the external region 10Eb. The region 10Ea and the external region 10Eb are both formed with the semiconductor stack 12.

For the light emitting cells 1, light emitting diodes (LEDs) are preferably used. Light emitting diodes of a given wavelength can be selected. For blue or green light emitting diodes, for example, those employing ZnSe, nitride-based semiconductor (e.g., $In_xAl_yGa_{1-X-Y}N$, $0 \leq X$, $0 \leq Y$, $X+Y \leq 1$), or GaP can be used.

The IC substrate 20 includes an IC support substrate 21 and a plurality of IC substrate electrodes 22 formed on the IC support substrate 21.

For the IC support substrate 21, for example, a silicone substrate, SiC substrate, GaN substrate, or the like can be used. The IC support substrate 12 can have, for example, a rectangular shape in a top view. The IC support substrate 21 is formed with wiring on the substrate face or in the substrate so as to be connectable to external electrodes.

The IC substrate electrodes 22 are for electrically connecting the light emitting cells 1 of the light emitting cell group 10 and the first electrode 2, allowing the controller 50 to individually control to turn on the light emitting cells 1. The IC substrate electrodes 22 are formed to correspond to individual bumps 3 so that the bumps 3 formed on the upper faces of the light emitting cells 1 and the bumps 3 formed on the upper face of the first electrode 2 can be individually connected.

The light extraction face of each light emitting cell 1 is the side of the first semiconductor layer 12n on which recesses and protrusions are formed. The light emitting cells 1 each include an electrode structure on the semiconductor stack 12 on the IC support substrate 21 side, and individual lighting of cells is enabled as electrical connections are made between the electrode structures and the IC substrate electrodes 22. The electrode structure of each light emitting cell 1 includes a wiring electrode 17 for electrically connecting the first semiconductor layer 12n to the first electrode 2, and a second electrode 19 electrically connected to the second semiconductor layer 12p. Each light emitting cell 1 includes a connection electrode 16 for electrical connection with the wiring electrode 17, and the first semiconductor layer 12n is connected to the wiring electrode 17 via the connection electrode 16. Moreover, in the light emitting cells 1, a full-surface electrode layer 13 is formed on the second semiconductor layer 12p of the semiconductor stack 12 in the area excluding the exposed regions 14b. In the light emitting cells 1, moreover, the first insulation layer 15 is formed between the full-surface electrode layer 13 and the wiring electrode 17, and a second insulation layer 18 is formed between the wiring electrode 17 and the second electrode 19. For the light emitting cells 1, the first electrode 2 and the second electrodes 19 are disposed on the same side of the light emitting cells 1.

The first electrode 2 is an electrode for supplying an electric current to the first semiconductor layer 12n. The first electrode 2 is formed in the external region 10Eb to cover the second insulation layer 18, and is connected to the wiring electrode 17 via the fourth hole 18d in the second insulation layer 18. The first electrode 2, furthermore, is in electrical connection with the first semiconductor layer 12n via the wiring electrode 17 and the connection electrode 16. The first electrode 2 is formed to a rectangular shape in the external region 10Eb when viewed from the top. For example, it is preferable to form the first electrode 2 by using at least one element selected from among Ti, Al, Al alloys, Ag, and Ag alloys.

The second electrode 19 is an electrode for supplying an electric current to the second semiconductor layer 12p. The second electrode 19 functions as an electrode to uniformly diffuse the electric current to the second semiconductor layer 12p as well as concurrently functioning as a reflective film to reflect the light from the light emitting cells 1. The second electrode 19 is formed on the upper face of a light emitting cell 1 in a rectangular shape when viewed from the top. The second electrode 19 is connected to the full-surface electrode layer 13 via the third holes 18a in the second insulation layer 18 and the second holes 15b in the first insulation layer 15, and is in electrical connection with the second semiconductor layer 12p via the full-surface electrode layer 13. For example, the second electrode 19 can be formed using a metal film containing at least one element selected from among Ti, Al, Al alloys, Ag, and Ag alloys. The first electrode 2 and the second electrodes 19 here are formed with the same metal at the same time by a film forming method such as sputtering.

The lower face of the semiconductor stack 12 in each light emitting cell 1, which serves as the light extraction face, is preferably positioned closer to the upper face of the semiconductor stack 12 than the wiring electrode 17 located in the regions where the first insulation layer 15 is exposed from the semiconductor stack 12 in a sectional view of the light emitting cell 1. This allows the wiring electrode 17 to reflect the light laterally propagating from a light emitting cell 1, thereby improving the distinguishability of the illuminating light emitting cell among the adjacent light emitting cells 1. Specifically, the thickness of the semiconductor stack 12 in each light emitting cell 1 is, for example, 1 µm to 10 µm, and the space between the light emitting cells 1 is 3 µm to 25 µm.

The full-surface electrode layer 13 is formed using, for example, an ITO film, to be connected to the second semiconductor layer 12p, and in electrical connection with the second electrode 19. The full-surface electrode layer 13 is formed on the second semiconductor layer 12p except for the locations where the grooves 14a and the exposed regions 14b are formed. The full-surface electrode layer 13 is a layer for diffusing an electric current across the entire surface of the second semiconductor layer 12p. The full-surface electrode layer 13 is also formed on the second semiconductor layer 12p in the external region 10Eb.

The first insulation layer 15 is formed between the full-surface electrode layer 13 and the wiring electrode 17 to electrically insulate between the full-surface electrode layer 13 and the wiring electrode 17. In each light emitting cell 1, the first insulation layer 15 has a first hole 15a formed on the first semiconductor layer 12n and second holes 15b formed on the second semiconductor layer 12p, and is formed to cover the full-surface electrode layer 13. The first insulation layer 15 is exposed from the first semiconductor layer 12n in the spaces between the light emitting cells 1. The first insulation layer 15 also functions to protect the semiconductor stack 12 as well as preventing the buildup of static electricity. The first insulation layer 15 is formed, for example, as a single layer or multiple layers, and can be constructed with $SiO_2$, $Nb_2O_5$, $ZrO_2$, SiN, SiON, SiC, AlN, or the like. The first insulation layer 15 can be configured as a dielectric multilayer film in which a plurality of dielectric layers are stacked, and can be configured with a dielectric multilayer film designed to reflect the light from the light emitting cells 1 by alternately stacking, for example, layers comprising $SiO_2$ and layers comprising $Nb_2O_5$. This allows for reflection of the laterally propagating light from the light emitting cells 1 thereby improving the distinguishability of the light emitting cells 1 when illuminating.

The connection electrode 16 is formed to facilitate the connection between the wiring electrode 17 and the first semiconductor layer 12n. The connection electrode 16 is preferably formed as a stack structure made by stacking metals such as AlCu, Ti, Ru, or the like. The connection electrode 16 is formed in the circular region up to the peripheral edge of the first hole 15a in the first insulation layer 15.

The wiring electrode 17 has light reflectivity and is disposed to cover the first insulation layer 15. The wiring electrode 17 is formed to be in electrical connection with the first semiconductor layer 12n in each light emitting cell 1. The wiring electrode 17 here is connected to be in electrical connection with the first semiconductor layer 12n via the connection electrode 16. Furthermore, the wiring electrode 17 is formed to have openings, which are prescribed regions 17e for the electrical connection between the second electrode 19 and the full-surface electrode layer 13, on both sides of the connection electrode 16. The wiring electrode 17 is formed as a stacked body here, and is formed by stacking, for example, AlCu, Ti, $SiO_2$, or the like to their individual thicknesses. Forming the wiring electrode 17 in the region where the first insulation layer 15 is exposed from the semiconductor stack 12 in a top view allows for the configuration of a light emitting cell 1 which is not affected by the light from any of the adjacent light emitting cells 1. Furthermore, part of the wiring electrode 17 disposed between adjacent light emitting cells is preferably formed so as to project closer to the lower face of the semiconductor stack than the lower face of the first semiconductor layer 12n. This allows the wiring electrode 17 to reflect the laterally propagating light from the light emitting cells 1, thereby mitigating unintended propagation of light to adjacent light emitting cells 1 and improving the distinguishability of the light emitting cell group 10.

The second insulation layer 18 is formed between the wiring electrode 17 and the second electrode 19 for electrical insulation between the wiring electrode 17 and the second electrode 19. The second insulation layer 18 is formed on the wiring electrode 17 in region of each of the light emitting cells 1, and has third holes 18a formed in the prescribed regions 17e. The second insulation layer 18 has regions 18e recessed to the extent substantially equivalent to the thickness of the wiring electrode 17 formed by the prescribed regions 17e in the wiring electrode 17. Moreover, the third holes 18a of the second insulation layer 18 are formed to be in communication with the second holes 15b of the first insulation layer 15. The second insulation layer 18 is formed continuously on the light emitting cell group 10, as well as on the wiring electrode 17 of the external region 10Eb.

The semiconductor stack 12 is formed in each cell in the light emitting cell group 10, and the first insulation layer 15 exposed between the light emitting cells 1 define each light emitting cell 1. The lower face of the first semiconductor layer 12n has a roughened surface to facilitate extraction of light from the semiconductor stack 12.

A phosphor layer 5 is formed to cover the light emitting cell group 10, and the lower face of each light emitting cell 1 is covered by the phosphor layer 5. For the phosphor layer 5, for example, a wavelength conversion material in which base material made of a light transmissive resin contains phosphor particles, can be used.

The light transmissive resin preferably has light transmissivity for the emitted light from the light emitting elements. Examples of the light transmissive resin include silicone resins, epoxy resins, phenol resins, polycarbonate resins, acrylic resins, or their modified resins.

For the phosphor, any phosphor used in the art can be suitably selected without any particular limitations for the type, concentration, or the like of the phosphor.

The thickness of the phosphor layer 5 is preferably set, for example, to 50 µm at most. Setting the thickness of the phosphor layer 5 to 50 µm at most physically narrows the paths in in-plane directions thereby reducing propagation of light. This can reduce the propagation of the light from an illuminating light emitting cell 1 to the adjacent light emitting cells 1 when individually illuminating the light emitting cells 1 are.

The light emitting device 100 constructed as above is bonded to a secondary mounting substrate 30. A controller 50 which is a control unit, is installed on the secondary mounting substrate 30.

Second Embodiment

Method of Manufacturing Light Emitting Device 100B

Subsequently, the light emitting device manufacturing method according to a second embodiment will be explained with reference to FIG. 18 to FIG. 31. The light emitting device manufacturing method according to the second embodiment and the light emitting device manufacturing method according to the first embodiment differ in the surface of each light emitting cell 1 on which the bumps 3 are formed to connect the p/n electrode side. In the light emitting device manufacturing method according to the first embodiment, bumps 3 formed on the upper face of each light emitting cell 1 are connected to the p-side electrode (i.e., the second electrode 19) whereas in the light emitting device manufacturing method according to the second embodiment, the bumps 3 formed on the upper face of each light emitting cell 1 are connected to the n-side electrode (i.e., the first electrode 2). For this reason, some constituent elements will be explained as being formed at different locations or different timing even if they have the same names or reference numerals.

The method of manufacturing the light emitting device 100B includes: step SB1 of providing a semiconductor stack 12; step SB2 of forming a light emitting cell group comprising a plurality of light emitting cells; step SB3 of exposing the first semiconductor layer 12n from the second semiconductor layer 12p; step SB4 of forming a first insulation layer 15; step of SB5 of forming a wiring electrode 17; step SB6 of forming a first hole 15a in the first insulation layer 15; step SB7 of forming a first electrode 2; step SB8 of thinning the semiconductor stack 12; and step SB9 of roughening the semiconductor stack 12. The first semiconductor layer 12n, the second semiconductor layer 12p, and the emission layer 12a are shown only in FIG. 19B and FIG. 19C, and are collectively shown as the semiconductor stack 12 in the remaining FIG. 19A and FIG. 20 to FIG. 31. The materials and layout of the members already explained will be denoted with the same reference numerals for which the explanations might be abbreviated when appropriate.

The semiconductor stack providing step SB1 is a step of providing a semiconductor stack 12 formed on a substrate 11. In this providing step, a semiconductor stack 12 including an n-type semiconductor layer which is a first semiconductor layer 12n, the emission layer 12a, and the p-type semiconductor layer which is a second semiconductor layer 12p are provided by forming in that order from the substrate 11 side. The semiconductor stack 12 is set to a size so that an external region 10Eb can be formed adjacent to the region 10Ea in which the light emitting cells 1 will be formed.

Subsequently, a full-surface electrode forming step is performed to form a full-surface electrode layer 13 on the semiconductor stack 12, full-surface electrode layer 13 being a p-side full-surface electrode. In the full-surface electrode forming step, the full-surface electrode layer 13 can be formed, for example, by sputtering or the like.

Figure 20A:
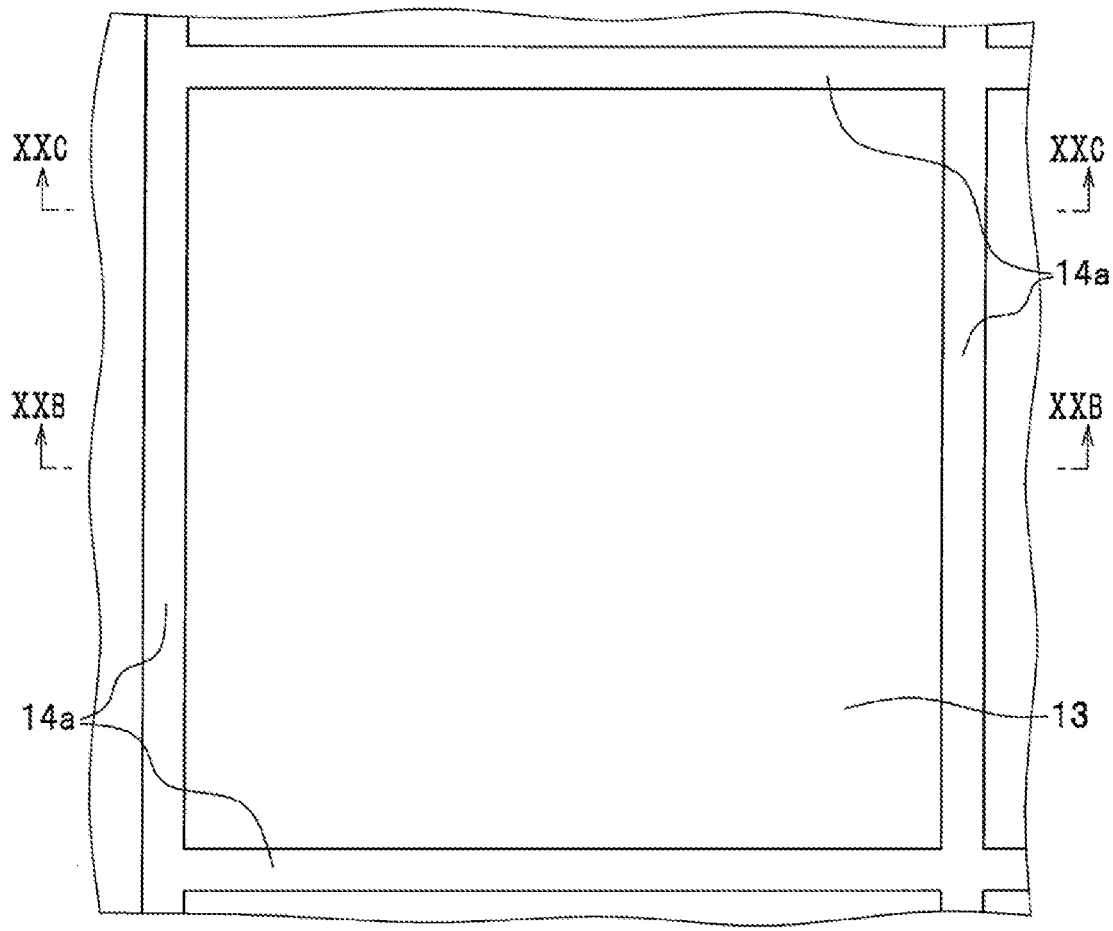
FIG. 20A is a schematic plan view, enlarged one of the light emitting cells after forming grooves by partially etching the semiconductor stack in the method of manufacturing the light emitting device according to the second embodiment.
Figure 20B:
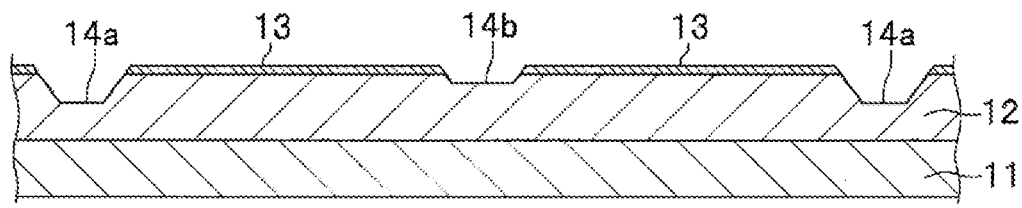
FIG. 20B is a sectional view taken along line XXB-XXB in FIG. 20A in the method of manufacturing the light emitting device according to the second embodiment.
Figure 20C:
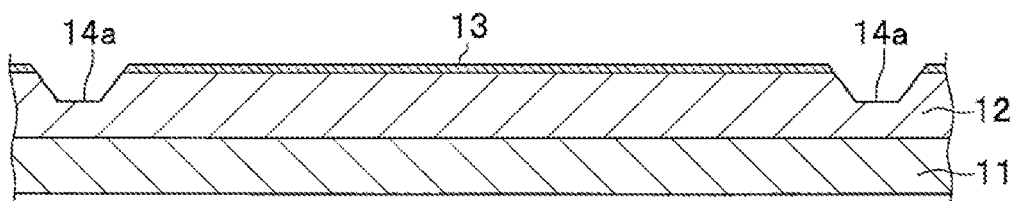
FIG. 20C is a sectional view taken along line XXC-XXC in FIG. 20A in the method of manufacturing the light emitting device according to the second embodiment.

Then the light emitting cell forming step SB2 is performed to form the light emitting cells 1. As shown in FIG. 20A to FIG. 20C, in the light emitting cell forming step, a light emitting cell group 10 are formed by partitioning the semiconductor stack 12 into a plurality of regions for the light emitting cells 1 by forming a plurality of grooves 14a in the semiconductor stack 12. The light emitting cell forming step defines and forms the light emitting cells 1 arranged in orderly columns and rows by forming a grid-shaped grooves 14a reaching the first semiconductor layer 12n, for example, by etching from the full-surface electrode layer 13 formed on the upper face of the semiconductor stack 12.

In the light emitting cell forming step, furthermore, the grooves 14a can be formed in such a manner as to define an external region 10Eb adjacent to the light emitting cells 1 arranged in columns and rows, the external region 10Eb extending at least in the row direction or column direction of the light emitting cells. The wiring electrode 17 is formed to extend to the external region 10Eb in which a second electrode 19 is formed to be in electrical connection with the wiring electrode 17. Here, one external region 10Eb is formed to extend in the column direction of the light emitting cell group 10, but the layout of the external region 10Eb can be changed as in the case of the first embodiment described above.

Figure 21A:
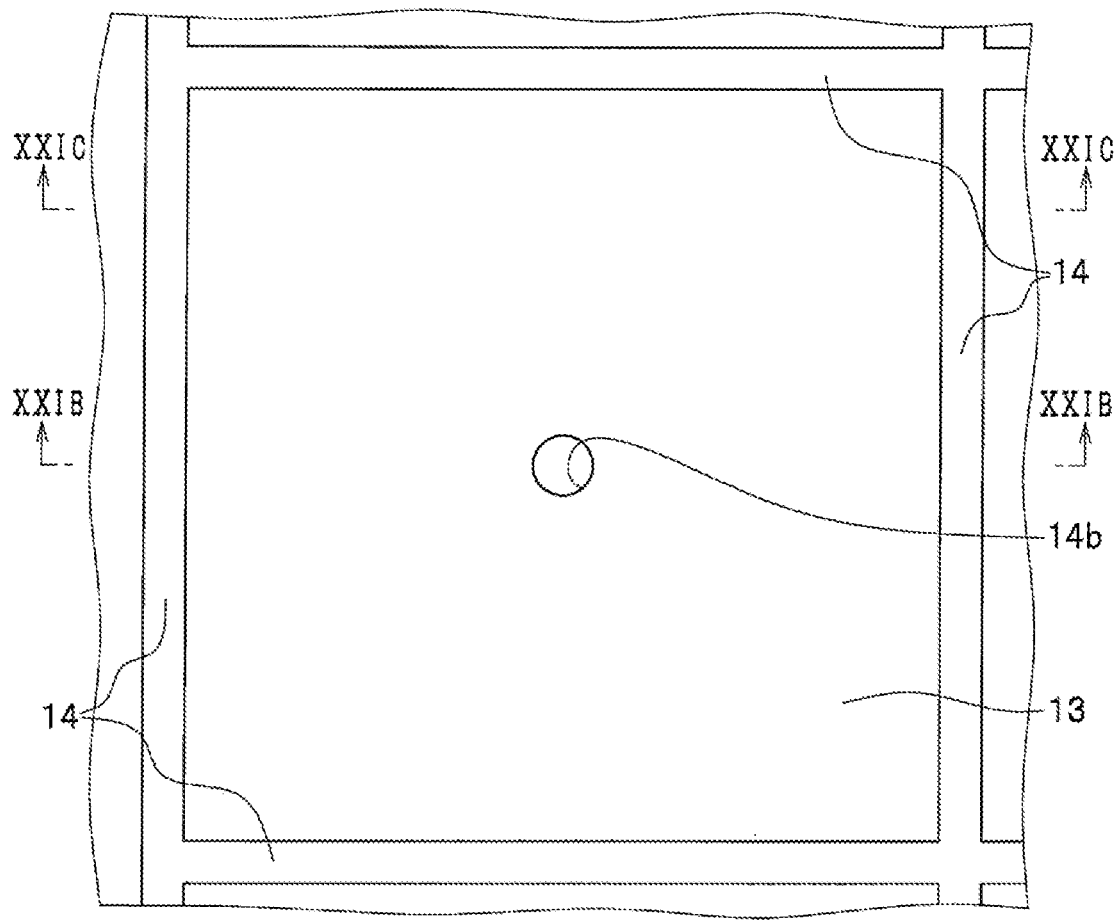
FIG. 21A is a schematic plan view, enlarged one of the light emitting cells after forming an opening that exposes the first semiconductor layer from the second semiconductor layer by partially removing the full-surface electrode and the first semiconductor layer in the method of manufacturing the light emitting device according to the second embodiment.
Figure 21B:
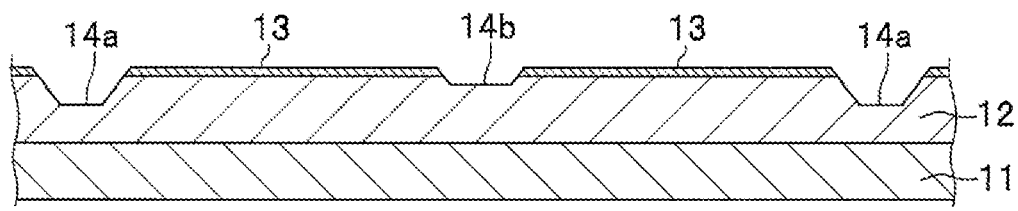
FIG. 21B is a sectional view taken along line XXIB-XXIB in FIG. 21A in the method of manufacturing the light emitting device according to the second embodiment.
Figure 21C:
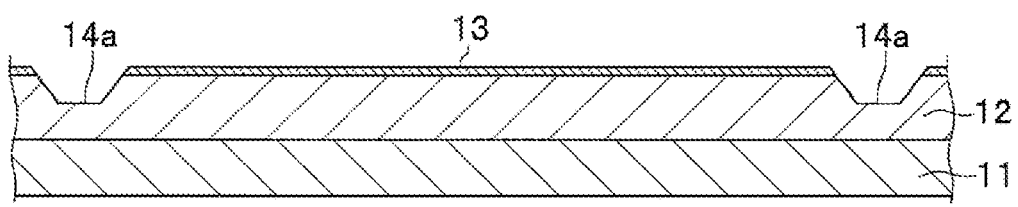
FIG. 21C is a sectional view taken along line XXIC-XXIC in FIG. 21A in the method of manufacturing the light emitting device according to the second embodiment.

In the first semiconductor layer exposing step SB3, the first semiconductor layer 12n is exposed as shown in FIG. 21A to FIG. 21C. In this step a portion of the first semiconductor layer 12n from the second semiconductor layer 12p by partially removing the second semiconductor layer 12p and the full-surface electrode layer 13 by etching or the like using a mask. In this exposing step, an exposed region 14b having substantially circular shape is formed in a top view by exposing the first semiconductor layer 12n from the full-surface electrode layer 13 and the second semiconductor layer 12p.

Figure 22A:
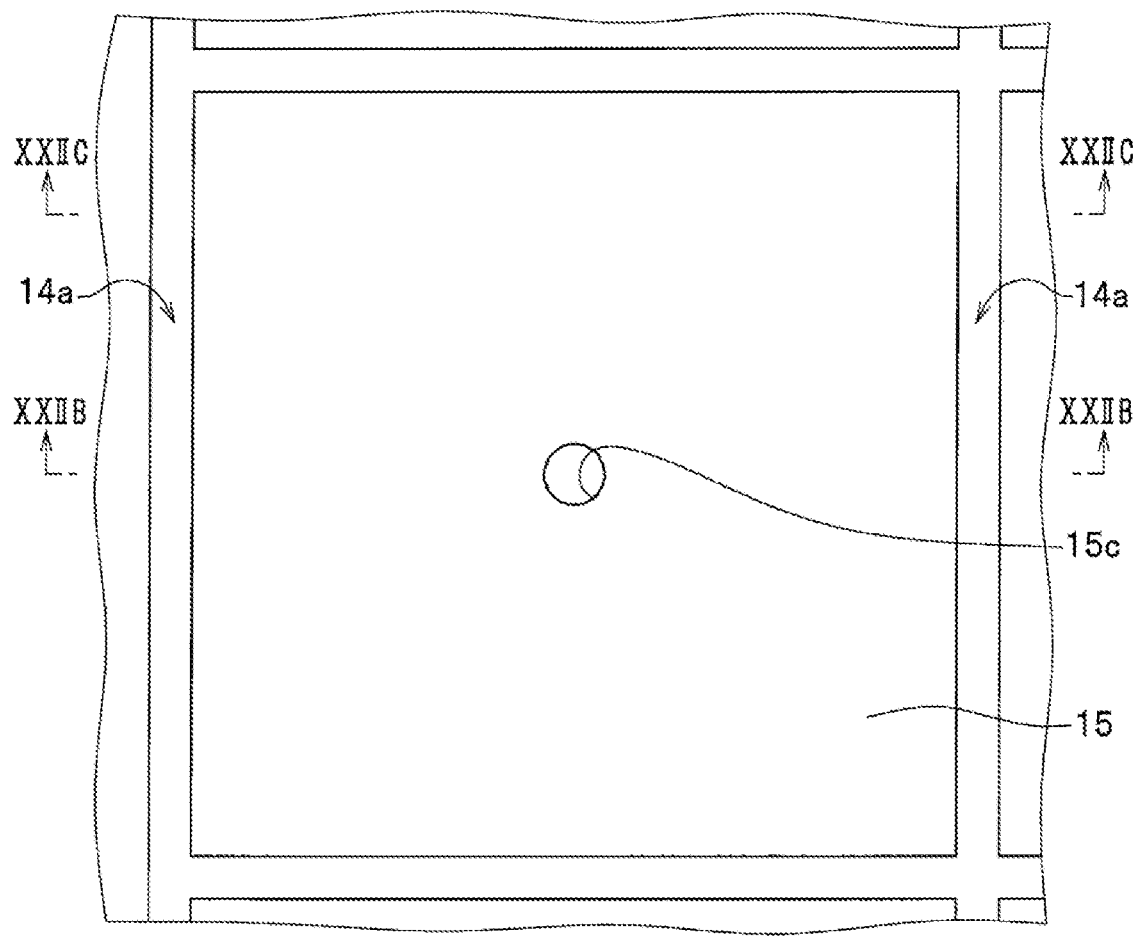
FIG. 22A is a schematic plan view, enlarged one of the light emitting cells after forming a first insulation layer continuously on the light emitting cell group and the grooves in the method of manufacturing the light emitting device according to the second embodiment.
Figure 22B:
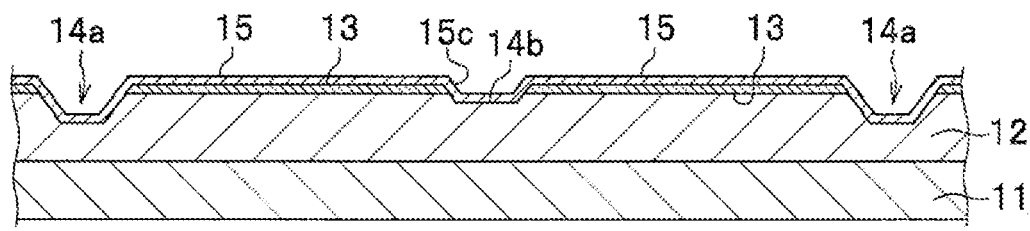
FIG. 22B is a sectional view taken along line XXIIB-XXIIB in FIG. 22A in the method of manufacturing the light emitting device according to the second embodiment.
Figure 22C:
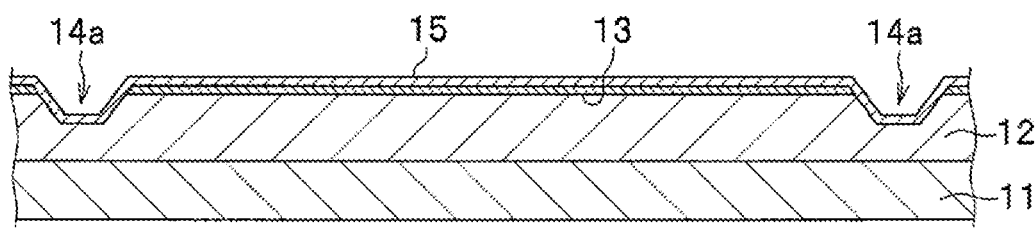
FIG. 22C is a sectional view taken along line XXIIC-XXIIC in FIG. 22A in the method of manufacturing the light emitting device according to the second embodiment.
Figure 23A:
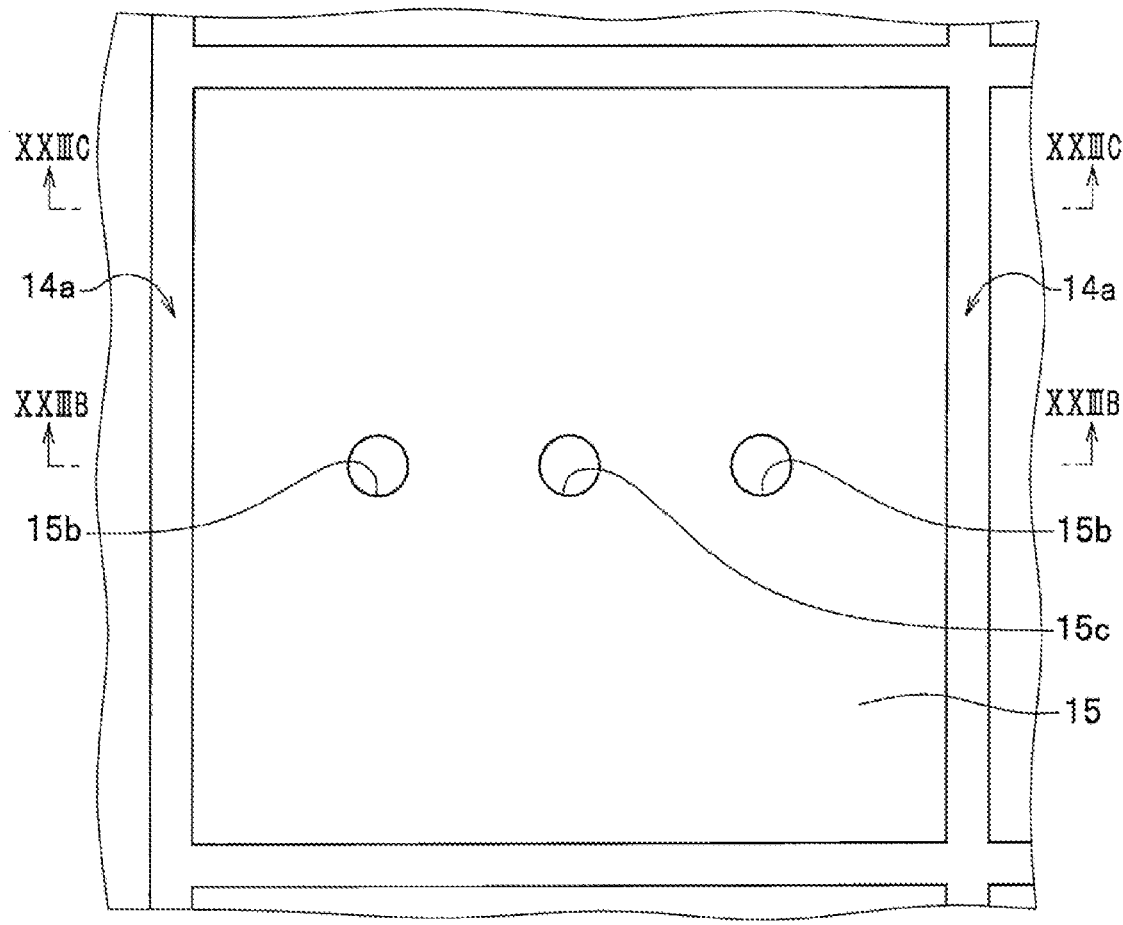
FIG. 23A is a schematic plan view, enlarged one of the light emitting cells after creating second holes in the first insulation layer in the method of manufacturing the light emitting device according to the second embodiment.
Figure 23B:
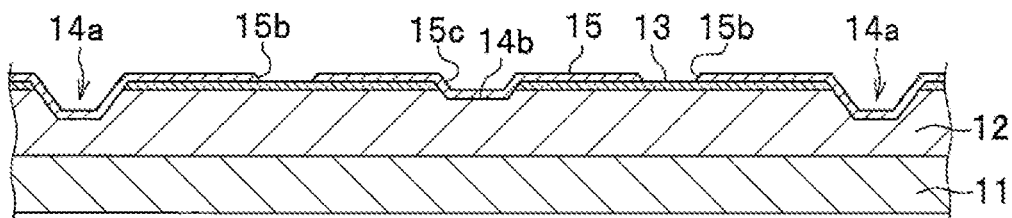
FIG. 23B is a sectional view taken along line XXIIIB-XXIIIB in FIG. 23A in the method of manufacturing the light emitting device according to the second embodiment.
Figure 23C:
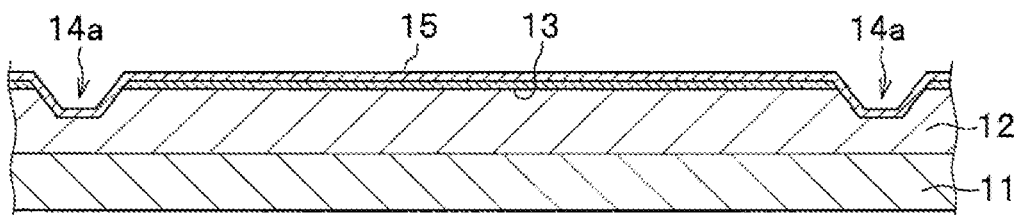
FIG. 23C is a sectional view taken along line XXIIIC-XXIIIC in FIG. 23A in the method of manufacturing the light emitting device according to the second embodiment.

As shown in FIG. 22A to FIG. 22C, step SB4 is a first insulation layer forming step that forms a first insulation layer 15 in which a first hole 15a and second holes 15b are to be formed. In the first insulation layer forming step, the first insulation layer 15 is formed to cover the full-surface electrode layer 13, the grooves 14a, and the exposed region 14b. For the first insulation layer 15, a similar material to that employed in the first embodiment described above can be used.

After forming the first insulation layer 15, second holes forming step is performed to form the second holes 15b. The second holes 15b is formed at two locations, on both sides of and spaced apart from the exposed region 14b covered by the first insulation layer 15. In the second hole forming step, the second holes 15b are formed so that the wiring electrode 17 is in electrical connection with the second semiconductor layer 12p via the full-surface electrode layer 13. The second holes 15b are formed in a circular shape here, but there are no limitations for the number or the shape. Moreover, the first insulation layer 15 has a recessed part 15c in the region that covers the exposed region 14b. The first insulation layer 15 is also disposed in the grooves 14a.

Figure 24A:
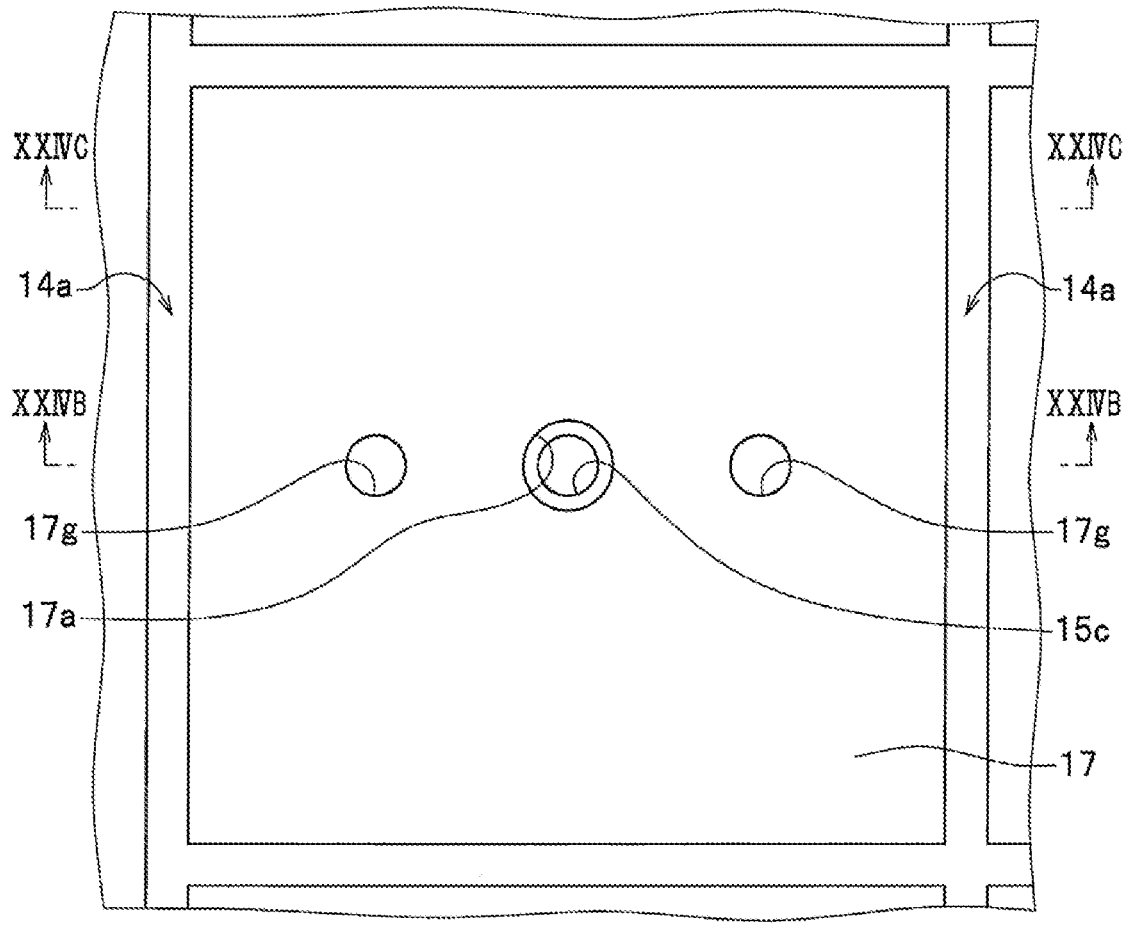
FIG. 24A is a schematic plan view, enlarged one of the light emitting cells after forming a wiring electrode on the first insulation layer in the method of manufacturing the light emitting device according to the second embodiment.
Figure 24B:
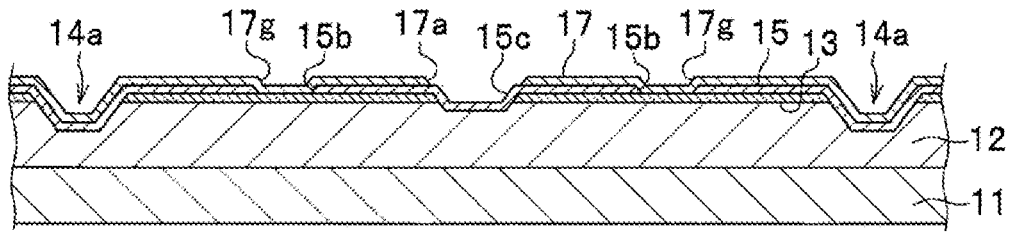
FIG. 24B is a sectional view taken along line XXIVB-XXIVB in FIG. 24A in the method of manufacturing the light emitting device according to the second embodiment.
Figure 24C:
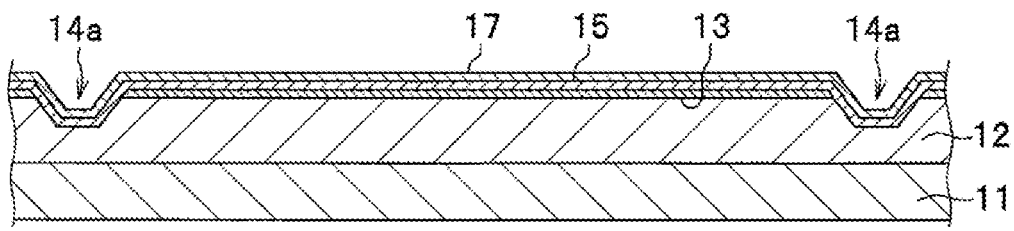
FIG. 24C is a sectional view taken along line XXIVC-XXIVC in FIG. 24A in the method of manufacturing the light emitting device according to the second embodiment.

As shown in FIG. 24A to FIG. 24C, step SB5 is a wiring electrode forming step to form a wiring electrode 17 to be in electrical connection with the second semiconductor layer 12p via the second holes 15b. In the wiring electrode forming step, the wiring electrode 17 is formed to cover part of the full-surface electrode layer 13 exposed at the second holes 15b as well as the first insulation layer 15 except for the recessed part 15c. The wiring electrode 17 is formed on the first insulation layer 15 excluding the recessed part 15c region where a first hole 15a is to be formed to be in electrical connection with the first electrode 2 by way of the opening 17a of the wiring electrode 17. That is, the wiring electrode 17 is formed, for example, by sputtering by forming a mask that covers the recessed part 15c. The wiring electrode 17 is formed on the first insulation layer 15 so as to be connected by the connection parts 17g to the full-surface electrode layer 13 via the second holes 15b. In the wiring electrode 17, the connection parts 17g connected to the full-surface electrode layer 13 are recessed by the second holes 15b by about the layer thickness. The wiring electrode 17 is also formed on the first insulation layer 15 in the grooves 14a.

Subsequently, a second insulation layer forming step SB5a is performed to form a second insulation layer 18 in which a third hole 18a will be formed.

Figure 25A:
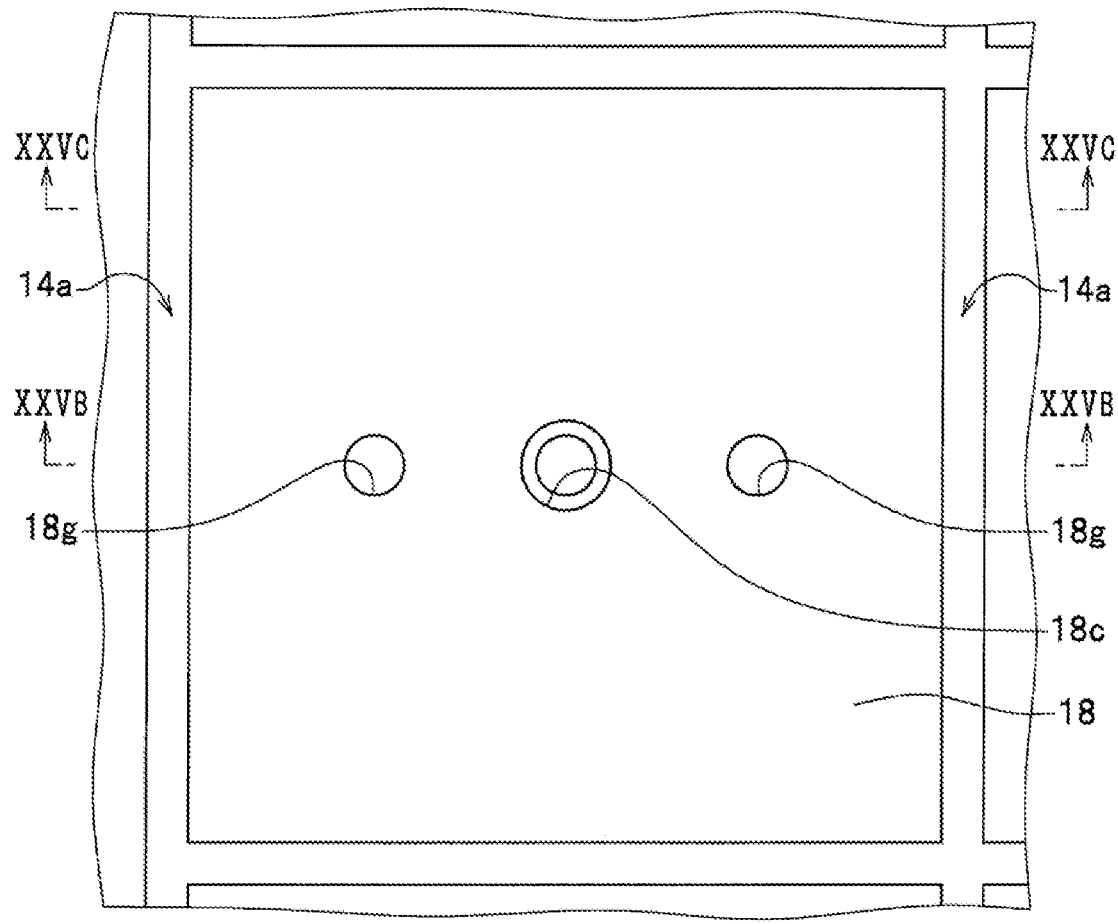
FIG. 25A is a schematic plan view, enlarged one of the light emitting cells after forming a second insulation layer on the wiring electrode in the method of manufacturing the light emitting device according to the second embodiment.
Figure 25B:
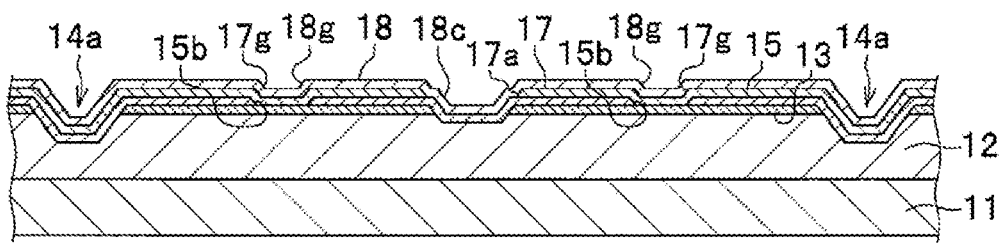
FIG. 25B is a sectional view taken along line XXVB-XXVB in FIG. 25A in the method of manufacturing the light emitting device according to the second embodiment.
Figure 25C:
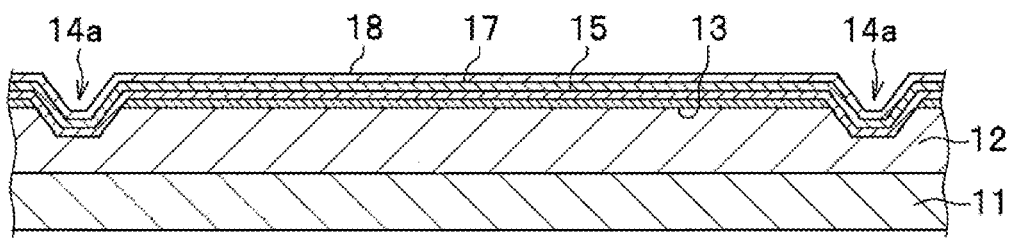
FIG. 25C is a sectional view taken along line XXVC-XXVC in FIG. 25A in the method of manufacturing the light emitting device according to the second embodiment.

As shown in FIG. 25A to FIG. 25C, the second insulation layer forming step SB5a is a step of forming a second insulation layer 18 on the wiring electrode 17 and on the recess 15c of the first insulation layer 15 exposed by the opening 17a of the wiring electrode 17. The second insulation layer 18 can be formed, for example, by sputtering or the like. Moreover, the second insulation layer 18 has the central recessed part 18c formed along the recessed part 15c of the first insulation layer 15 and the recessed parts 18g formed along the connection parts 17g of the wiring electrode 17. The second insulation layer 18 is also formed on the wiring electrode 17 at the grooves 14a. The second insulation layer 18 is formed by disposing, for example, a layer mainly containing $SiO_2$ in a layer thickness in a range of from 300 to 700 nm.

Subsequently, a hole forming step SB6 is performed to form a third hole 18a in the second insulation layer 18 while forming a first hole 15a in the first insulation layer 15. As shown in FIG. 26A to FIG. 26D, the hole forming step SB6 is a step of forming the first hole 15a of the first insulation layer 15 and the third hole 18a of the second insulation layer 18 at the position of the central recessed part 18c of the second insulation layer 18. The hole forming step includes the step that constitutes step SB6. That is, in the hole forming step SB6, the third hole 18a of the second insulation layer 18 is formed on or above the prescribed region (i.e., the central recessed part 18c) of the upper face of the first semiconductor layer 12n while concurrently performing the first hole forming step to form the first hole 15a in the first insulation layer 15 in each light emitting cell 1.

Figure 26A:
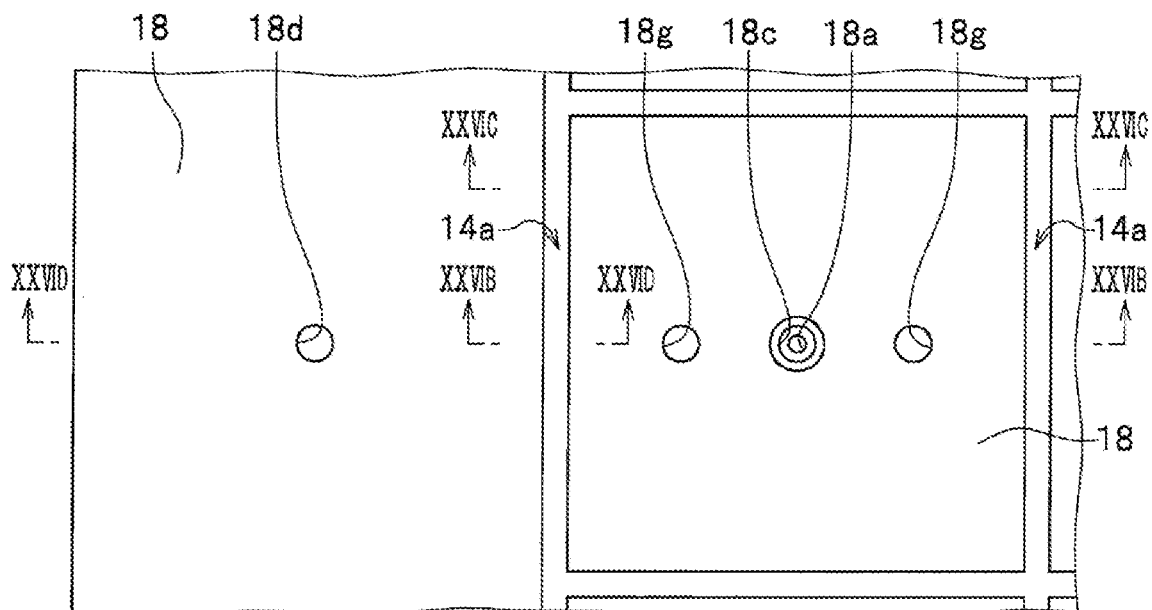
FIG. 26A is a schematic plan view, enlarged one of the light emitting cells after forming a third hole in the second insulation layer and a first hole in the first insulation layer in the method of manufacturing the light emitting device according to the second embodiment.
Figure 26B:
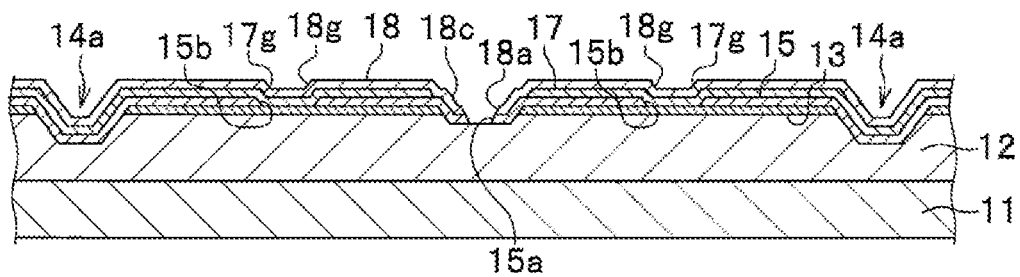
FIG. 26B is a sectional view taken along line XXVIB-XXVIB in FIG. 26A in the method of manufacturing the light emitting device according to the second embodiment.
Figure 26C:
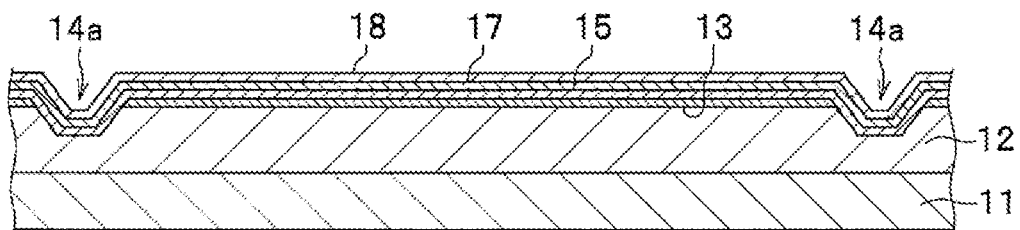
FIG. 26C is a sectional view taken along line XXVIC-XXVIC in FIG. 26A in the method of manufacturing the light emitting device according to the second embodiment.

As shown in FIG. 26A and FIG. 26B, in the hole forming step SB6, the first hole 15a of the first insulation layer 15 and the third hole 18a of the second insulation layer 18 are formed in the circular recessed region which is the central recessed part 18c of the second insulation layer 18 when viewed from the top. The first hole 15a and the third hole 18a are formed by forming a mask having an opening for the central recessed part 18c of the second insulation layer 18 followed by etching via the mask. The sizes or shapes of the first hole 15a formed in the first insulation layer 15 and the third hole 18a formed in the second insulation layer 18 are not limited as long as they fit in the central recessed part 18c of the second insulation layer 18. The first hole 15a and the third hole 18a are formed to be in communication with one another, and expose a portion of the first semiconductor layer 12n from the second insulation layer 18 and the first insulation layer 15.

Figure 26D:
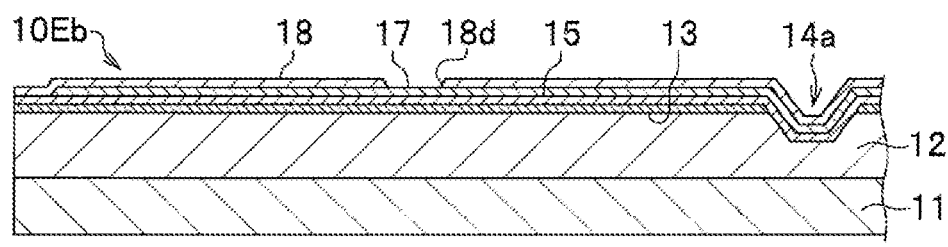
FIG. 26D is a sectional view taken along line XXVID-XXVID in FIG. 26A in the method of manufacturing the light emitting device according to the second embodiment.

As shown in FIG. 26D, in the hole forming step a fourth hole 18d for electrical connection with the second semiconductor layer 12p is formed in the second insulation layer 18 in the external region 10Eb. The fourth hole 18d is formed at the time the first hole 15a of the first insulation layer 15 and the third hole 18a of the second insulation layer 18 being formed. That is, the fourth hole 18d is formed concurrently with the first hole 15a and the third hole 18a by forming a mask having an opening for the region for the central recessed part 18c of the second insulation layer 18 and an opening for the fourth hole 18d, followed by performing etching via the mask.

As shown in FIG. 27A to FIG. 27D, step SB7 is a first electrode forming step to form a first electrode 2 in electrical connection with the first semiconductor layer 12n in the region where the first hole 15a of the first insulation layer 15 and the third hole 18a of the second insulation layer 18 are created. In the first electrode forming step, the first electrode 2 is formed while concurrently being formed the second electrode 19 on the second insulation layer 18 in the external region 10Eb. The first electrode forming step includes a bump forming step to form bumps 3. In the first electrode forming step, the first electrode 2 is formed in the region where the first hole 15a and the third hole 18a are disposed to be in electrical connection with the first semiconductor layer 12n. The first electrode 2 is a single layer of a metal or alloy, or multilayer thereof, which are used for electrodes, and is formed by sputtering or the like while using a mask.

Figure 27A:
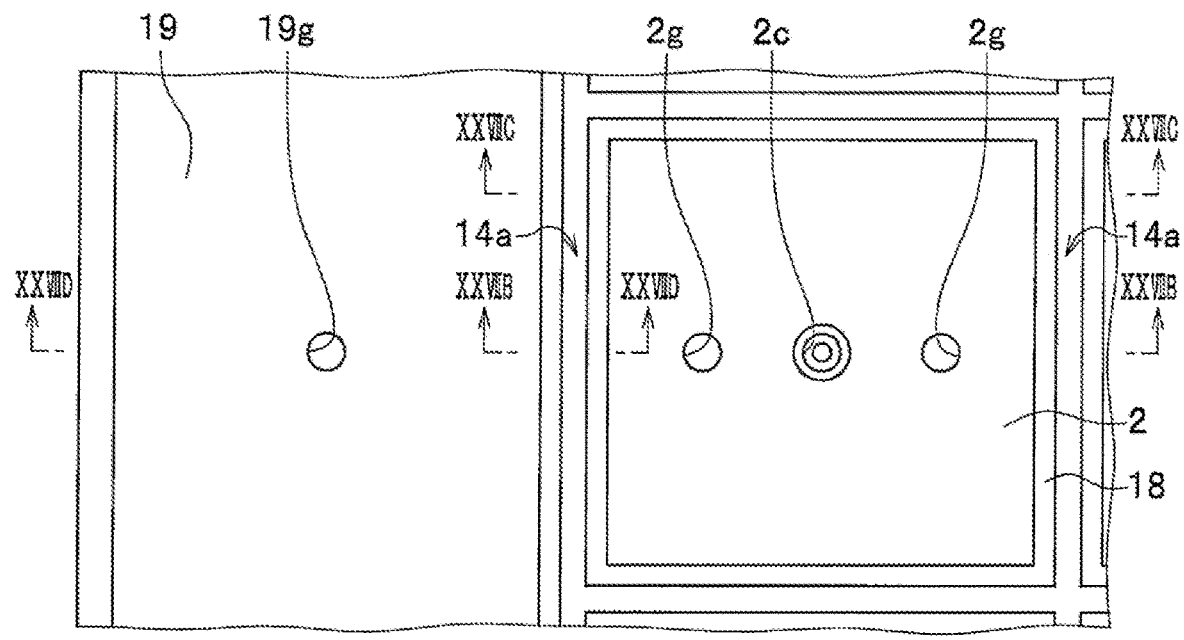
FIG. 27A is a schematic plan view, enlarged one of the light emitting cells on which a first electrode and a second electrode are formed in the method of manufacturing the light emitting device according to the second embodiment.
Figure 27B:
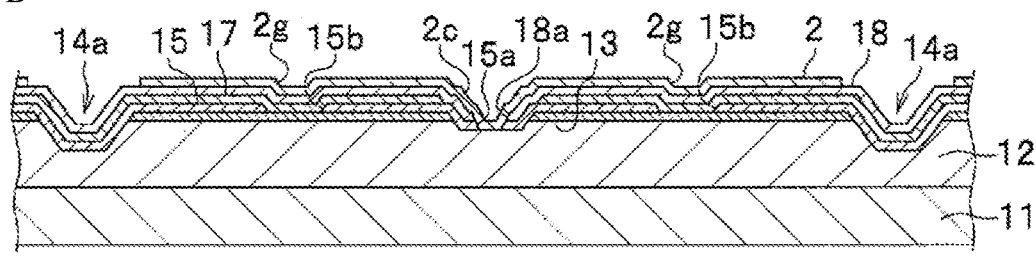
FIG. 27B is a sectional view taken along line XXVIIB-XXVIIB in FIG. 27A in the method of manufacturing the light emitting device according to the second embodiment.
Figure 27C:
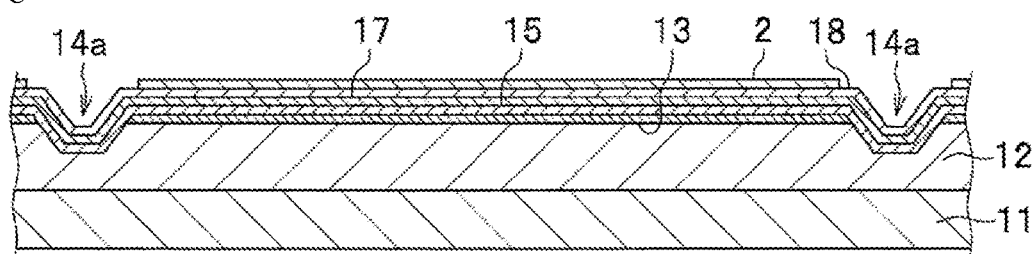
FIG. 27C is a sectional view taken along line XXVIIC-XXVIIC in FIG. 27A in the method of manufacturing the light emitting device according to the second embodiment.
Figure 27D:
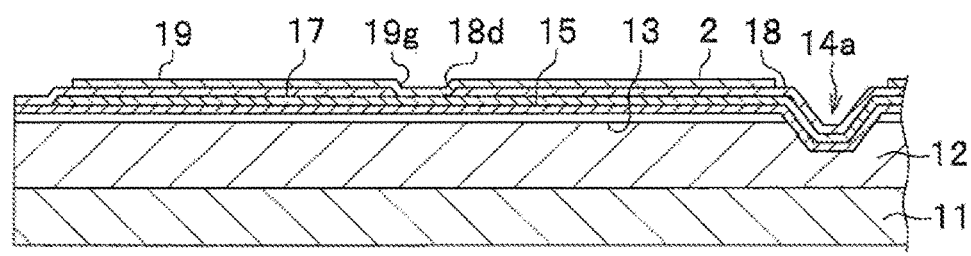
FIG. 27D is a sectional view taken along line XXVIID-XXVIID in FIG. 27A in the method of manufacturing the light emitting device according to the second embodiment.
Figure 28A:
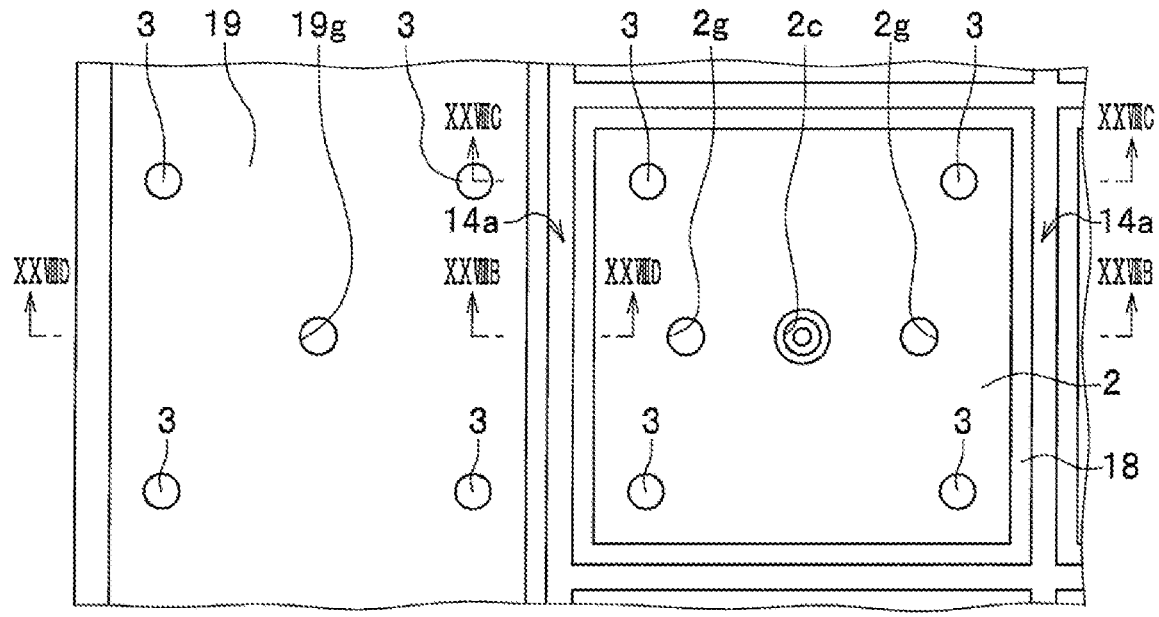
FIG. 28A is a schematic plan view, enlarged one of the light emitting cells after forming bumps on the first electrode and the second electrode in the method of manufacturing the light emitting device according to the second embodiment.
Figure 28B:
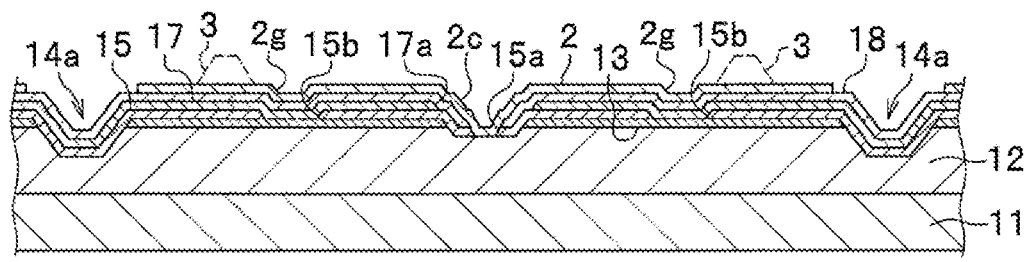
FIG. 28B is a sectional view taken along line XXVIIIB-XXVIIIB in FIG. 28A in the method of manufacturing the light emitting device according to the second embodiment.
Figure 28C:
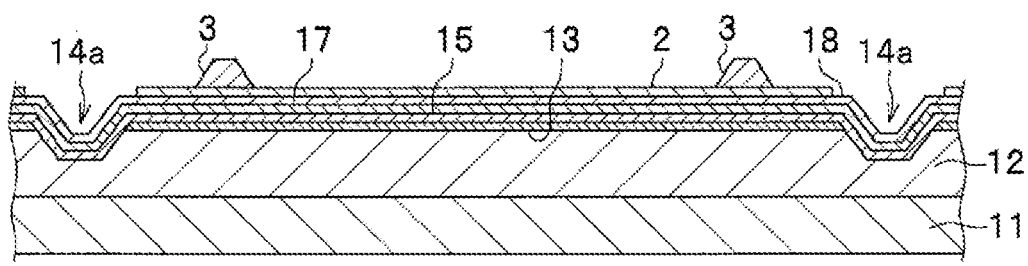
FIG. 28C is a sectional view taken along line XXVIIIC-XXVIIIC in FIG. 28A in the method of manufacturing the light emitting device according to the second embodiment.
Figure 28D:
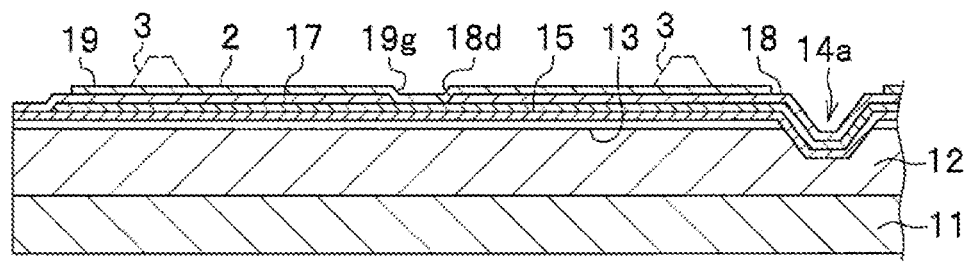
FIG. 28D is a sectional view taken along line XXVIIID-XXVIIID in FIG. 28A in the method of manufacturing the light emitting device according to the second embodiment.

The first electrode 2 has a central part 2c having a recessed form in a sectional view, and recessed parts 2g formed on both sides of the central part 2c and spaced apart from the central part 2c. The first electrode 2 is formed to a rectangular shape spaced apart from the grooves 14a in the center of the region surrounded by the grooves 14a in each light emitting cell 1. The first electrode 2 in a top view can be formed to have an areal ratio of from 50 to 95% to the region surrounded by the grooves 14a as an example. The thickness of the first electrode 2 is preferably in a range of from 300 nm to 700 nm. When forming the first electrode, as shown in FIG. 27D, a second electrode 19 in electrical connection with the second semiconductor layer 12p can be formed in the same process.

In step SB7, the first electrode 2 and the second electrode 19 are formed on the second insulation layer 18 of the region 10Ea and the second insulation layer 18 of the external region 10Eb, respectively, by disposing a mask over the grooves 14a and prescribed regions of the second insulation layer 18 surrounded by the grooves 14a. The first electrode 2 and the second electrode 19 are configured with a single layer or multilayer of metals or alloys employed for the electrodes, and are formed by sputtering or the like by using a mask. The first electrode 2 is formed spaced apart from the grooves 14a and in a rectangular shape in the center of the area surrounded by the grooves 14a in each light emitting cell 1 with an areal ratio in a range of, for example, from 50 to 95%. Preferably, the first electrode 2 and the second electrode 19 each have a thickness in a range of from 300 nm to 700 nm. The second electrode 19, which is formed in the external region 10Eb, is formed spaced apart from the first electrode 2 via a groove 14a.

After forming the first electrode 2 and the second electrode 19, a bump forming step is performed to form bumps 3 at prescribed positions of the first electrode 2 and the second electrode 19 to connect with the IC substrate 20 described below. As shown in FIG. 28A to FIG. 28D, in the bump forming step, four bumps 3 are formed in each light emitting cell 1 region defined by the grooves 14a. On the second electrode 19, four bumps 3 are formed in the surrounding of each electrode connection part 19g. For the bumps 3, those similar to the bumps formed in the first embodiment described above can be used.

Figure 3F:
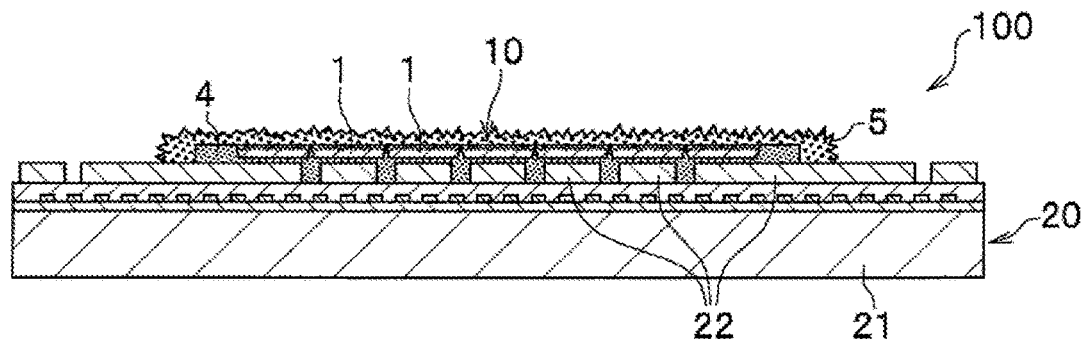
FIG. 3F is a sectional view showing the method of manufacturing the light emitting device according to the embodiment, schematically showing a phosphor layer disposed on the light emitting cell group.
Figure 4:
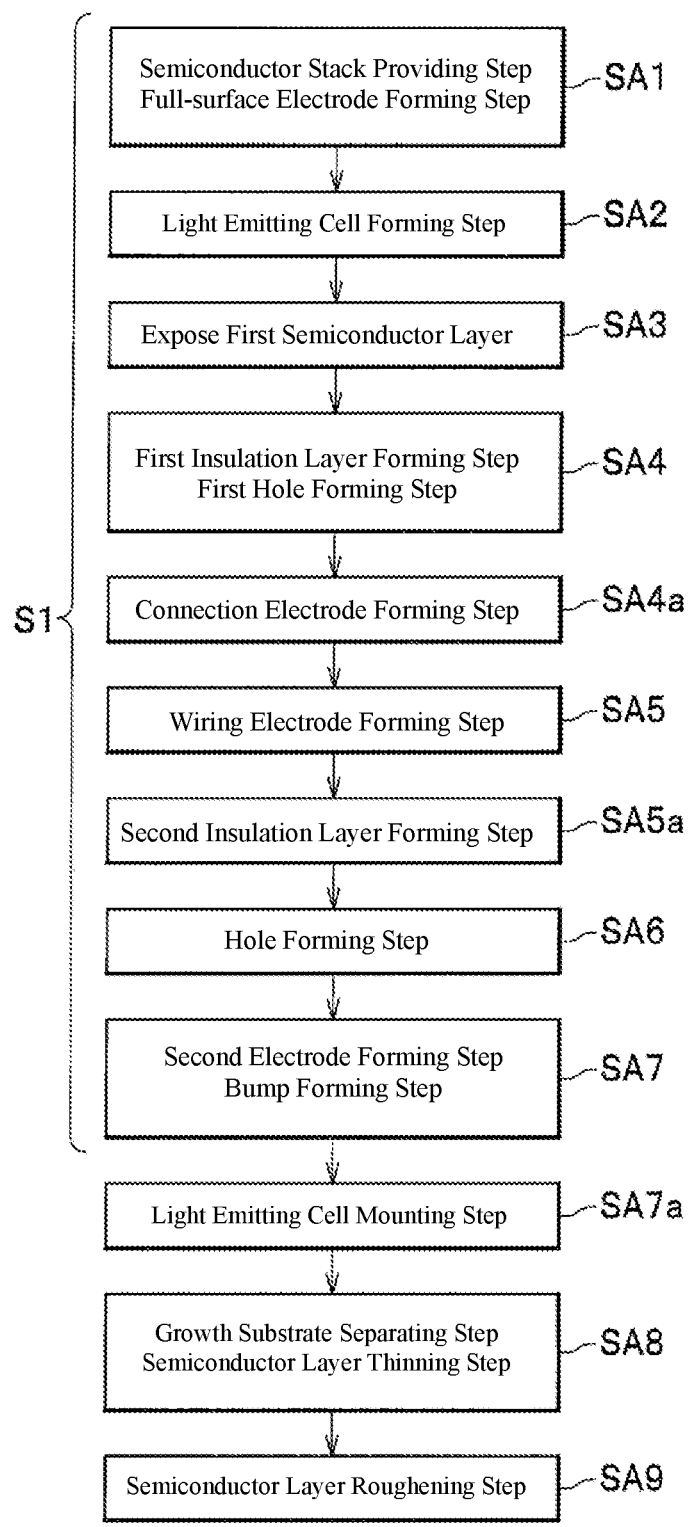
FIG. 4 is a flowchart for the method of manufacturing the light emitting device according to a first embodiment.

Following the bump forming step, as shown in FIG. 3A, an light emitting cell mounting step SB7a is performed to film chip mount the substrate 11 having the light emitting cell group 10 disposed thereon to the IC substrate electrodes 22 of the IC substrate 20 via the bumps 3. The light emitting cell mounting step can be performed in the same or similar manner as in the first embodiment. Subsequently, similar to the first embodiment, a filler 4 is disposed as shown in FIG. 3B, the substrate 11 is separated by a laser lift-off process as shown in FIG. 3C, followed by performing a semiconductor layer thinning step SB8 as shown in FIG. 3E and FIG. 29, and a semiconductor layer roughening step SB9 as shown in FIG. 3F and FIG. 30.

Figure 29:
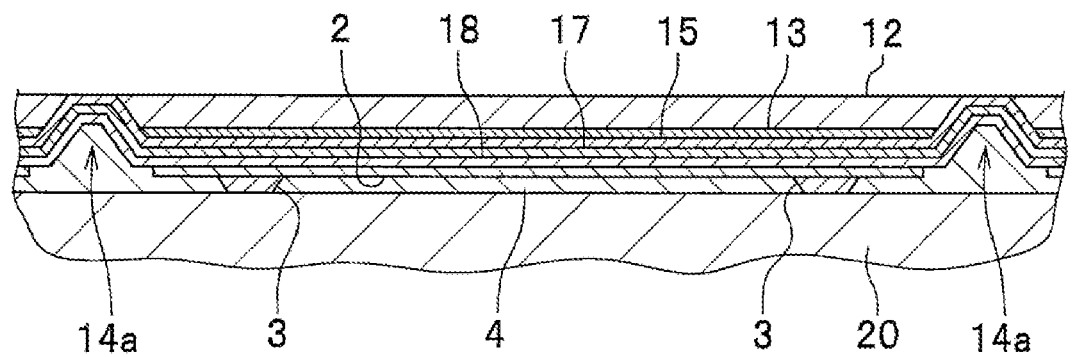
FIG. 29 is a schematic sectional view, enlarged one of the light emitting cells after reducing the thickness of the semiconductor stack by dry etching in the method of manufacturing the light emitting device according to the second embodiment.
Figure 30:
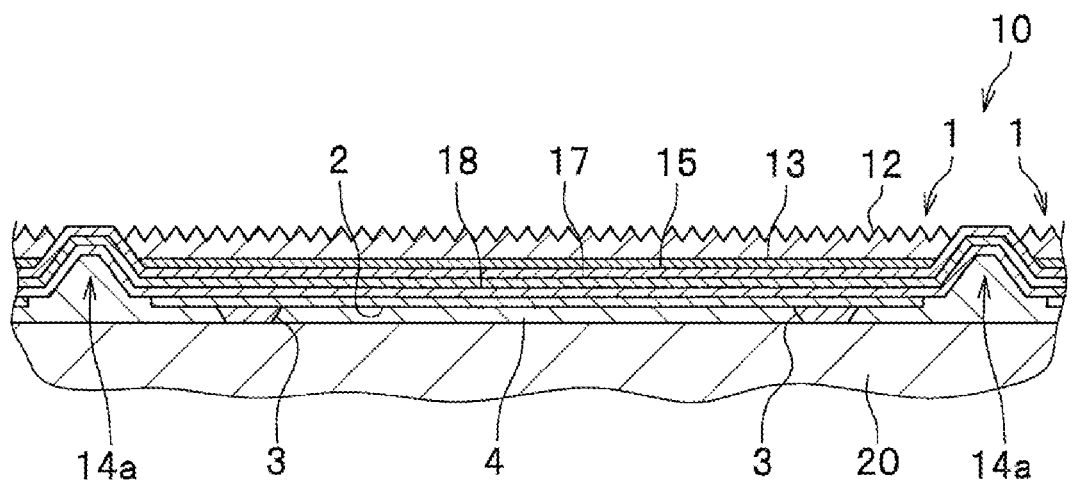
FIG. 30 is a schematic sectional view, enlarged one of the light emitting cells after roughening the surface of the semiconductor stack by wet etching in the method of manufacturing the light emitting device according to the second embodiment.
Figure 31:
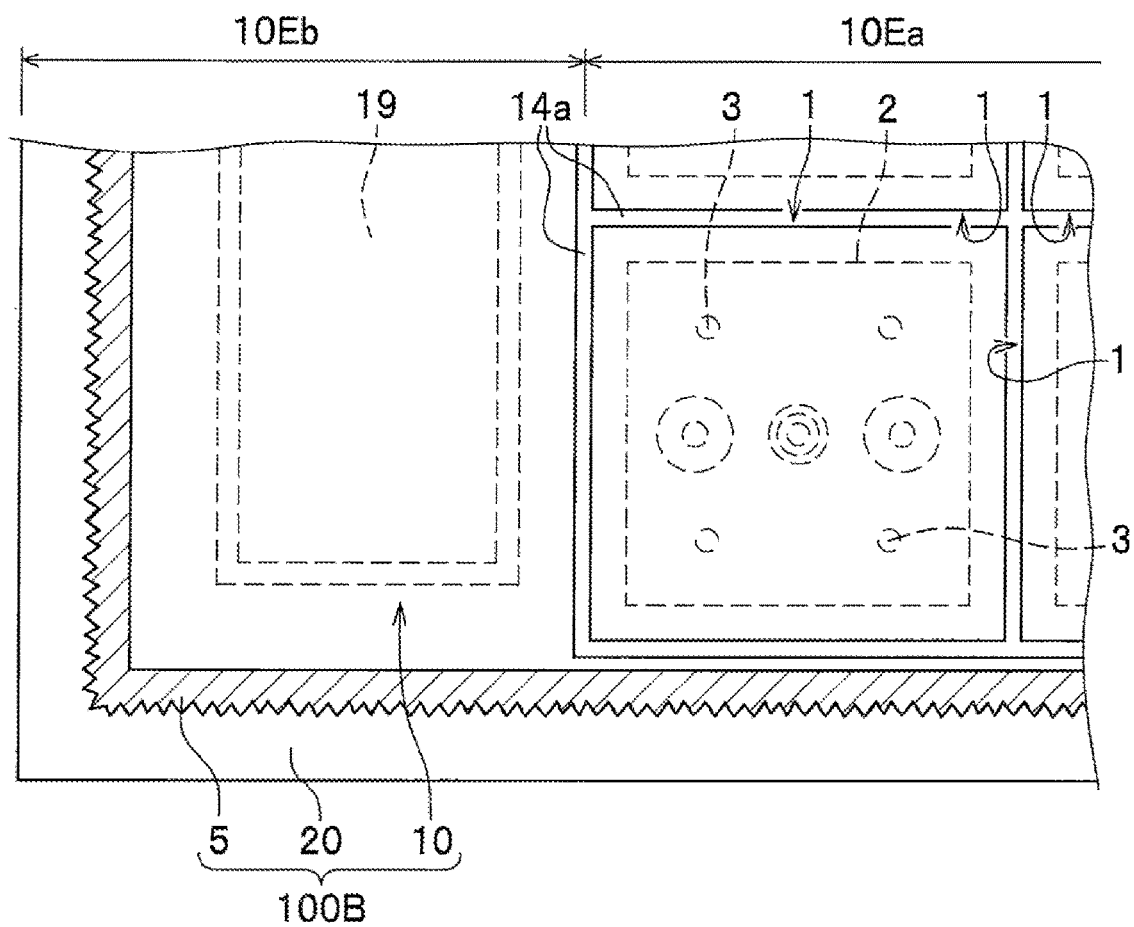
FIG. 31 is a schematic plan view, enlarged one of a portion of the light emitting device according to the second embodiment.

FIG. 3D and FIG. 29 are different fields of view of the same step where FIG. 3D is a schematic sectional view of the entire device, whereas FIG. 29 is an enlarged schematic sectional view of one of the light emitting cells 1. Likewise, FIG. 3E and FIG. 30 are different fields of view of the same step where FIG. 3E is a schematic section of the entire device, whereas FIG. 30 is an enlarged schematic sectional view of one of the light emitting cells 1.

Subsequent to the semiconductor layer roughening step, a phosphor layer forming step and the like may be performed in the same or similar manner to those in the first embodiment described above.

Subsequently, the light emitting device 100B manufactured by the light emitting device manufacturing method according to the second embodiment will be explained. The light emitting device 100B is constructed so that the positions of the first electrode 2 and the second electrode 19 are reversed relative to the light emitting device 100 explained previously. That is, the second electrode 19 is disposed in the external region 10Eb and the first electrode 2 is disposed in the region 10Ea where the light emitting cells 1 are formed. The light emitting device 100B according to the second embodiment will be explained below focusing on the construction of the first electrode 2 and the second electrode 19 that differ from light emitting device 100 according to the first embodiment.

The light emitting device 100B includes a light emitting cell group 10 having a plurality of light emitting cells 1, an IC substrate 20 to which the light emitting cell group 10 is connected, and a phosphor layer 5 covering the surface of the light emitting cell group 10. The light emitting device 100B includes a first insulation 15 having a first hole 15a and second holes 15b in each light emitting cell 1; a wiring electrode 17 disposed to cover the first insulation layer 15 and be in electrical connection with the second semiconductor layer 12p via the second holes 15b in each light emitting cell 1; a second electrode 19 disposed in each light emitting cell 1 and connected to the wiring electrode 17 in electrical connection with the second semiconductor layer 12p via the second holes 15b; and a second insulation layer 18 disposed between the wiring electrode 17 and the second electrode 19 and having a third hole 18a. Moreover, in the light emitting device 100B, the first insulation layer 15 is exposed from the first semiconductor layer 12n between the light emitting cells 1, and the light extraction face, which is the lower face of the first semiconductor layer 12n, has a roughened surface. The light emitting device 100B has a full-surface electrode layer 13 disposed on the second semiconductor layer 12p.

The light emitting cell group 10 has a plurality of light emitting cells 1 arranged in orderly columns and rows. The light emitting cells 1 each includes the semiconductor stack 12 in which the second semiconductor layer 12p, the emission layer 12a, and the first semiconductor layer 12n are successively layered from the IC support substrate 21 side, and uses the first semiconductor layer 12n side as the light emission face.

The electrode structure of the light emitting cells 1 includes the first electrode and the wiring electrode 17. The first electrode is in electrical connection with the first semiconductor layer 12n via the first hole 15a. The wiring electrode 17 has light reflectivity, is disposed to cover the first insulation layer, and is in electrical connection with the second semiconductor layer 12p via the second holes 15b in each light emitting cell 1. Furthermore, a second insulation layer 18 having a third hole in communication with the first hole 15a in each light emitting cell 1 is disposed on the wiring electrode 17.

The first electrode 2 is an electrode for supplying an electric current to the first semiconductor layer 12n. The first electrode 2 is formed in a rectangular shape in a top view so as to cover the second insulation layer 18. The first electrode 2 is physically and electrically connected with the first semiconductor layer 12n via the third hole 18a of the second insulation layer 18 and the first hole 15a of the first insulation layer 15. For the first electrode 2, one similar to that described in reference to the first embodiment can be used.

The second electrode 19 is an electrode for supplying an electric current to the second semiconductor layer 12p. The second electrode 19 is formed in the external region 10Eb to cover the second insulation layer 18, is connected to the wiring electrode 17 via the fourth hole 18d of the second insulation layer 18, and in electrical connection with the second semiconductor layer 12p via the wiring electrode 17. The second electrode 19 is formed in the external region 10Eb in a rectangular shape when viewed from the top. For the second electrode 19, one similar to that described in reference to the first embodiment can be used.

Similar to in the first embodiment, part of the wiring electrode 17 disposed between adjacent light emitting cells 1 is projected closer towards the lower face than the lower face of the first semiconductor layer 12n.

The light emitting cells 1 including the first electrode 2 and the second electrode 19 as described above are mounted on the IC substrate 20 as a light emitting cell group 10 in the light emitting device 100B so that the light emitting cells 1 can be individually controlled to illuminate.

The method of manufacturing the light emitting device 100B and the light emitting device 100B according to the second embodiment constructed as above can achieve similar effects to those achieved by the first embodiment.

Figure 32A:
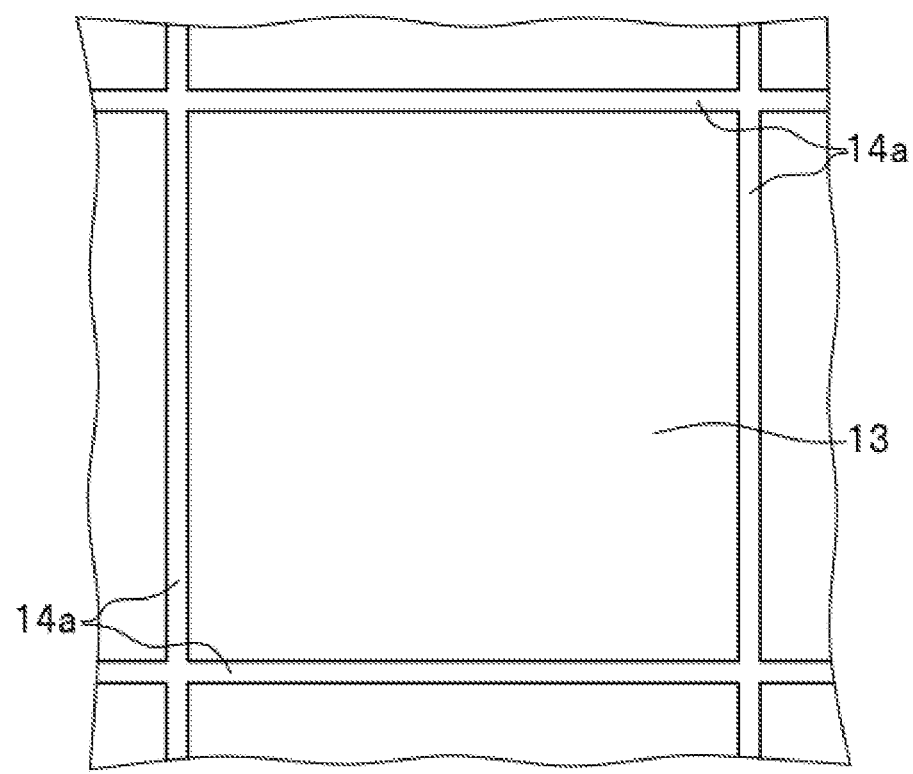
FIG. 32A is a schematic plan view, enlarged one of the light emitting cells after partitioning a region each of the light emitting cells with grooves formed by partially etching the semiconductor stack in a variation of the method of manufacturing the light emitting device according to certain embodiments.
Figure 32B:
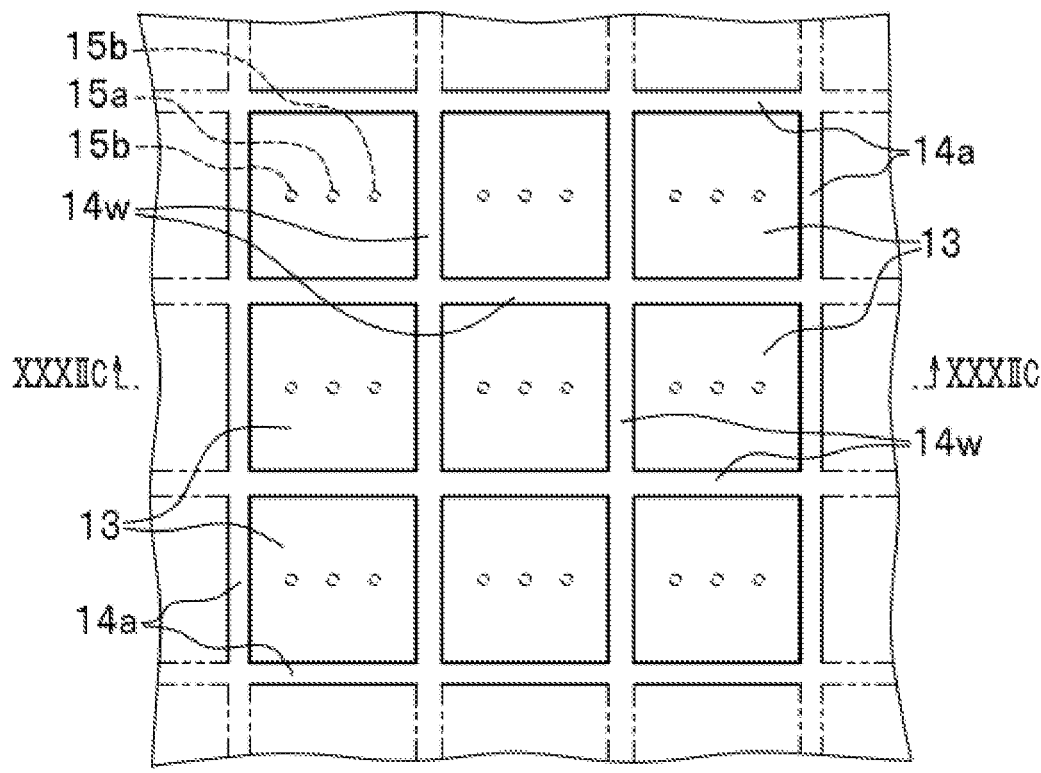
FIG. 32B is a schematic plan view, enlarged one of the light emitting cells after partitioning a region of each of the light emitting cells with grooves formed by partially etching the semiconductor stack in a variation of the method of manufacturing the light emitting device according to certain embodiments.
Figure 32C:
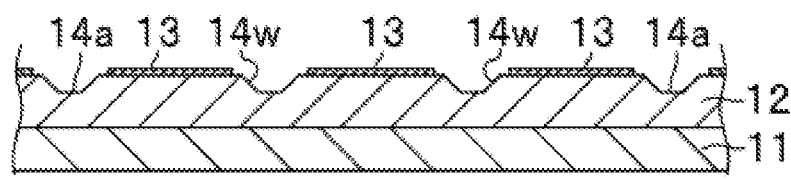
FIG. 32C is a sectional view taken along line XXXIIC-XXXIIC in FIG. 32B of a variation of the method of manufacturing the light emitting device according to certain embodiments.

As shown in FIGS. 32A, 32B and 32C, the light emitting cell forming step SA2 or SB2 for forming the light emitting cells includes removing a portion of the semiconductor stack 12 in a region within each of the light emitting cells 1 each of which is in a rectangular region defined by the grooves 14a, and forming grooves 14w from the upper face of the semiconductor stack 12 to have the grooves 14w each of which reach the first semiconductor layer 12n. Such grooves 14w are formed to mitigate progression of light propagating from one of the light emitting cells 1 to the adjacent one(s) of the light emitting cells 1 defined by the grooves 14w, but not to define the region within each of the light emitting cells 1 from the semiconductor stack 12. If one of the light emitting cells 1 is individually turned on by individually control the light emitting cells, light emitted from the intentionally lit light emitting cell may propagate to the adjacent light emitting cells that are not intended to be lit, thereby causing poor distinguishability. However, forming the above-described grooves 14w in the region within each of the light emitting cells 1 defined by the grooves 14a can mitigate the light propagating to the light emitting cells that are not intended to be lit, thereby improving distinguishability. The grooves 14w in the region within each of the light emitting cells 1 can be formed, for example, in columns and rows, a grid-shape, or a concentric circle shape, with respect to the regions to be the light emitting cells 1. The grooves 14w can be formed at the same time as or after the grooves 14a are formed. The grooves 14w has the same or substantially same depth as that of the grooves 14a. FIGS. 32B and 32C show examples in which the grooves 14w are formed in the grid-shape in the region within each of the light emitting cells 1. As shown in FIG. 32B, in the case where the grooves 14w define the plurality of regions to divide into the plurality of light emitting cells 1, the first hole 15a and the second holes 15b are formed in the plurality of regions (i.e., nine regions in the figures). Accordingly, subsequent steps are performed in such a manner as to realize the same or substantially same sectional view as shown in the FIGS. 15A to 15D or FIGS. 28A to 28D which have been described. The first electrode 2 or the second electrode 19 electrically connect the first hole 15a and the second holes 15b in each of the regions defined by the grooves 14w (i.e., nine regions in the figures). The rest of the manufacturing steps in the second embodiment is the same as the first embodiment except for forming the grooves 14w in the regions to be the light emitting cells 1, therefore, the description thereof is omitted. The first hole 15a and the second holes 15b in FIG. 32B are imaginary illustrated to show the hole 15a and the holes 15b formed in the other manufacturing step so as to be the same structure. Accordingly, the first hole 15a and the second holes 15b are formed in the subsequent step, but not formed at the time the grooves 14w being formed.

As shown in FIG. 1A, the controller 50 of the light emitting device system 100S drives the light emitting cells 1, for example, in a passive matrix manner. The wiring for allowing the controller 50 to drive the light emitting cells 1 in a passive matrix manner is formed on the IC substrate 20 and the secondary mounting substrate. Each of the light emitting cells 1 in the light emitting device system 100S can be lit in a passive matrix manner, thereby enabling a wide expanse of light extraction as indicated by outgoing light B1, for example, in FIG. 1 by illuminating all of the light emitting cells 1. The light emitting device system 100S, moreover, can output annular bright light with a dark center as indicated by outgoing light B2 by turning off the light emitting cells 1 located in the central portion while turning on the light emitting cells 1 located in the outer peripheral portion of the light emitting cell group 10. Furthermore, the system can output light which is bright only in the center as indicated by outgoing light B3 by turning on only the light emitting cells 1 located in the central portion while turning off the light emitting cells 1 in the outer peripheral portion.

Heat H is generated when the light emitting cells 1 are lit in the light emitting device system 100S, therefore a heat dissipater 60 is installed on the secondary mounting substrate 30. This can dissipate the heat H generated by the light emitting device system 100S via the heat dissipater 60. Thus, the light emitting device 100S can maintain a stable operation.

The embodiments described in the forgoing have been explained as including a connection electrode 16, but the light emitting devices may be constructed by forming a wiring electrode 17 without disposing a connection electrode 16.

Furthermore, although a second insulation layer 18 was included in the light emitting device of the above-described embodiments, the second insulation layer 18 is not required, and the first electrode 2 and the second electrode 19 may be arranged so as not to be in electrical connection.

Moreover, the light emitting device 100 or 100B may be constructed without including a full-surface electrode 13 disposed on the second semiconductor layer 12p.

What is claimed is:

1. A method of manufacturing a light emitting device, the method comprising:
providing a semiconductor stack including a first semiconductor layer, and a second semiconductor layer disposed on an upper face of the first semiconductor layer;
forming a plurality of light emitting cells arranged in column and row directions by forming a plurality of grooves in the semiconductor stack from an upper face side of the semiconductor stack, the grooves reaching the first semiconductor layer;
exposing a portion of the first semiconductor layer from the second semiconductor layer by partially removing the second semiconductor layer from an upper face side of the second semiconductor layer in each of the light emitting cells;
forming a first insulation layer continuously on the light emitting cells and the grooves, the first insulation layer having a first hole on the first semiconductor layer exposed from the second semiconductor layer in each of the light emitting cells;
forming a wiring electrode to be in electrical connection with the first semiconductor layer at the first hole in each of the light emitting cells so as to cover the first insulation layer on or above the upper face of the second semiconductor layer excluding a prescribed region;
forming a second hole in the first insulation layer on or above the prescribed region of the upper face of the second semiconductor layer in each of the light emitting cells;
forming a second electrode in each of the light emitting cells to be in electrical connection with the second semiconductor layer at the second hole;
thinning the first semiconductor layer from a lower face side of the first semiconductor layer by dry etching or polishing so as not to reach the first insulation layer formed on the grooves; and
subsequent to the step of thinning the first semiconductor layer by dry etching, removing a portion of the first semiconductor layer in a thickness direction from the lower face side of the first semiconductor layer by wet etching, thereby exposing the first insulation layer from the first semiconductor layer at locations of the grooves while roughening a surface of the first semiconductor layer that has been partially removed by the step of thinning the first semiconductor layer.

2. The method of manufacturing a light emitting device according to claim 1, further comprising:
subsequent to the step of forming a wiring electrode, forming a second insulation layer on the wiring electrode and the first insulation layer exposed from the wiring electrode, the second insulation layer having a third hole in communication with the second hole;
wherein, in the step of forming the second electrode, the second electrode is formed on the second insulation layer to be in electrical connection with the second semiconductor layer via the second hole and the third hole.

3. The method of manufacturing a light emitting device according to claim 2, further comprising, prior to the step of forming the wiring electrode, disposing a connection electrode in the first hole in contact and electrical connection with the first semiconductor layer.

4. The method of manufacturing a light emitting device according to claim 2, wherein:
in the step of forming the grooves in the semiconductor stack, the grooves are formed such that an external region is disposed adjacent to the light emitting cells to extend at least in the row direction or the column direction of the light emitting cells, and the wiring electrode is formed to extend onto the external region to be in electrical connection with the first electrode disposed in the external region.

5. The method of manufacturing a light emitting device according to claim 2, wherein, in the step of forming the grooves in the semiconductor stack, the grooves reaching the first semiconductor layer are formed in a region within each of the light emitting cells, and the grooves are formed from the upper face side of the semiconductor stack.

6. The method of manufacturing a light emitting device according to claim further comprising, prior to the step of forming the wiring electrode, disposing a connection electrode in the first hole in contact and electrical connection with the first semiconductor layer.

7. The method of manufacturing a light emitting device according to claim 2, wherein the wet etching is performed such that the lower face of the first semiconductor layer is positioned closer to the second semiconductor layer than the wiring electrode disposed at the grooves.

8. The method of manufacturing a light emitting device according to claim 6, wherein the wet etching is performed such that the lower face of the first semiconductor layer is positioned closer to the second semiconductor layer than the wiring electrode disposed at the grooves.

9. The method of manufacturing a light emitting device according to claim 2, wherein:

the semiconductor stack is formed on a substrate; and the method further comprises, subsequent to the step of forming the second electrode, separating the substrate.

10. The method of manufacturing a light emitting device according to claim 2, further comprising, prior to the step of forming the grooves in the semiconductor stack, forming a full-surface electrode layer on the upper face of the second semiconductor layer to be in electrical connection with the second semiconductor layer.

11. The method of manufacturing a light emitting device according to claim 6, wherein, in the step of forming the grooves in the semiconductor stack, the grooves reaching the first semiconductor layer are formed in a region within each of the light emitting cells, and the grooves are formed from the upper face side of the semiconductor stack.

12. The method of manufacturing a light emitting device according to claim 1, wherein:

in the step of forming the grooves in the semiconductor stack, the grooves are formed such that an external region is disposed adjacent to the light emitting cells to extend at least in the row direction or the column direction of the light emitting cells, and the wiring electrode is formed to extend onto the external region to be in electrical connection with the first electrode disposed in the external region.

13. The method of manufacturing a light emitting device according to claim 1, wherein, in the step of forming the grooves in the semiconductor stack, the grooves reaching the first semiconductor layer are formed in a region within each of the light emitting cells, and the grooves are formed from the upper face side of the semiconductor stack.

14. The method of manufacturing a light emitting device according to claim 13, wherein the wet etching is performed such that the lower face of the first semiconductor layer is positioned closer to the second semiconductor layer than the wiring electrode disposed at the grooves.

15. The method of manufacturing a light emitting device according to claim 14, wherein:

the semiconductor stack is formed on a substrate; and the method further comprises, subsequent to the step of forming the second electrode, separating the substrate.

16. The method of manufacturing a light emitting device according to claim 1, wherein the wet etching is performed such that the lower face of the first semiconductor layer is positioned closer to the second semiconductor layer than the wiring electrode disposed at the grooves.

17. The method of manufacturing a light emitting device according to claim 1, wherein:

the semiconductor stack is formed on a substrate; and the method further comprises, subsequent to the step of forming the second electrode, separating the substrate.

18. The method of manufacturing a light emitting device according to claim 1, further comprising, prior to the step of forming the grooves in the semiconductor stack, forming a full-surface electrode layer on the upper face of the second semiconductor layer to be in electrical connection with the second semiconductor layer.

* * * * *

UNITED STATES PATENT AND TRADEMARK OFFICE
CERTIFICATE OF CORRECTION

| | | |
|---|---|---|
| PATENT NO. | : 10,535,641 B2 | Page 1 of 1 |
| APPLICATION NO. | : 16/024605 | |
| DATED | : January 14, 2020 | |
| INVENTOR(S) | : Shinichi Daikoku and Daisuke Sanga | |

It is certified that error appears in the above-identified patent and that said Letters Patent is hereby corrected as shown below:

In the Claims

Claim 6, Column 27, Line 13:
Please delete:
"according to claim further comprising,"

Please replace with:
"according to claim 1, further comprising,"

Signed and Sealed this
Twelfth Day of May, 2020

Andrei Iancu
*Director of the United States Patent and Trademark Office*